United States Patent
Nagata et al.

(10) Patent No.: US 8,278,386 B2
(45) Date of Patent: Oct. 2, 2012

(54) DISPERSION COMPOSITION, POLYMERIZABLE COMPOSITION, LIGHT-SHIELDING COLOR FILTER, SOLID-STATE IMAGE PICK-UP ELEMENT, LIQUID CRYSTAL DISPLAY DEVICE, WAFER LEVEL LENS, AND IMAGE PICK-UP UNIT

(75) Inventors: Yuzo Nagata, Shizuoka (JP); Tomotaka Tsuchimura, Shizuoka (JP); Makoto Kubota, Shizuoka (JP); Kazuhiro Fujimaki, Shizuoka (JP); Yushi Kaneko, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/054,911

(22) PCT Filed: Oct. 1, 2009

(86) PCT No.: PCT/JP2009/067179
§ 371 (c)(1),
(2), (4) Date: Jan. 19, 2011

(87) PCT Pub. No.: WO2010/038836
PCT Pub. Date: Apr. 8, 2010

(65) Prior Publication Data
US 2011/0124824 A1    May 26, 2011

(30) Foreign Application Priority Data

Oct. 3, 2008 (JP) .................................. 2008-258907

(51) Int. Cl.
*C08K 3/22* (2006.01)
(52) U.S. Cl. ...................................................... 524/497
(58) Field of Classification Search .................... 524/497
See application file for complete search history.

(56) References Cited

U.S. PATENT DOCUMENTS

| | | | |
|---|---|---|---|
| 6,100,312 A | 8/2000 | Suzuki et al. | |
| 2008/0171272 A1 | 7/2008 | Nakashima et al. | |
| 2008/0268354 A1* | 10/2008 | Suzuki | .............................. 430/7 |

FOREIGN PATENT DOCUMENTS

| | | |
|---|---|---|
| JP | 9-054431 A | 2/1997 |
| JP | 9-171252 A | 6/1997 |
| JP | 9-171253 A | 6/1997 |
| JP | 9-179299 A | 7/1997 |
| JP | 10-046042 A | 2/1998 |
| JP | 10-114836 A | 5/1998 |
| JP | 10-142796 A | 5/1998 |
| JP | 10-246955 A | 9/1998 |
| JP | 11-209554 A | 8/1999 |
| JP | 2002-275343 A | 9/2002 |
| JP | 2003-149801 A | 5/2003 |
| JP | 2003-238835 A | 8/2003 |
| JP | 2005-266189 A | 9/2005 |
| JP | 2005-539276 A | 12/2005 |
| JP | 2006-150630 A | 6/2006 |
| JP | 2006-241193 A | 9/2006 |
| JP | 2007-115921 A | 5/2007 |
| JP | 2007-148438 A | 6/2007 |
| JP | 2007-241247 A | 9/2007 |
| JP | 2008-165059 A | 7/2008 |
| JP | 2008-197613 A | 8/2008 |
| WO | 2007/107025 A1 | 9/2007 |
| WO | 2008/117803 A1 | 10/2008 |

* cited by examiner

*Primary Examiner* — Peter Szekely
(74) *Attorney, Agent, or Firm* — Sughrue Mion, PLLC

(57) ABSTRACT

A dispersion composition is provided in which the dispersibility of titanium black is high, the sedimentation of titanium black over time is suppressed, and overall dispersibility and storage stability are high. Further, a polymerizable composition is provided in which favorable coating property on a substrate and even film thickness can be obtained, generation of residue in an unexposed region when a pattern is formed can be suppressed, and favorable pattern shape having any steps after exposure/development can be obtained. The dispersion composition contains (A) titanium black, (B) a graft copolymer and (C) a solvent.

20 Claims, 4 Drawing Sheets

DISPERSION COMPOSITION, POLYMERIZABLE COMPOSITION, LIGHT-SHIELDING COLOR FILTER, SOLID-STATE IMAGE PICK-UP ELEMENT, LIQUID CRYSTAL DISPLAY DEVICE, WAFER LEVEL LENS, AND IMAGE PICK-UP UNIT

CROSS REFERENCE TO RELATED APPLICATIONS

This application is a National Stage of International Application No. PCT/JP2009/067179 filed Oct. 1, 2009, claiming priority based on Japanese Patent Application No. 2008-258907 filed Oct. 3, 2008, the contents of all of which are incorporated herein by reference in their entirety.

TECHNICAL FIELD

The present invention relates to a dispersion composition containing titanium black, a polymerizable composition containing the dispersion composition, a light-shielding color filter obtained by using the polymerizable composition, and an image pick-up element having the light-shielding color filter, a liquid crystal display device, a wafer level lens, and an image pick-up unit.

BACKGROUND ART

In a color filter used for a liquid crystal display device, a light-shielding film called a black matrix is arranged for the purposes of shielding light between colored pixels, increasing contrast and the like. Further, in a solid-state image pick-up element, a black matrix is also arranged for the purposes of preventing noise and increasing image quality and the like. The black matrix is manufactured by forming a pattern using photolithographic methods or the like by using a polymerizable composition containing a dispersion composition, in which a light-shielding black colorant is dispersed, a polymerizable compound, a polymerization initiator, and other components.

As a composition for forming a black matrix for a liquid crystal display device or for a solid-state image pick-up element, a photosensitive resin composition containing a black colorant such as carbon black or titanium black is known.

As a black matrix for a liquid crystal display device, a black matrix is required that has high light-shielding property in order to increase contrast and improve visibility. On the other hand, as a black matrix for a solid-state image pick-up element, it is also necessary that the black matrix have light-shielding property in the infrared region in addition to the light-shielding property in the visible region.

Conventionally, in light-shielding black matrices, carbon black has generally been used. However, when an increase in the light-shielding property of a black matrix is attempted using carbon black, it is necessary to increase the amount of or use a large amount of carbon black in the black matrices. Accordingly, a dispersion composition or polymerizable composition having a high concentration of carbon black serving as a light-shielding material is required for forming a light-shielding pattern. However, when the content of carbon black is increased in order to achieve a high light-shielding effect, problems arise whereby carbon black particles are insufficiently dispersed in the dispersion, and pattern formability is impaired.

Further, it is required that there is minimal residue of the composition in an unexposed region after development, and that a coated film when the composition is coated on a substrate is even, and further, that a favorable shape is formed; specifically, it is desirable that no difference in the thickness of the light-shielding film (i.e., no step) is generated between the peripheral region thereof and the central region thereof.

In a black matrix for a liquid crystal display device, the light-shielding effect is mainly required in the visible region, whereas in a black matrix for a solid-state image pick-up element, a light-shielding effect in the infrared region is required in addition to a light-shielding effect in the visible region.

Further, a black matrix for a liquid crystal display device is required to be micronized, whereas a black matrix for a solid-state image pick-up element (in particular, a black matrix for shielding the surface at the opposite side of a support from a light receiving element-forming surface (hereinafter, also referred to as the "back surface")) is required to be configured to uniformly shield a wider area than that of a black matrix for a liquid crystal display device.

When a light-shielding film having a large area is formed as a light-shielding film for a solid-state image pick-up element using a conventional photosensitive resin composition, the thickness at the peripheral region of the light-shielding film is thinner than the thickness at the central region of the light-shielding film; that is, a step is formed, which leads, in some cases, to lower light-shielding performance at the peripheral region of the light-shielding film.

Further, there has been a problem whereby when the content of the black colorant is increased in order to obtain high light-shielding property, residue tends to be generated at the peripheral region of the light-shielding film, which leads to lower sensitivity. Furthermore, there has been a problem whereby when the amount of a polymerization initiator is increased in order to increase sensitivity, the stability over time deteriorates.

In recent years, compact and thin image pick-up units are mounted on the mobile terminals of electronic devices such as mobile phones or PDAs (personal digital assistants).

Such image pick-up units are generally equipped with a solid-state image pick-up element such as a CCD (charge coupled device) image sensor, a CMOS (complementary metal oxide semiconductor) image sensor, or the like, and a lens for forming object images on the solid-state image pick-up element.

Miniaturization and thinning of the image pick-up units are demanded in conjunction with the miniaturization and thinning of mobile terminals. Further, in order to reduce the cost of the mobile terminals, an increase in the efficiency of the production process is desired. As a method of manufacturing a large number of such miniaturized lenses, a method of manufacturing a lens module is known in which a wafer level lens having a configuration obtained by forming plural lenses on a substrate is manufactured, and the substrate is cut so that the plural lenses are separated into the respective lenses.

Further, a method of manufacturing an image pick-up unit is known where a substrate having plural lenses formed thereon is integrally combined with a sensor substrate having plural solid-state image pick-up elements thereon, and the substrate and the sensor substrate are cut so as to include a lens and a solid-state image pick-up element as a set.

Hitherto, as a wafer level lens, a multilayered wafer level lens formed by superimposing substrates having plural lenses thereon has been disclosed (for example, refer to Japanese Unexamined Patent Application Publication (Translation of PCT Application) No. 2005-539276). The wafer level lens is formed from a substrate and a lens made of transparent materials that are light transmissive, and light can transmit through any region of the wafer level lens; therefore, there is a possibility that in a case in which the wafer lens is diced and the diced lens is mounted to an image pick-up element to form an image pick-up unit, optical performance defects such as ghosting or flaring easily occur at the time of image pick-up when light transmission or light reflection occurs in regions other than the lens surface of the lens. From the viewpoint of preventing such defects regions other than the lens of a wafer level lens, for example, are subjected to processing such as formation of a light-shielding member.

Further, a method, in which a molding material is supplied onto a substrate to form a lens by using a mold on the substrate, has been disclosed (for example, refer to International Publication No. WO 2007/107025).

In order to meet these quality requirements for a black matrix with high light-shielding property as described above, the usefulness of titanium black having high light-shielding property is recognized, and various methods for improving the dispersibility of titanium black have been proposed (for example, see Japanese Patent Application Laid-Open (JP-A) Nos. 10-246955, 9-54431, 10-46042, 2007-115921, 10-114836, 2002-275343 and 2005-266189).

SUMMARY OF THE INVENTION

Technical Problem

However, since the specific gravity of titanium black is high, it is difficult to disperse titanium black and, even if dispersed, titanium black sediments over time. Accordingly, improvement of the dispersibility and dispersion stability of titanium black is desired.

The present invention is made in view of the above circumstances and, hereinafter, aspects of the invention are described.

According to an aspect of the invention, a dispersion composition is provided in which the dispersibility of titanium black is high, the sedimentation of titanium black over time is suppressed, and overall dispersibility and storage stability are high.

According to another aspect of the invention, a polymerizable composition is provided in which favorable coating property on a substrate and even film thickness can be obtained, generation of residue in an unexposed region when a pattern is formed can be suppressed, and favorable pattern shape without any steps (i.e., differences in level or height in the black matrix) after exposure/development can be obtained.

According to still another aspect of the invention, a light-shielding color filter having a colored pattern having high light-shielding property obtained using the polymerizable composition, and a high-definition solid-state image pick-up element, a liquid crystal display device, and an image pick-up unit in which the light-shielding color filter is used, are provided.

According to still another aspect of the invention, there is provided a wafer level lens having a color region with high light-shielding property.

Solution to Problem

The specific measures of the invention are as follows:
<1> A dispersion composition comprising: (A) titanium black, (B) a graft copolymer, and (C) a solvent.
<2> The dispersion composition according to <1>, wherein (B) the graft copolymer has a graft chain having the number of atoms other than hydrogen atoms in the range of from 40 to 10,000.

<3> The dispersion composition according to <1> or <2>, wherein (B) the graft copolymer comprises a graft chain having at least one structure selected from the group consisting of a polyester structure, a polyether structure, and a polyacrylate structure.

<4> The dispersion composition according to any one of <1> to <3>, wherein (B) the graft copolymer comprises at least a structural unit represented by any one of the following Formula (1) to Formula (5):

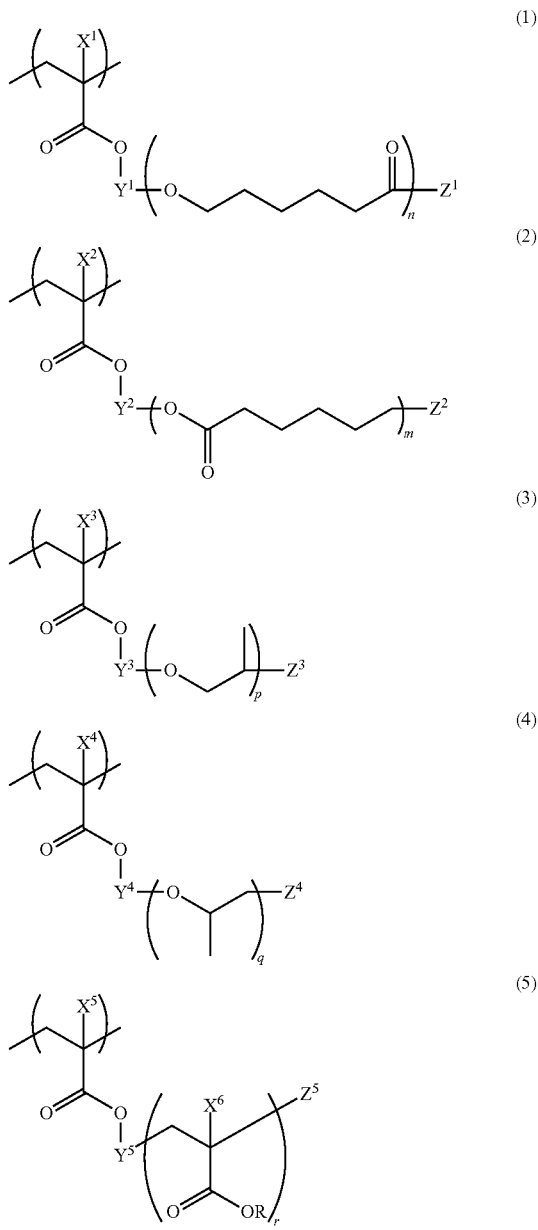

wherein, in Formula (1) to Formula (5), $X^1$, $X^2$, $X^3$, $X^4$, $X^5$, $X^6$ each independently represent a hydrogen atom or a monovalent organic group; $Y^1$, $Y^2$, $Y^3$, $Y^4$, and $Y^5$ each independently represent a divalent linking group; $Z^1$, $Z^2$, $Z^3$, $Z^4$, and $Z^5$ each independently represent a hydrogen atom or a monovalent organic group; R represents a hydrogen atom or a monovalent organic group; R's having different structures from one another may be present in the copolymer; and n, m, p, q, and r each independently represent an integer of from 1 to 500.

<5> The dispersion composition according to any one of <1> to <4>, wherein the monovalent organic group represented by $X^1$, $X^2$, $X^3$, $X^4$, $X^5$, or $X^6$ is an alkyl group having from 1 to 12 carbon atoms.

<6> The dispersion composition according to any one of <1> to <5>, wherein the divalent linking group represented by $Y^1$, $Y^2$, $Y^3$, $Y^4$, or $Y^5$ is any one selected from the following connecting groups (Y-1) to (Y-20):

wherein, in (Y-1) to (Y-20), A represents a bond to a left terminal end group in any of Formula (1) to Formula (5), and B represents a bond to a right terminal end group in any of Formula (1) to Formula (5).

<7> The dispersion composition according to any one of <1> to <6>, wherein the monovalent organic group represented by $Z^1$, $Z^2$, $Z^3$, $Z^4$, or $Z^5$ is an alkyl group, a hydroxyl group, an alkoxy group, an aryloxy group, a heteroaryloxy group, an alkyl thioether group, an aryl thioether group, a heteroaryl thioether group, or an amino group.

<8> The dispersion composition according to any one of <1> to <7>, wherein the monovalent organic group represented by R in Formula (5) is an alkyl group, an aryl group, or a heteroaryl group.

<9> The dispersion composition according to any one of <4> to <8>, wherein (B) the graft copolymer comprises the structural unit represented by any of Formula (1) to Formula (5) in a range of from 10% to 90% in terms of mass, relative to the total mass of the graft copolymer.

<10> The dispersion composition according to any one of <1> to <9>, wherein (B) the graft copolymer further comprises a structural unit having a functional group capable of interacting with titanium black.

<11> The dispersion composition according to any one of <1> to <10>, wherein (B) the graft copolymer further comprises at least one of a carboxylic acid group, a sulfonic acid group, or a phosphoric acid group.

<12> A polymerizable composition comprising: the dispersion composition according to any one of <1> to <11>; (D) a polymerizable compound; and (E) a polymerization initiator.

<13> The polymerizable composition according to <12>, wherein (E) the polymerization initiator is an oxime polymerization initiator.

<14> A light-shielding color filter, comprising, on a substrate, a color pattern formed using the polymerizable composition according to <12> or <13>.

<15> A solid-state image pick-up element, comprising the light-shielding color filter according to <14>.

<16> A liquid crystal display device, comprising the light-shielding color filter according to <14>.

<17> A wafer level lens comprising: a substrate on which plural lenses are integrally formed; and the light-shielding color filter according to <14> arranged in regions other than the lens surfaces of the lenses of the substrate.

<18> An image pick-up unit, comprising the wafer level lens according to <17>.

The dispersion composition of the invention includes, as a dispersant, (B) the graft copolymer, or preferably a graft polymer that has a graft chain having a number of atoms other than hydrogen atoms in a range of from 40 to 10,000. Since the graft chain functions as a steric repulsive group, good dispersibility can be exerted and titanium black can be uniformly dispersed. Furthermore, even when the dispersion composition is stored at room temperature for a long period of time, sedimentation of titanium black can be suppressed over a long period of time, because of the interaction between the graft chain and a solvent.

In general, when a pattern is formed using a dispersion composition in which a graft copolymer is used as a dispersant, developability is low, and residue tends to be easily generated. However, in the dispersion composition of the invention, since a polymer having a graft chain with a suitable length is used, occurrence of residue, which is presumably formed due to the reduction in solubility in developer, can be reduced.

In particular, when a graft copolymer including the structural unit represented by any one of Formula (1) to Formula (5), which are preferable embodiments of the invention, is used in the polymerizable composition, the hydrophilicity of the graft chain is increased, and the developability is increased, whereby it is assumed that the increase in the dispersibility is compatible with the reduction in residue in development.

Further, it turns out that by using the graft copolymer of the invention, a uniform coated surface is obtained when a polymerizable composition obtained using the dispersion composition of the invention is coated. This is presumably because the graft chain of the graft copolymer of the invention suitably interacts with the solvent.

Furthermore, it turns out that by using the graft copolymer having the specific structure of the invention and an oxime initiator in combination, steps are not generated and a favorable pattern shape is obtained.

Effect of Invention

According to an aspect of the invention, a dispersion composition is provided in which the dispersibility of titanium black is high, the sedimentation of titanium black is suppressed, and overall dispersibility and storage stability are high.

According to another aspect of the invention, a polymerizable composition is provided in which favorable coating property on a substrate and even film thickness can be obtained, generation of residue in an unexposed region when a pattern is formed can be suppressed, and favorable pattern shape without any steps after exposure/development can be obtained.

According to still another aspect of the invention, a light-shielding color filter having a color pattern (for example, black matrix) having high light-shielding property obtained using the polymerizable composition, and a high-definition solid-state image pick-up element, a liquid crystal display device, and an image pick-up unit in which the light-shielding color filter is used, are provided.

According to still another aspect of the invention, there is provided a wafer level lens having a color region with high light-shielding property.

In the invention, the "light-shielding color filter" refers to a light-shielding pattern obtained by exposing and developing a photosensitive polymerizable composition containing at least a titanium black dispersion composition, a polymerizable compound, and a photopolymerization initiator. The color of the "light-shielding color filter" in the invention may be an achromatic color such as black or gray, or may be black, gray or the like mixed with a chromatic color tint.

DESCRIPTION OF EMBODIMENTS

Figure 1:
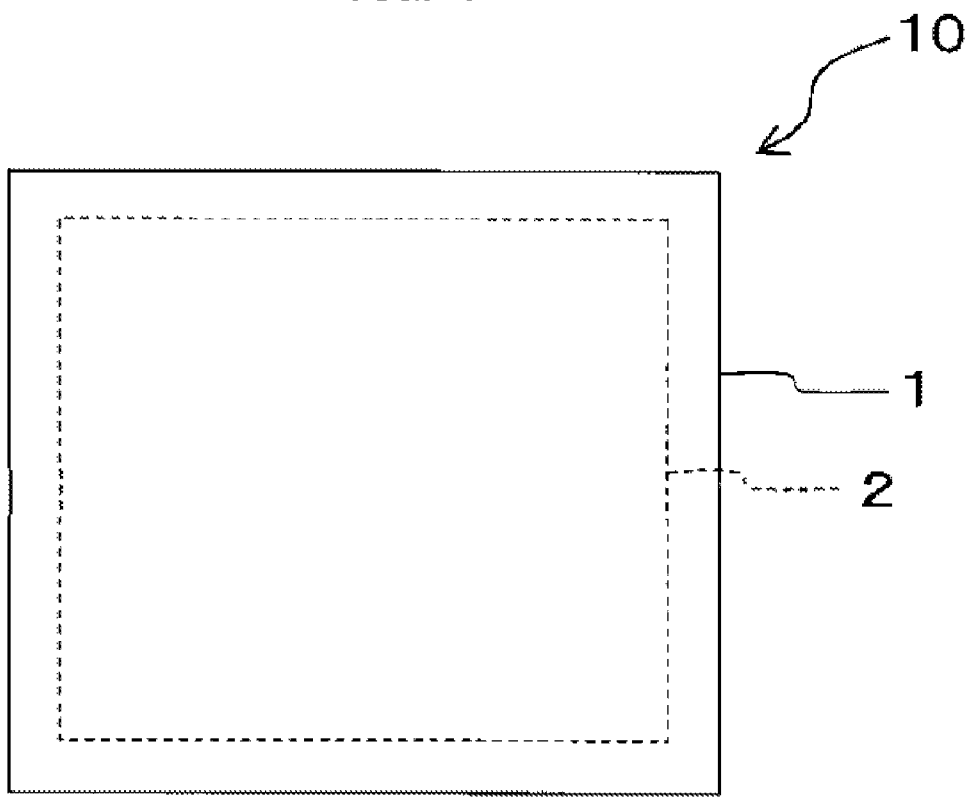
FIG. 1 is a schematic drawing showing a state where a step is generated in a black matrix.

The invention is explained in detail below.

A dispersion composition according to an exemplary embodiment of the invention includes (A) titanium black, (B) a graft copolymer, and (C) a solvent. Hereinbelow, each component contained in the dispersion composition of the invention is explained.

(A) Titanium Black

The titanium black used in the invention is black particles containing titanium atoms, and preferably is a low-order titanium oxide or titanium oxynitride or the like. The surface of titanium black particles may be modified for the purpose of improving dispersibility, suppressing aggregation, and the like, if needed. For example, the surface may be covered with silicon oxide, titanium oxide, germanium oxide, aluminum oxide, magnesium oxide, or zirconium oxide, or may be processed with a water-repellent substance as described in JP-A No. 2007-302836.

Examples of the method manufacturing of titanium black include a method in which a mixture of titanium dioxide and metal titanium is heated and reduced in a reducing atmosphere (JP-A No. 49-5432), a method in which ultrafine titanium dioxide obtained by hydrolyzing titanium tetrachloride at high temperature is reduced in a reducing atmosphere containing hydrogen (JP-A No. 57-205322), a method in which titanium dioxide or titanium hydroxide is reduced at high temperature in the presence of ammonia (JP-A No. 60-65069 and JP-A No. 61-201610), and a method in which titanium dioxide or titanium hydroxide, to which a vanadium compound has been adhered, is reduced at high temperature in the presence of ammonia (JP-A No. 61-2016109), but are not limited to these examples.

The particle diameter of titanium black is not particularly limited, but the average primary particle diameter thereof is preferably in the range of from 3 nm to 2,000 nm, more preferably in the range of from 10 nm to 500 nm, and still more preferably in the range of from 10 nm to 100 nm, from the viewpoints of dispersibility and coloring property.

The specific surface area of titanium black is not particularly limited, but the specific surface area of titanium black measured by the BET method is about from 5 $m^2/g$ to 150 $m^2/g$, and specifically preferably from 20 $m^2/g$ to 100 $m^2/g$, from the viewpoint of obtaining a predetermined water repellency after the surface treatment of titanium black with a water repellent agent.

Examples of commercially-available titanium black include titanium black 10S, 12S, 13R, 13M, 13M-C, 13R, and 13R-N manufactured by Mitsubishi Materials Corporation, and TILACK D manufactured by Ako Kasei Co., Ltd., but are not limited to these.

Further, an extender pigment in addition to titanium black may be added in the dispersion composition of the invention, if needed. Examples of such extender pigments include barium sulfate, barium carbonate, calcium carbonate, silica, basic magnesium carbonate, alumina white, gloss white, titanium white, and hydrotalcite. These extender pigments may be used alone, or a combination of two or more kinds thereof may be used. The amount of the extender pigment to be used is generally 0 to 100 parts by mass, preferably 5 to 50 parts by mass, and more preferably 10 to 40 parts by mass, with respect to 100 parts by mass of titanium black. In the invention, in some cases, the titanium black and extender pigment may be used after modifying the surface thereof.

The amount of the titanium black to be added to the dispersion composition of the invention is such that the content of the titanium black in the dispersion composition is adjusted to be in the range of from 20% by mass to 94% by mass, more preferably in the range of from 40% by mass to 92% by mass, and still more preferably in the range of from 40% by mass to 80% by mass.

When the amount of titanium black is in the above range, the curing property of the polymerizable composition of the invention is good, and a uniform film can be formed. Further, since titanium black is contained at a high concentration, sufficient light-shielding property can be attained, and the polymerizable composition containing titanium black can be suitably used for forming a light-shielding color filter.

Moreover, a pigment other than titanium black may be mixed, as a light-shielding pigment, in the dispersion composition of the invention.

Such a pigment to be mixed is not limited to specific pigments, as long as the pigment has light absorbance in the visible light range. Examples of such pigments include the extender pigment mentioned above, carbon black, and organic pigments such as C.I. Pigment Blue 1, 2, 15, 15:1, 15:2, 15:3, 15:4, 15:6, 16, 22, 60, 64, 66, 79, 80, C.I. Pigment Violet 1, 19, 23, 27, 32, 37, 42, C.I. Pigment Brown 25, 28, or C.I. Pigment Black 1, 7.

Examples of a mixture of titanium black with a light-shielding pigment other than titanium black include a mixture in which titanium black and carbon black are mixed at a ratio of 6:1, and a mixture in which titanium black and titanium oxide are mixed at a ratio of 3:1.

The light-shielding pigments other than titanium black to be mixed can be used in the range of from 0.01 to 99.99 parts by mass, and preferably in the range of from 20 to 70 parts by mass, with respect to 100 parts by mass of titanium black.

(B) Graft Copolymer

The dispersion composition of the invention includes a graft copolymer (hereinafter, also referred to as a "specific resin"). The graft copolymer of the invention preferably includes a graft chain having a number of atoms other than hydrogen atoms in a range of from 40 to 10,000, and the graft chain in this case means a chain branched from its root in the main chain of the copolymer to the terminal of the branched group. In the dispersion composition, the specific resin is a dispersion resin that imparts dispersibility to titanium black, and since the specific resin has excellent dispersibility and affinity to a solvent owing to the graft chain, excellent dispersibility of titanium black and excellent dispersion stability over time are attained. Further, when a polymerizable composition is formed, since the graft chain has affinity to the polymerizable compound or other resins which can be used in combination therewith, hardly any residue is generated by alkali development.

In addition, by further introducing an alkali soluble partial structure such as a carboxylic acid group or the like into the specific resin, a function as a resin that provides developability for forming a pattern by alkali development can be imparted to the specific resin. Accordingly, when an alkali soluble partial structure is introduced into the graft copolymer included in the dispersion composition of the invention, the dispersion resin itself that is essential for dispersing titanium black in the polymerizable composition of the invention becomes alkali-soluble. Therefore, such a polymerizable composition is preferable because the light-shielding property in an exposed region is excellent, and alkali developability in an unexposed region is improved.

The steric repulsive effect is increased and the dispersibility is improved when the length of the graft chain is long. However, when the graft chain is excessively long, the adsorptivity to titanium black decreases, resulting in reduced dispersibility. For this reason, regarding (B) the graft copolymer used in the invention, the number of atoms other than hydrogen atoms per graft chain is preferably from 40 to 10,000, more preferably from 50 to 2,000, and still more preferably from 60 to 500.

As the polymer structure of the graft chain, poly(meth)acryl, polyester, polyurethane, polyurea, polyamide, polyether, or the like may be used. In order to increase the interaction property of the graft moiety with a solvent to enhance the dispersibility, a graft chain including poly(meth)acryl, polyester, or polyether is preferable, and a graft chain including polyester or polyether is more preferable.

The structure of a macro monomer having such a polymer structure as a graft chain is not limited to specific structures, as long as the macro monomer has a substituent capable of reacting with the polymer main chain moiety, and satisfies the features of the invention, but preferably, macro monomers having a reactive double bond group may be suitably used.

Examples of commercially available macro monomers that can be suitably used for the synthesis of the specific resin include AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), AW-6 (manufactured by Toagosei Co., Ltd.), AA-714 (manufactured by Toagosei Co., Ltd.), AY-707 (manufactured by Toagosei Co., Ltd.), AY-714 (manufactured by Toagosei Co., Ltd.), AK-5 (manufactured by Toagosei Co., Ltd.), AK-30 (manufactured by Toagosei Co., Ltd.), AK-32 (manufactured by Toagosei Co., Ltd.), BLEMMER PP-100 (manufactured by NOF Corporation), BLEMMER PP-500 (manufactured by NOF Corporation), BLEMMER PP-800 (manufactured by NOF Corporation), BLEMMER PP-1000 (manufactured by NOF Corporation), BLEMMER 55-PET-800 (manufactured by NOF Corporation), BLEMMER PME-4000 (manufactured by NOF Corporation), BLEMMER PSE-400 (manufactured by NOF Corporation), BLEMMER PSE-1300 (manufactured by NOF Corporation), and BLEMMER 43PAPE-600B (manufactured by NOF Corporation). Among them, AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), and BLEMMER PME-4000 (manufactured by NOF Corporation) are preferable.

The specific resin to be used in the invention preferably includes, as a graft moiety, at least one structural unit represented by any one of the following Formula (1) to Formula (5):

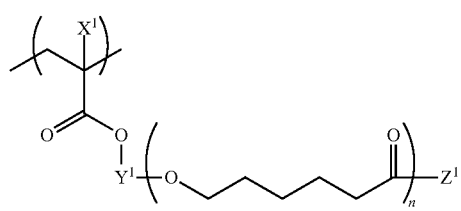

(1)

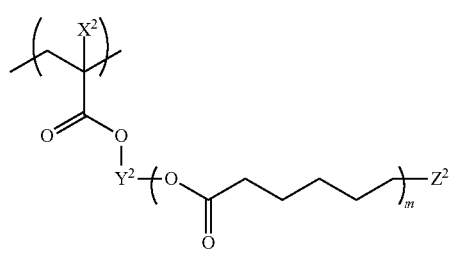

(2)

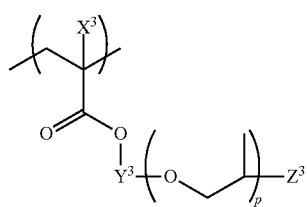

(3)

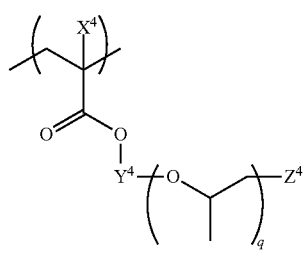

(4)

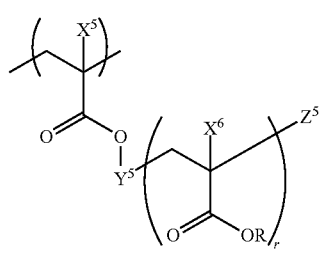

(5)

In Formula (1) to Formula (5), $X^1$, $X^2$, $X^3$, $X^4$, $X^5$, and $X^6$ each independently represent a hydrogen atom or a monovalent organic group, and from the viewpoint of the restrictions on synthesis, a hydrogen atom or an alkyl group having 1 to 12 of carbon atoms is preferable, a hydrogen atom or a methyl group is more preferable, and a methyl group is particularly preferable.

In Formula (1) to Formula (5), $Y^1$, $Y^2$, $Y^3$, $Y^4$, and $Y^5$ each independently represent a divalent linking group, and the structure thereof is not particularly restricted. Specific examples thereof include the connecting group represented by the following (Y-1) to (Y-20). In the following structures, "A" represents a bond to the left terminal end group in Formula (1) to Formula (5), and "B" represents a bond to the right terminal end group in Formula (1) to Formula (5). Among the following structures, (Y-2) and (Y-13) are more preferably used from the viewpoint of the simplicity of synthesis.

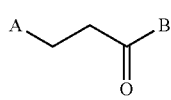

(Y-1)

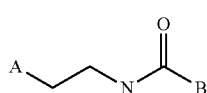

(Y-2)

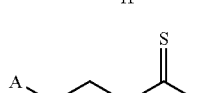

(Y-3)

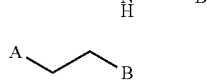

(Y-4)

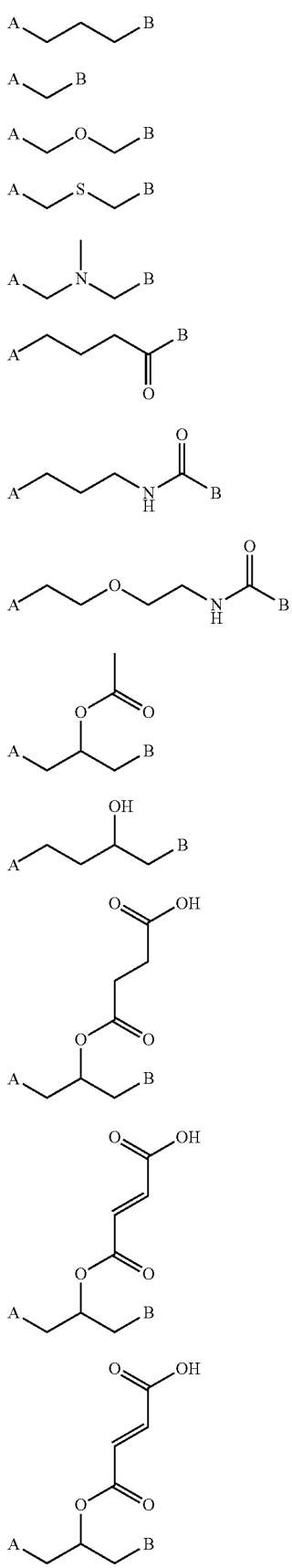
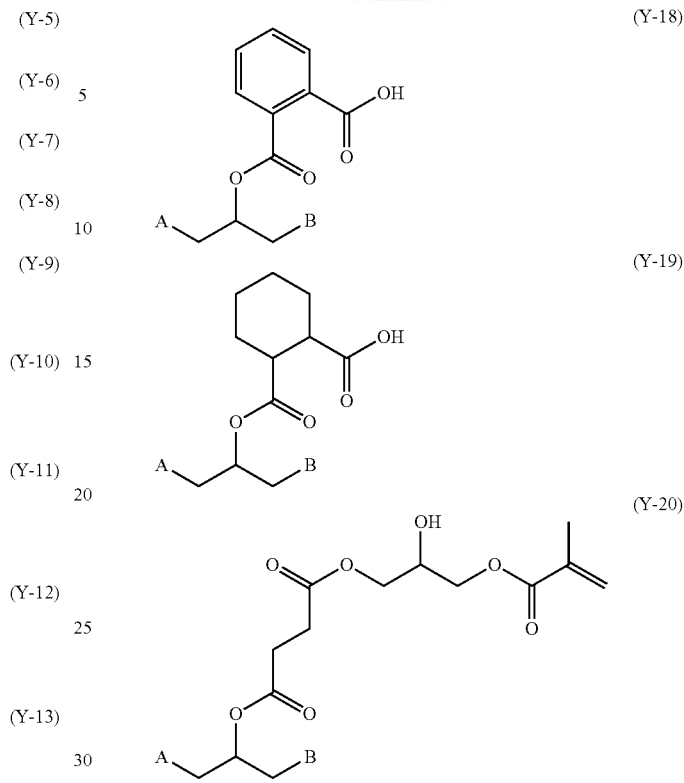

In Formula (1) to Formula (5), $Z^1$, $Z^2$, $Z^3$, $Z^4$, and $Z^5$ each independently represent a hydrogen atom or a monovalent organic group. Specific examples of the structures of the monovalent organic group include, but not particularly limited to, a hydroxyl group, an alkoxy group, an aryloxy group, a heteroaryloxy group, an alkyl thioether group, an aryl thioether group, a heteroaryl thioether group, and an amino group. Among them, from the viewpoint that the group preferably has a steric repulsive effect for improving dispersibility, $Z^1$, $Z^3$, and $Z^4$ each are preferably an alkoxy group having 5 to 24 carbon atoms, and particularly preferably an alkoxy group having a branched structure in which the alkoxy moiety has 5 to 24 carbon atoms or an alkoxy group having a cyclic structure in which the alkyl moiety has 5 to 24 carbon atoms. Further, $Z^2$ is preferably an alkyl carbonyloxy group having an alkyl moiety having 5 to 24 carbon atoms, and particularly preferably an alkyl carbonyloxy group having a branched alkyl having 5 to 24 carbon atoms, or an alkyl carbonyloxy group having a cyclic alkyl having 5 to 24 carbon atoms. Moreover, $Z^5$ is preferably a hydrogen atom in view of the synthesis.

In Formula (1) to Formula (5), n, m, p, q, and r each independently represent an integer of 1 to 500.

In the specific resin used in the invention, the structural unit represented by Formula (1) to Formula (5) is included preferably in the range of from 10% to 90% by mass, and more preferably in the range of from 30% to 70% by mass, with respect to the total mass of the specific resin. When the content of the structural unit is within these ranges, the dispersibility of titanium black is high, and the developability when used for a resist is good. The specific resin to be used in the invention may be a combination of two or more kinds of graft copolymers whose structures are different from one another.

In Formula (5), R represents a hydrogen atom or a monovalent organic group, whose structure is not particularly limited.

Examples thereof include preferably a hydrogen atom, an alkyl group, an aryl group, and a heteroaryl group, and more preferably a hydrogen atom and an alkyl group. Further, plural kinds of R's having different structures from one another may be present in the specific resin. For example, when plural R's are present in a structural unit represented by Formula (5), the plural R's may be the same as or different from one another, or the structural units represented by Formula (5) in the specific resin may be the same as or different from one another.

In the specific resin of the invention, a functional group capable of interacting with titanium black may be introduced into the specific resin, other than the grafting moiety. For example, as the functional group, a structural unit having an acid group, a structural unit having a basic group, a structural unit having a coordinating group, a structural unit having reactivity or the like may be introduced into the specific resin.

Examples of the acid group include a carboxylic acid group, a sulfonic acid group, a phosphoric acid group, and a phenolic hydroxyl group; and a carboxylic acid group having high adsorptive force to titanium black and high dispersibility is particularly preferable. Any one of them may be used alone, or a combination of two or more kinds thereof may be used.

By introducing such an acid group, the advantage of the alkali developability of the specific resin being increased can also be attained.

The content of the copolymerization component(s) used suitably in the specific resin of the invention is from 0.1% by mol to 50% by mol, and from the viewpoint of suppressing damage to the image strength due to alkali development, the content is particularly preferably from 1% by mol to 30% by mol.

Examples of the basic group include a primary amino group, a secondary amino group, a tertiary amino group, a hetero ring containing an N atom, and an amide group; and a tertiary amide group that has high adsorptive force to pigment and has high dispersibility is particularly preferable. Any one of these may be used alone, or a combination of two more kinds of these groups may be used. The content of the copolymerization component(s) suitably used in the specific resin of the invention is from 0.01% by mol to 50% by mol, and from the viewpoint of suppressing the inhibition of developability, the content is particularly preferably from 0.01% by mol to 30% by mol.

Examples of the coordinating group or the group having reactivity include an acetyl acetoxy group, a trialkoxysilyl group, an isocyanate group, an acid anhydride residue, and an acid chloride residue; and an acetyl acetoxy group having good adsorptive force to pigment and high dispersibility is particularly preferable. Any one of these may be used alone, or a combination of two more kinds of these groups may be used. The content of the copolymerization component(s) suitably used in the specific resin of the invention is from 0.5% by mol to 50% by mol, and from the viewpoint of suppressing the inhibition of developability, the content is particularly preferably from 1% by mol to 30% by mol.

The structure of the functional group capable of interacting with titanium black is not particularly limited to specific structures, as long as a functional group other than the graft moiety is contained. However, it is preferable that the functional group have at least one repeating unit obtained from any one of the following Formulae (i) to (iii).

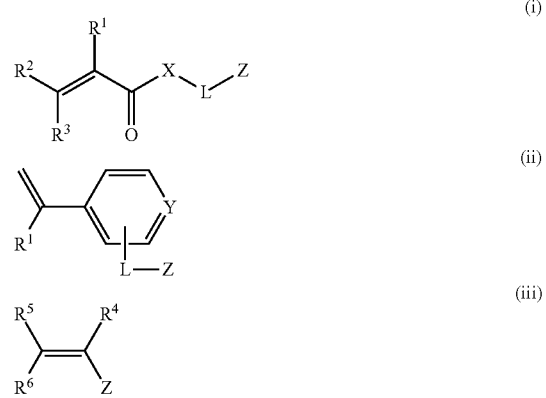

In Formulae (i) to (iii), $R^1$, $R^2$, and $R^3$ each independently represent a hydrogen atom, a halogen atom (for example, fluorine, chlorine, bromine, or the like), and an alkyl group having 1 to 6 carbon atoms (for example, a methyl group, an ethyl group, a propyl group, or the like).

$R^1$, $R^2$, and $R^3$ each are more preferably a hydrogen atom, an alkyl group having 1 to 3 carbon atoms, and most preferably, a hydrogen atom or a methyl group. It is particularly preferable that $R^2$ and $R^3$ each be a hydrogen atom.

X represents an oxygen atom (—O—) or an imino group (—NH—), and preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group, and a substituted arylene group), a divalent heterocyclic group, and the combinations of these groups with an oxygen atom (—O—), a sulfur atom (—S—), an imino group (—NH—), a substituted imino group (—$NR^{31}$—, wherein $R^{31}$ is an aliphatic group, an aromatic group, or a heterocyclic group), or a carbonyl group (—CO—).

The divalent aliphatic group may have a cyclic structure or a branched structure. The aliphatic group preferably has 1 to 20 carbon atoms, more preferably has 1 to 15 carbon atoms, and still more preferably has 1 to 10 carbon atoms. The aliphatic group is preferably a saturated aliphatic group rather than an unsaturated aliphatic group. Further, the aliphatic group may have a substituent. Examples of the substituent include a halogen atom, a hydroxyl group, an aromatic group, and a heterocyclic group.

The divalent aromatic group preferably has 6 to 20 carbon atoms, more preferably has 6 to 15 carbon atoms, and most preferably has 6 to 10 carbon atoms. Further, the aromatic group may have a substituent. Examples of the substituent include a halogen atom, a hydroxyl group, an aliphatic group, an aromatic group, and a heterocyclic group.

The divalent heterocyclic group has preferably a 5-membered ring or a 6-membered ring as a heterocycle thereof. The heterocycle may be a condensed ring with another heterocycle, an aliphatic ring, or an aromatic ring. Further, the heterocyclic group may have a substituent. Examples of the substituent include a halogen atom, a hydroxyl group, an oxo group (═O), a thioxo group (═S), an imino group (═NH), a substituted imino group (═N—$R^{32}$, wherein $R^{32}$ is an aliphatic group, an aromatic group, or a heterocyclic group), an aliphatic group, an aromatic group, and a heterocyclic group.

L is preferably a single bond, an alkylene group, or a divalent linking group including an oxyalkylene structure. The oxyalkylene structure is more preferably an oxyethylene structure or an oxypropylene structure. Further, L may have a polyoxyalkylene structure in which two or more oxyalkylene structures are repeated. As the polyoxyalkylene structure, a polyoxyethylene structure or a polyoxypropylene structure is preferable. The polyoxyethylene structure is represented by —(OCH$_2$CH$_2$)$_n$—, wherein n is preferably an integer of two or more, and more preferably an integer of from 2 to 10.

In Formulae (i) to (iii), Z represents a functional group capable of interacting with titanium black other than the graft moiety, preferably a carboxylic acid or a tertiary amino group, and more preferably a carboxylic acid. Further, Y represents a methine group or a nitrogen atom.

In Formula (iii), $R^4$, $R^5$, and $R^6$ each independently represent a hydrogen atom, a halogen atom (for example, fluorine, chlorine, bromine, or the like), or an alkyl group having 1 to 6 carbon atoms (for example, a methyl group, an ethyl group, a propyl group, or the like), Z, or -L-Z. Here, L and Z are the same meanings as described above, respectively. $R^4$, $R^5$, and $R^6$ each are preferably a hydrogen atom or an alkyl group having 1 to 3 carbon atoms, and more preferably a hydrogen atom.

In the invention, it is preferable that the monomer represented by Formula (1) be a compound in which $R^1$, $R^2$, and $R^3$ each are a hydrogen atom or a methyl group, L is an alkylene group or a divalent linking group including an oxyalkylene structure, X is an oxygen atom or an imino group, and Z is a carboxylic acid.

Further, it is preferable that the monomer represented by Formula (ii) be a compound in which $R^1$ is a hydrogen atom or a methyl group, L is an alkylene group, Z is a carboxylic acid, and Y is a methine group.

Moreover, it is preferable that the monomer represented by Formula (iii) be a compound in which $R^4$, $R^5$, and $R^6$ each are a hydrogen atom or a methyl group, and Z is a carboxylic acid.

Representative examples of compounds represented by Formulae (i) to (iii) include: methacrylic acid; crotonic acid; isocrotonic acid; a reaction product of a compound having an addition-polymerizable double bond and a hydroxyl group in a molecule thereof (for example, 2-hydroxyethyl methacrylate) and succinic anhydride; a reaction product of a compound having an addition-polymerizable double bond and a hydroxyl group in a molecule thereof and phthalic anhydride; a reaction product having an addition-polymerizable double bond and a hydroxyl group in a molecule thereof and tetrahydroxyphthalic anhydride; a reaction product of a compound having an addition-polymerizable double bond and a hydroxyl group in a molecule thereof and trimellitic anhydride; a reaction product of a compound having an addition-polymerizable double bond and a hydroxyl group in a molecule thereof and pyromellitic anhydride; acrylic acid; acrylic acid dimer; acrylic acid oligomer; maleic acid; itaconic acid; fumaric acid; 4-vinyl benzoic acid; vinyl phenol; and 4-hydroxyphenyl methacrylamide.

The content of the functional group capable of interacting with titanium black, such as the monomer having an acidic group, in the specific resin is preferably from 0.05% by mass to 90% by mass, more preferably from 1.0% by mass to 80% by mass, and sill more preferably from 10% by mass to 70% by mass, with respect to the specific resin, from the viewpoints of the interaction with titanium black, dispersion stability, and permeability to a developer.

The specific resin to be included in the dispersion composition of titanium black according to the invention, may contain, as copolymerization components, other structural units having various functions such as a structural unit having a functional group having an affinity to a dispersion medium used in a dispersion, in addition to the structural unit having a graft moiety and the functional group capable of interacting with titanium black, for the purpose of improving various capabilities such as image strength, unless the effect of the invention is impaired.

Examples of the copolymerization components that is copolymerizable with the specific resin according to the invention include a radical polymerizable compound selected from acrylic esters, methacrylic esters, styrenes, acrylonitriles, methacrylonitriles, acrylamides, and methacrylamides.

Specifically, examples thereof include: acrylic esters such as an alkyl acrylate in which the alkyl group is preferably an alkyl group having 1 to 20 carbon atoms (for example, benzyl acrylate, 4-biphenyl acrylate, butyl acrylate, sec-butyl acrylate, t-butyl acrylate, 4-t-butylphenyl acrylate, 4-chlorophenyl acrylate, pentachlorophenyl acrylate, 4-cyanobenzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methylacrylate, 3,5-dimethyl adamantyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate, propargyl acrylate);

methacrylic acid esters such as an alkyl methacrylate in which the alkyl group is preferably an alkyl group having 1 to 20 carbon atoms (for example, benzyl methacrylate, 4-biphenyl methacrylate, butyl methacrylate, sec-butyl methacrylate, t-butyl methacrylate, 4-t-butylphenyl methacrylate, 4-chlorophenyl methacrylate, pentachlorophenyl methacrylate, 4-cyanophenyl methacrylate, cyanomethyl methacrylate, cyclohexyl methacrylate, 2-ethoxy ethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyl adamantyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate, propargyl methacrylate, 2-diethylaminoethyl methacrylate, 2-dimethylamino methacrylate; and styrenes such as styrene, an alkyl styrene (for example, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene, or the like), an alkoxy styrene (for example, methoxy styrene, 4-methoxy-3-methyl styrene, dimethoxy styrene, or the like), halogenated styrenes (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, or the like), acrylonitrile, and methacrylonitrile.

Of these radical polymerizable compounds, methacrylic acid esters, acrylamides, methacrylamide, and styrenes are suitably used. Particularly preferable examples include benzyl methacrylate, t-butyl methacrylate, 4-t-buthyphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamantyl methacrylate, 2-naphthyl methacrylate, neopentyl methacrylate, phenylmethacrylate, tetrahydrofurfuryl methacrylate, 2-hydroxyethyl methacrylate, 3-hydroxypropyl methacrylate, 2-hydroxypropyl methacrylate, allyl methacrylate, acrylamide, N-methyl acrylamide, N-isopropyl acrylamide, morpholylacrylamide, piperidyl acrylamide, N-t-butyl acrylamide, N-cyclohexyl acrylamide, N-phenyl acrylamide, N-naphthyl acrylamide, N-hydroxymethyl acrylamide, N-hydroxyethyl acrylamide, N-allylacrylamide, 4-hydroxyphenyl acrylamide, 2-hydroxyphenyl acrylamide, N,N-dimethyl acrylamide, N,N-diisopropyl acrylamide, N,N-di-t-butyl acrylamide, N,N-dicyclohexyl acrylamide, N,N-phenyl acrylamide, N,N-dihydroxyethyl acrylamide, N,N-diallyl acrylamide, methacrylamide, N-methyl methacrylamide, N-isopropyl methacrylamide, morpholyl methacrylamide, piperidyl methacrylamide, N-t-butyl methacrylamide, N-cyclohexyl methacrylamide, N-phenyl methacrylamide, N-naphthyl methacrylamide, N-hydroxymethyl methacrylamide, N-hydroxyethyl methacrylamide, N-allyl methacrylamide, 4-hydroxyphenyl methacrylamide, 2-hydroxyphenyl methacrylamide, N,N-dimethyl methacrylamide, N,N-diisopropyl methacrylamide, N,N-di-t-butyl methacrylamide, N,N-dicyclohexyl methacrylamide, N,N-phenyl methacrylamide, N,N-dihydroxyethyl methacrylamide, N,N-diallyl methacrylamide, styrene, methyl styrene, dimethyl styrene, trimethyl styrene, isopropyl styrene, butyl styrene, cyclohexyl styrene, chloromethyl styrene, trifluoromethyl styrene, ethoxymethyl styrene, acetoxymethyl styrene, methoxy styrene, 4-methoxy-3-methyl styrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, and 4-fluoro-3-trifluoromethyl styrene.

Any one of the radical polymerizable compounds may be used alone, or a combination of two or more thereof may be used. The content of the copolymerization component(s) in the specific resin is from 0% by mol to 90% by mol, and is particularly preferably from 0% by mol to 60% by mol. When the content is in the above range, sufficient pattern formation can be attained.

Examples of solvents used in the synthesis of the specific resin of the invention, include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethyl sulfoxide, toluene, ethyl acetate, methyl lactate, and ethyl lactate. Any one of these solvents may be used alone, or two or more kinds thereof may be mixed and be used.

Specific examples of the specific resins include the following Exemplary Compounds 1 to 16 and Exemplary Compounds 20 to 71. It should be noted that the suffix numeral (wt %) shown in each structural unit is mass basis.

(Exemplary Compound 1)

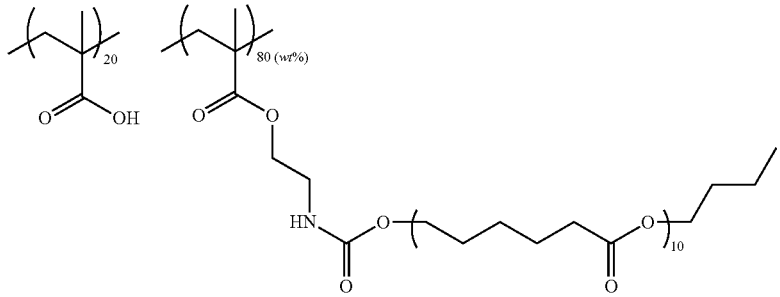

(Exemplary Compound 2)

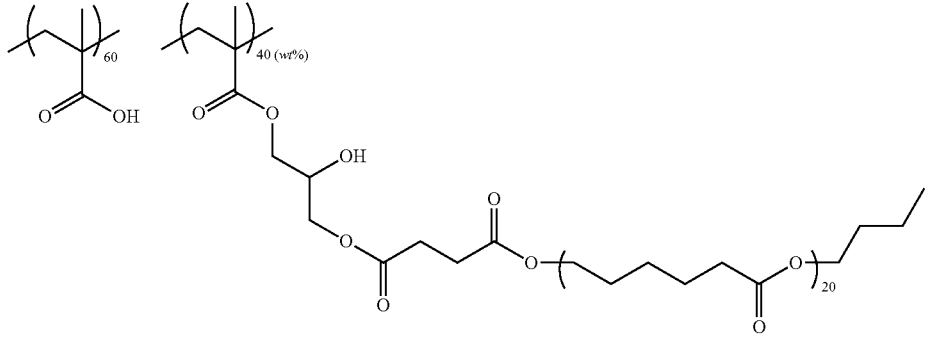

-continued
(Exemplary Compound 3)
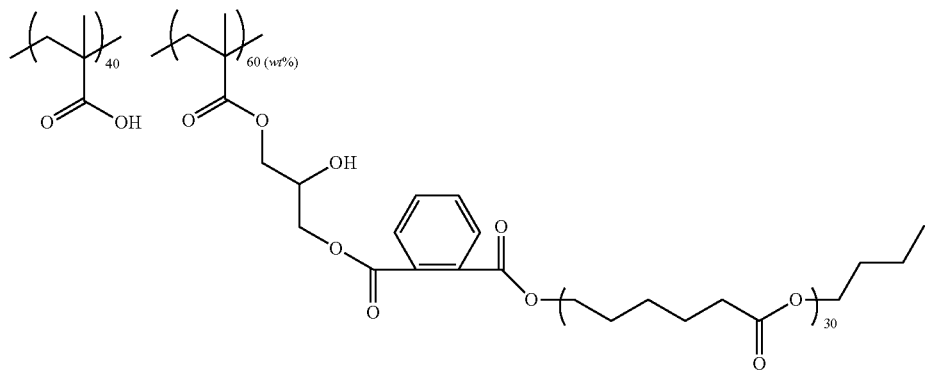
(Exemplary Compound 4)
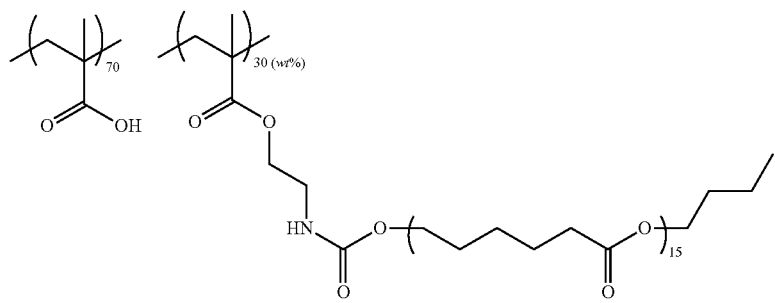
(Exemplary Compound 5)
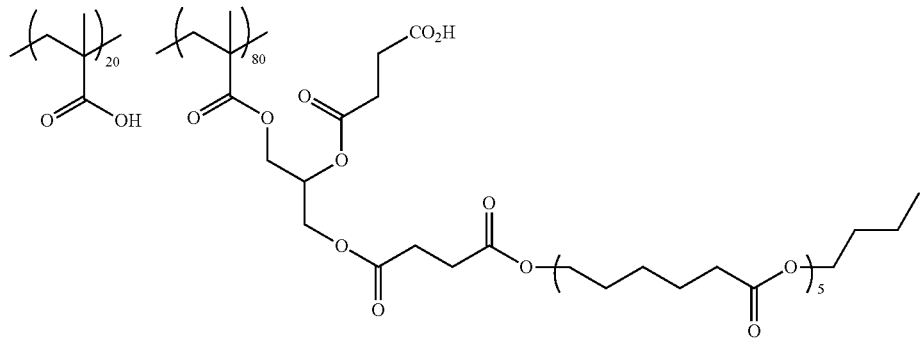
(Exemplary Compound 6)
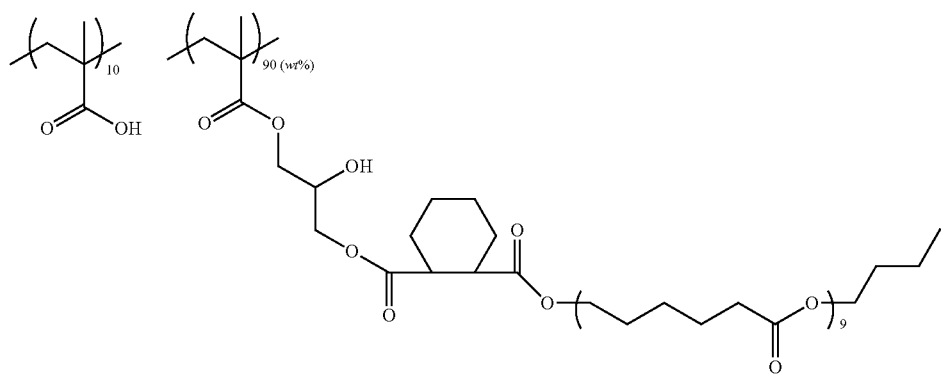

-continued
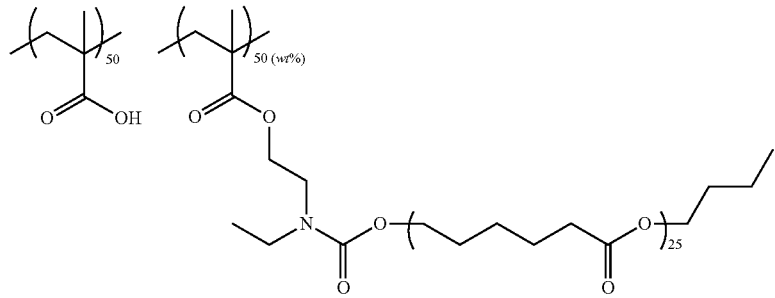
(Exemplary Compound 7)
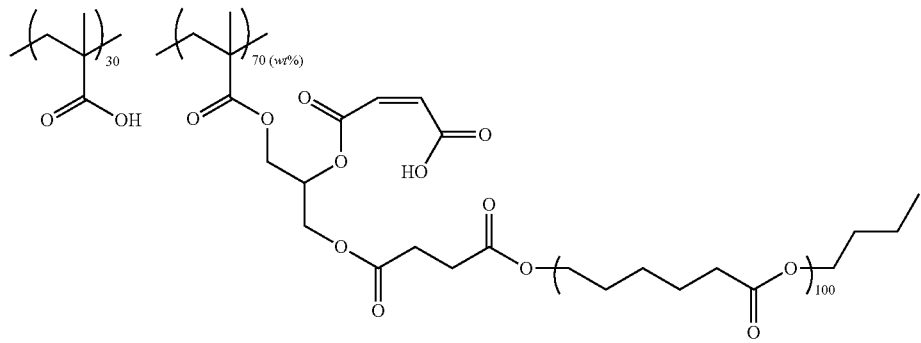
(Exemplary Compound 8)
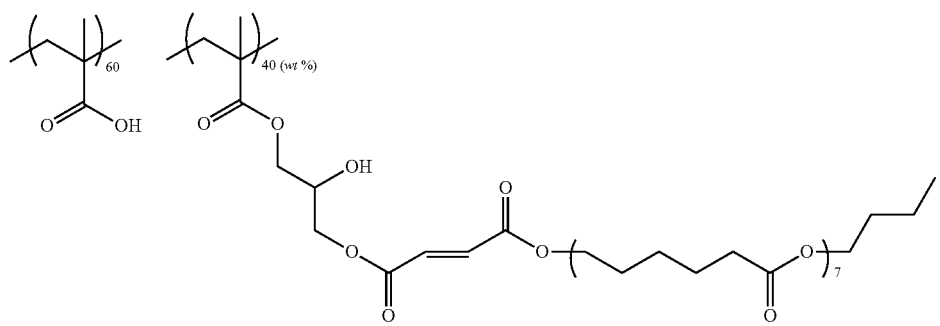
(Exemplary Compound 9)
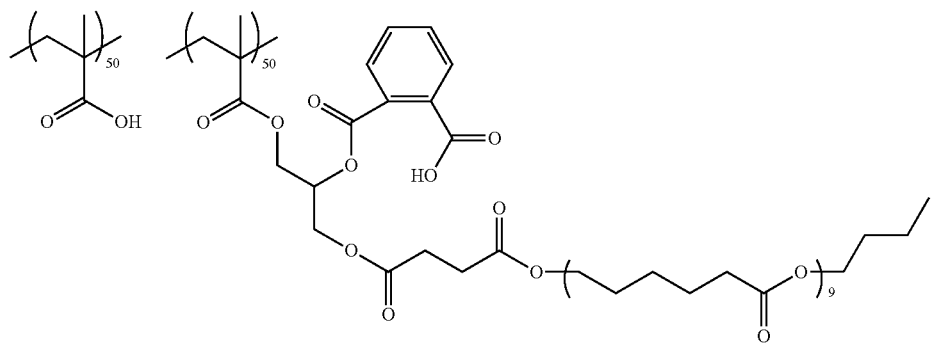
(Exemplary Compound 10)

(Exemplary Compound 11)
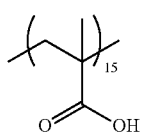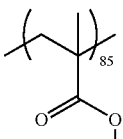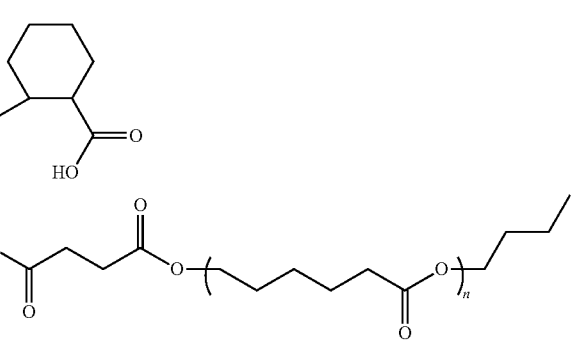
(Exemplary Compouond 12)
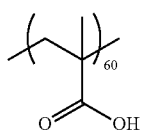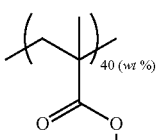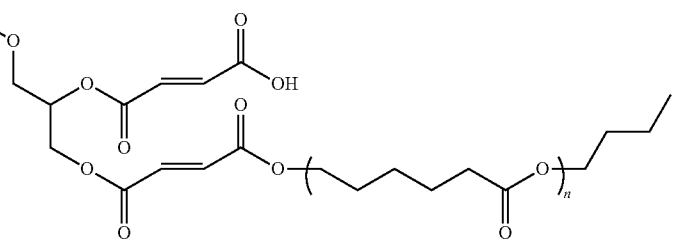
(Exemplary Compound 13)
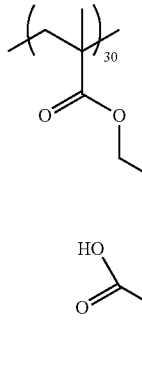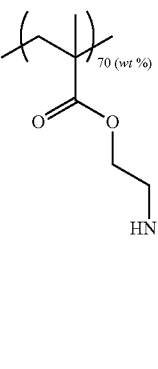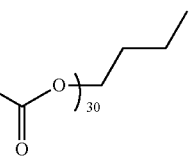
(Exemplary Compound 14)
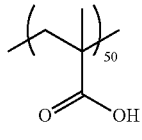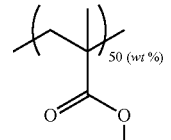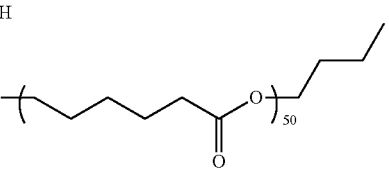

(Exemplary Compound 15)
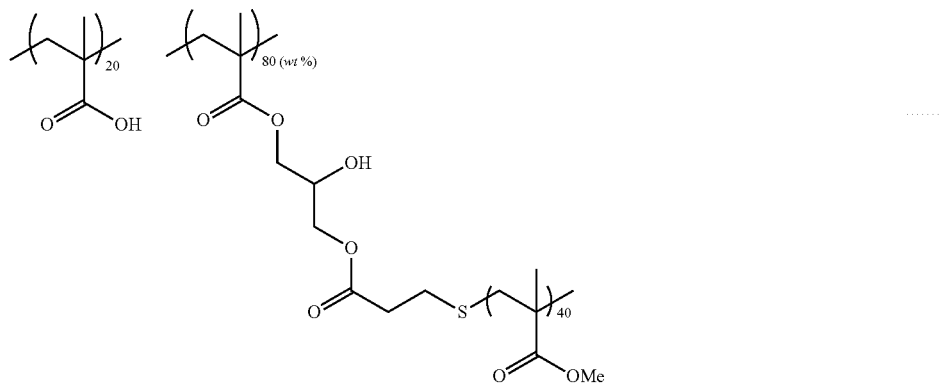
(Exemplary Compound 16)
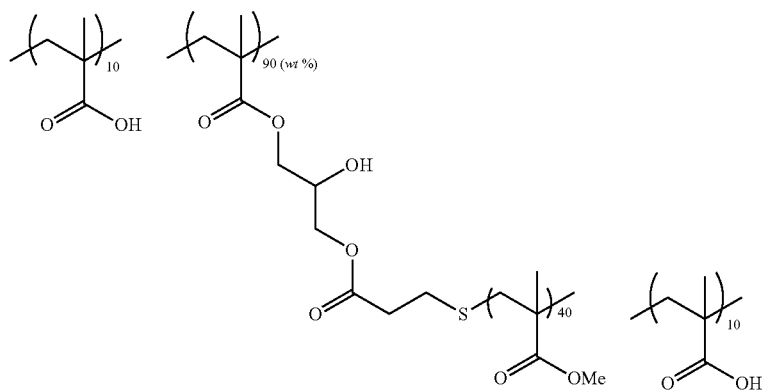
(Exemplary Compound 20)
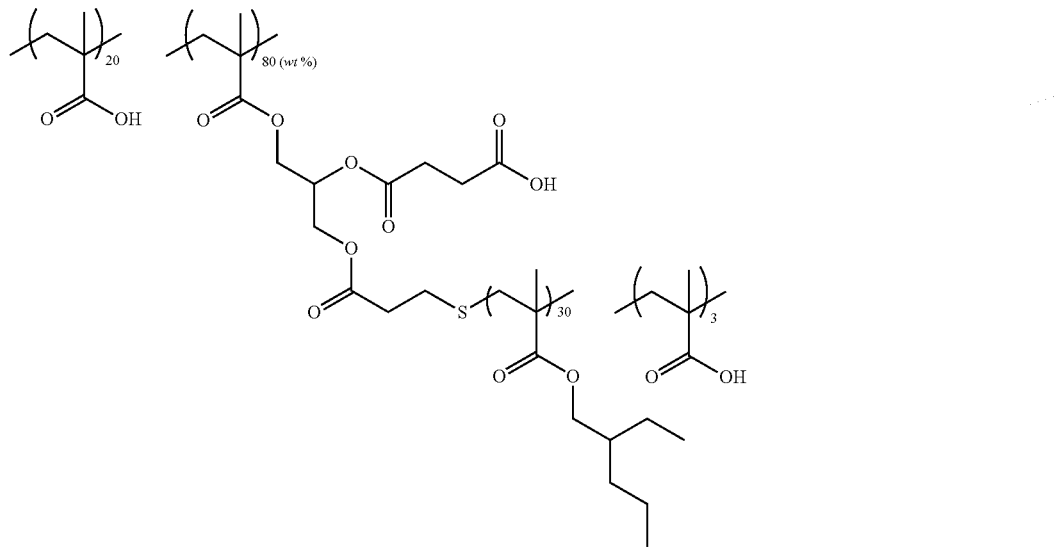

-continued
(Exemplary Compound 21)
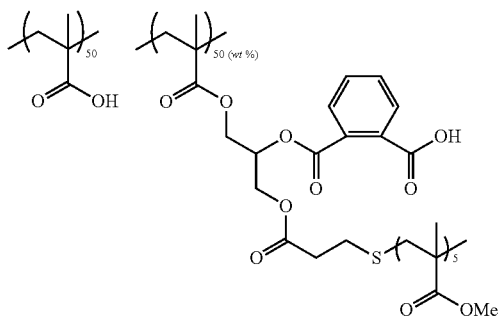
(Exemplary Compound 22)
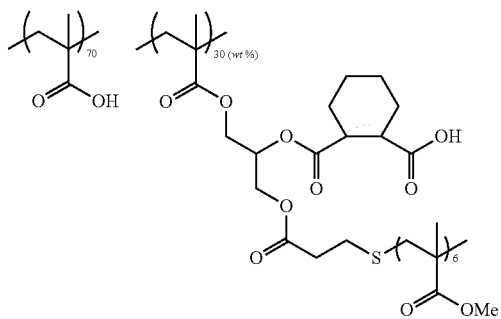
(Exemplary Compound 23)
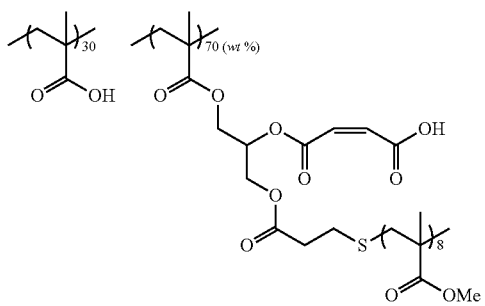
(Exemplary Compound 24)
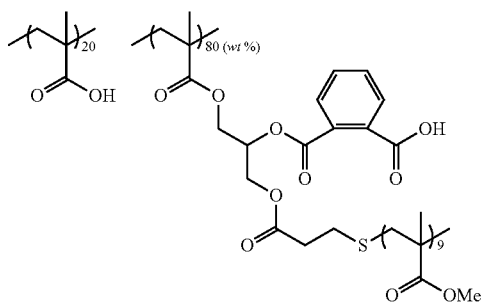
(Exemplary Compound 25)
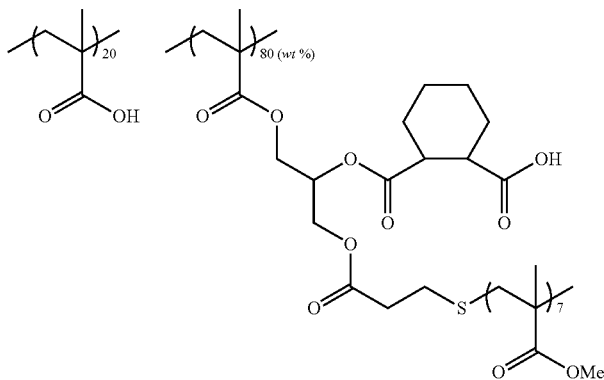
(Exemplary Compound 26)
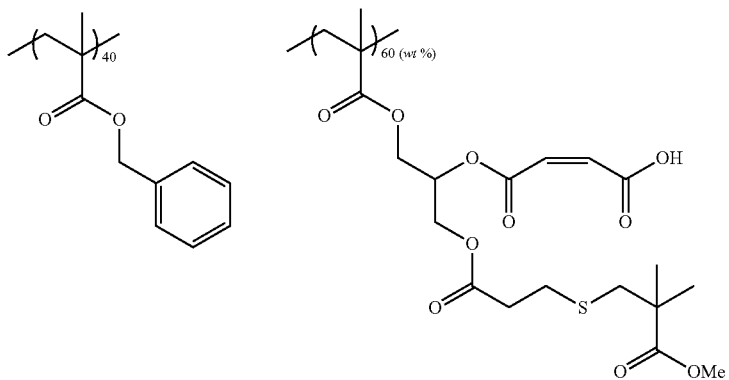

-continued
(Exemplary Compound 27)
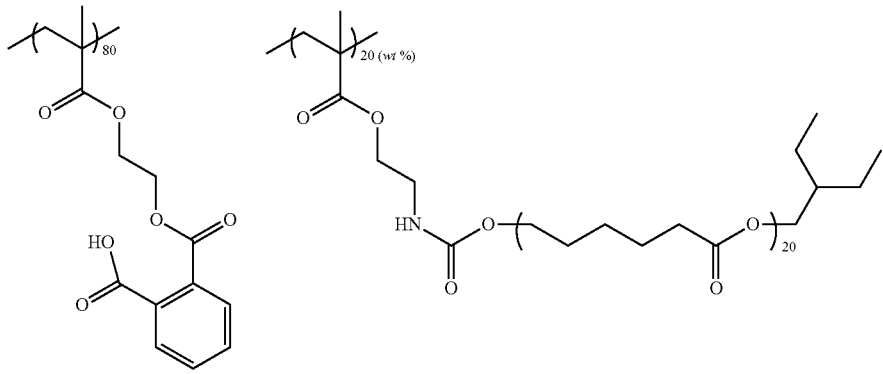
(Exemplary Compound 28)
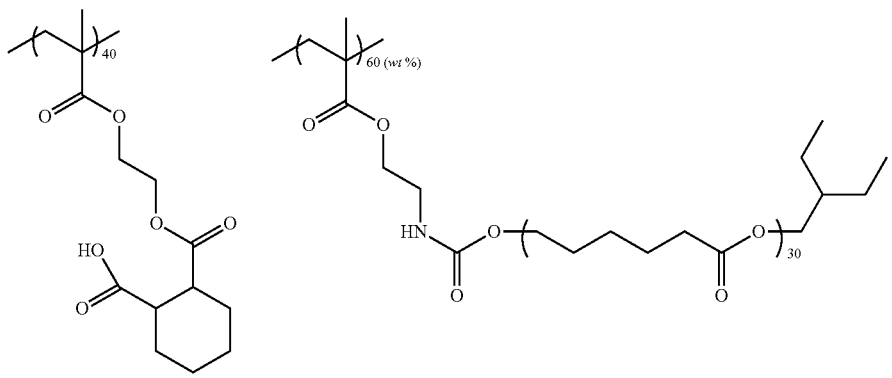
(Exemplary Compound 29)
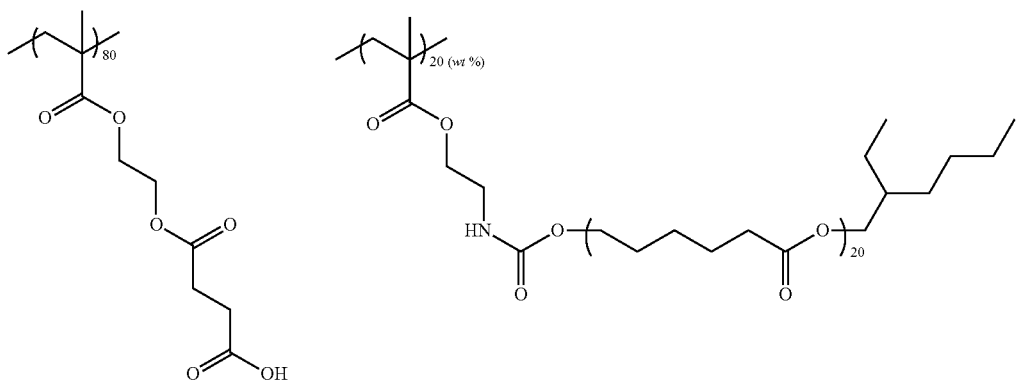
(Exemplary Compound 30)
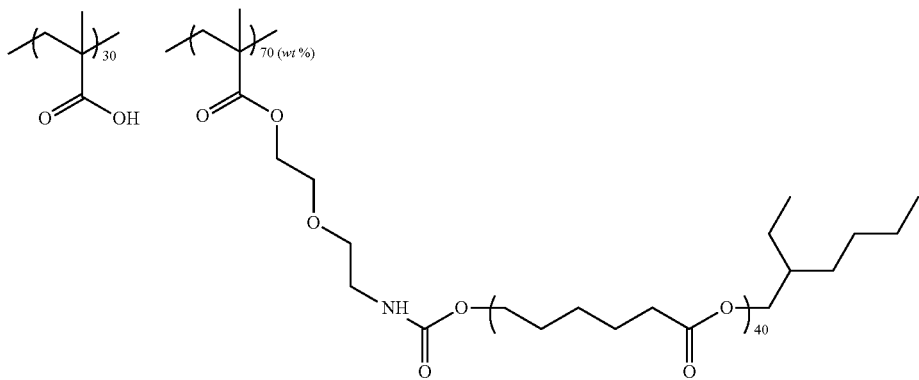

-continued
(Exemplary Compound 31)
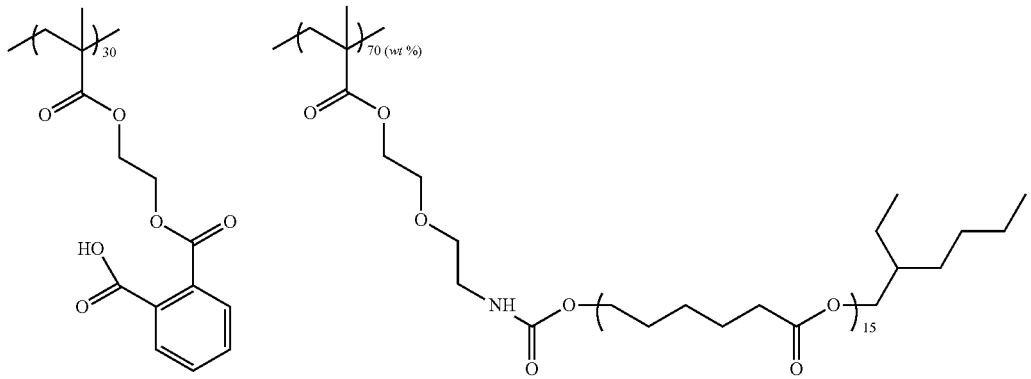
(Exemplary Compound 32)
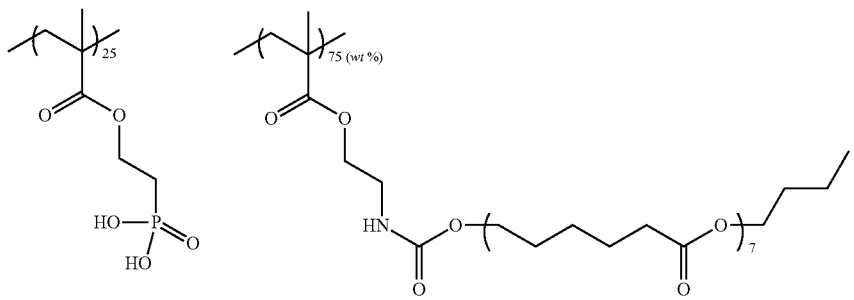
(Exemplary Compound 33)
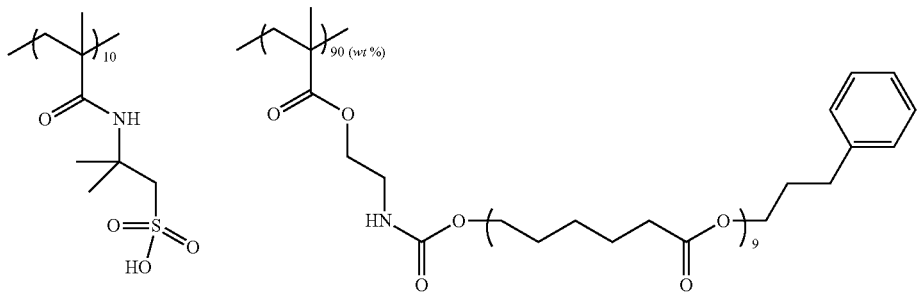
(Exemplary Compound 34)
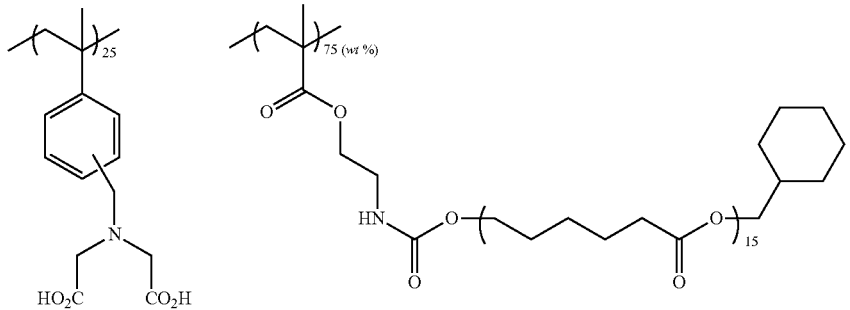
(Exemplary Compound 34)
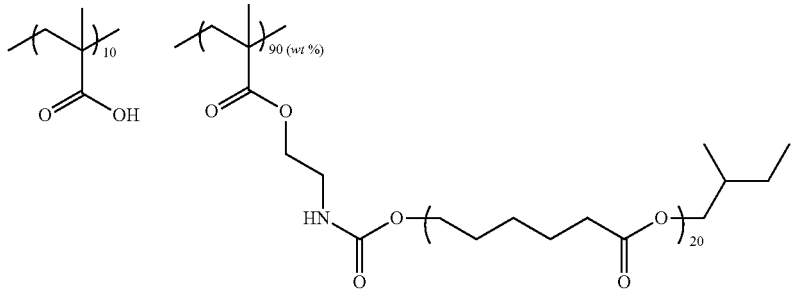

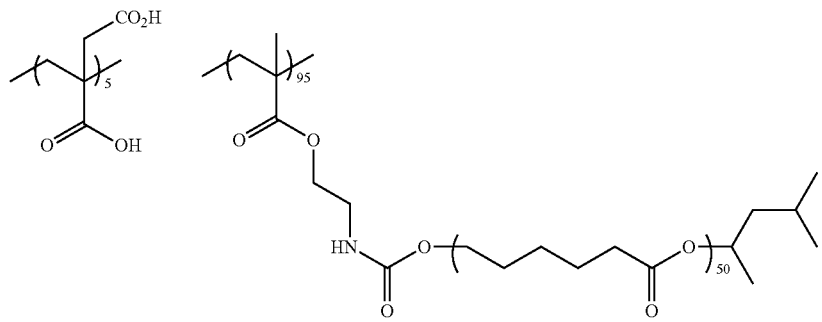
(Exemplary Compound 36)
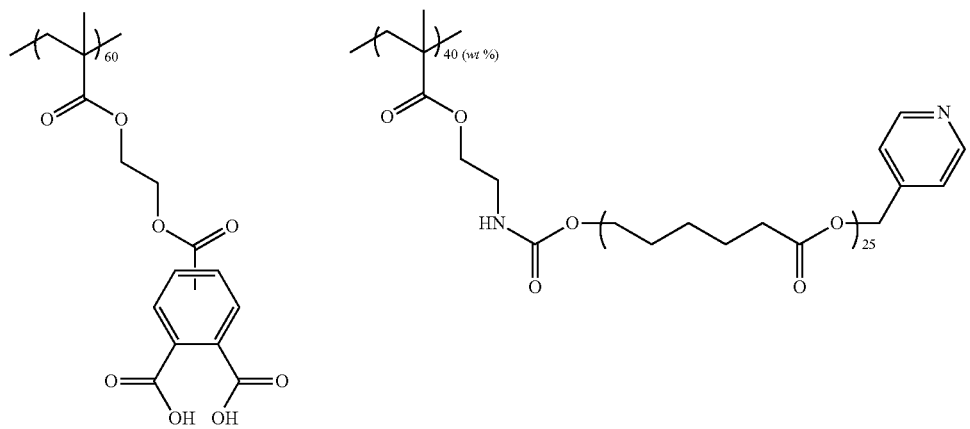
(Exemplary Compound 37)
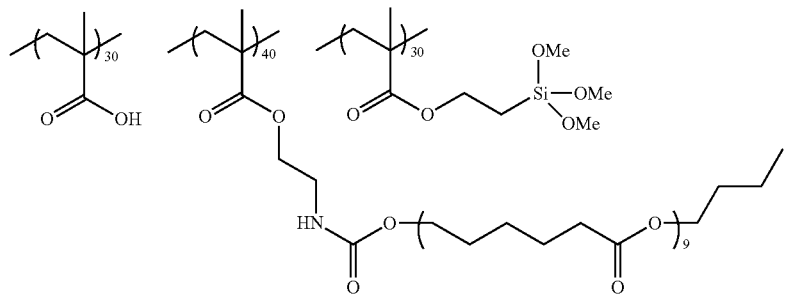
(Exemplary Compound 38)
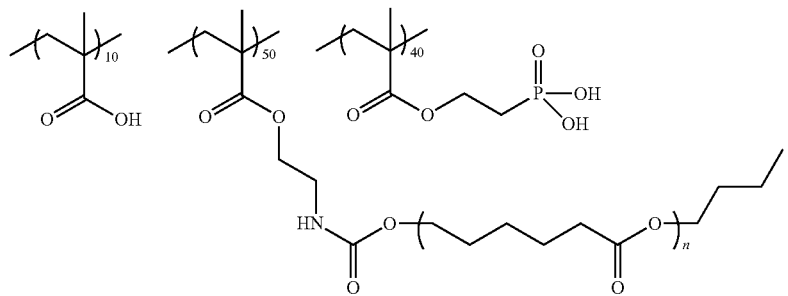
(Exemplary Compound 39)

-continued
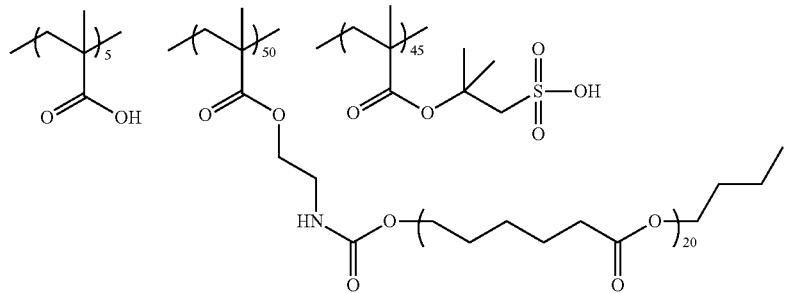
(Exemplary Compound 40)
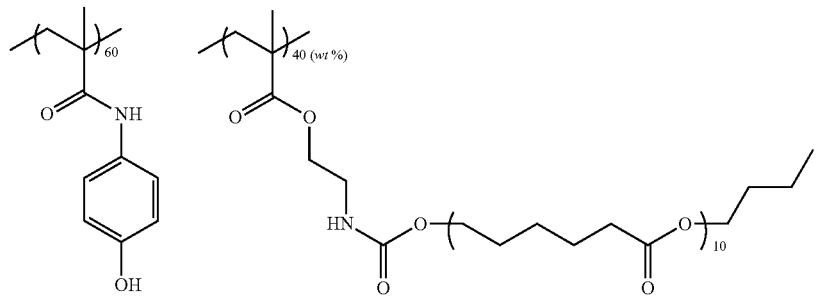
(Exemplary Compound 41)
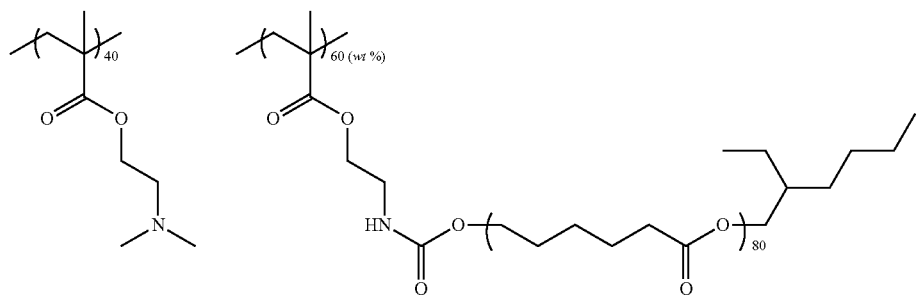
(Exemplary Compound 42)
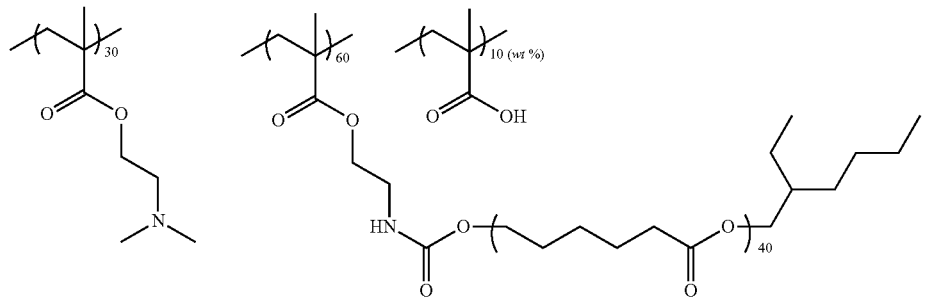
(Exemplary Compound 41)
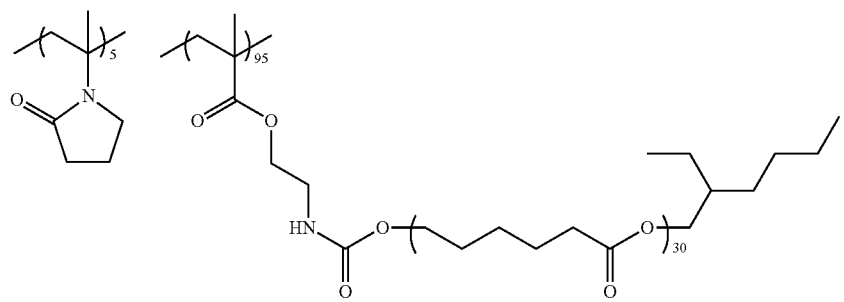
(Exemplary Compound 44)

(Exemplary Compound 45)
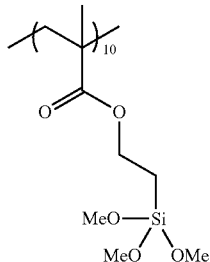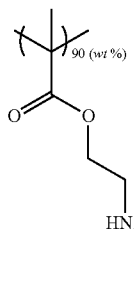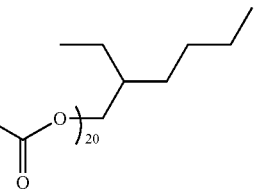
(Exemplary Compound 46)
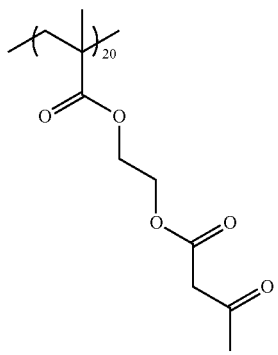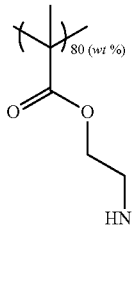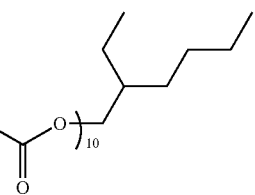
(Exemplary Compound 47)
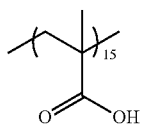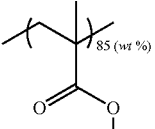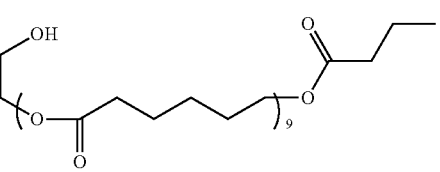
(Exemplary Compound 48)
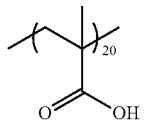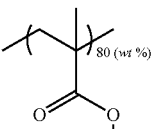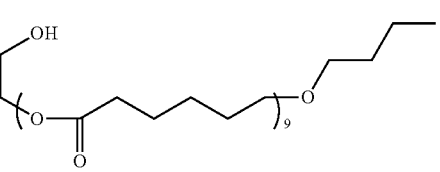
(Exemplary Compound 49)
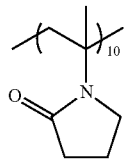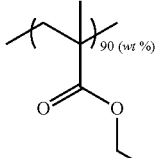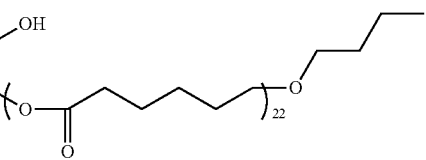

-continued
(Exemplary Compound 50)
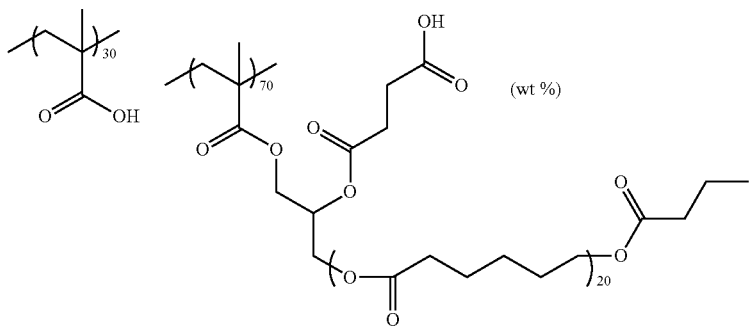
(Exemplary Compound 51)
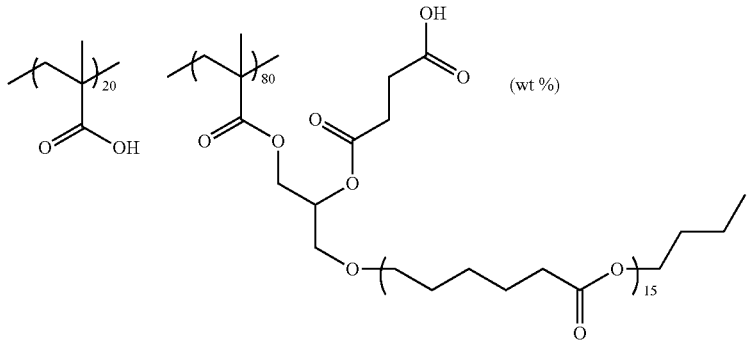
(Exemplary Compound 52)
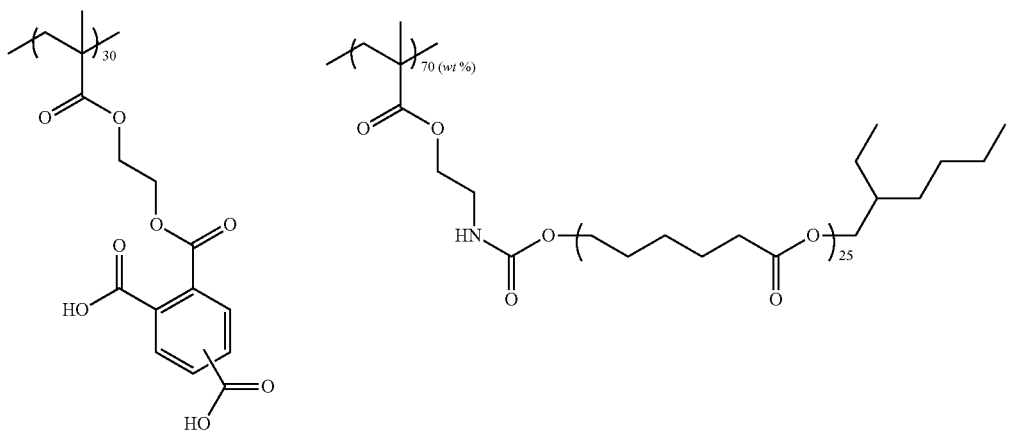
(Exemplary Compound 53)
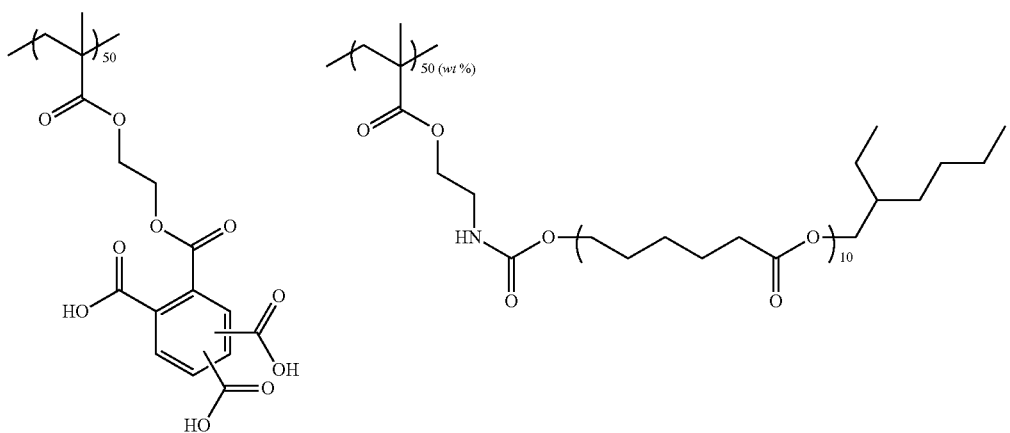

(Exemplary Compound 54)
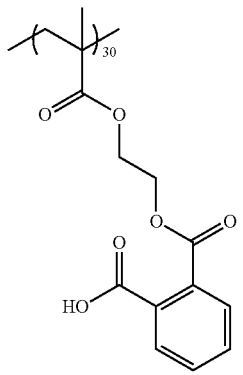 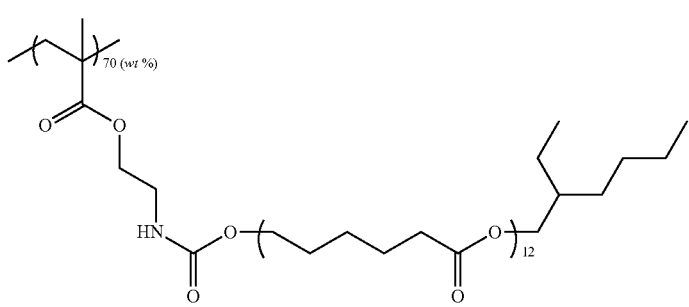
(Exemplary Compound 55)
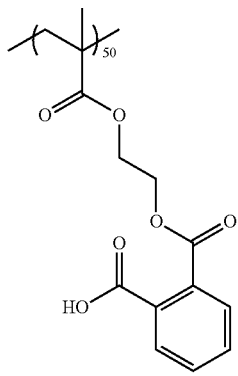 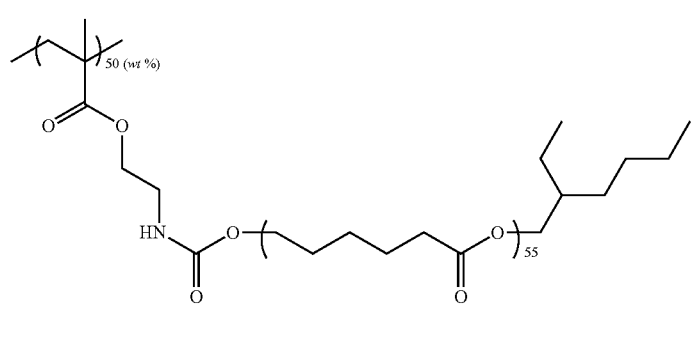
(Exemplary Compound 56)
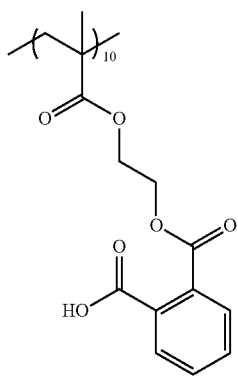 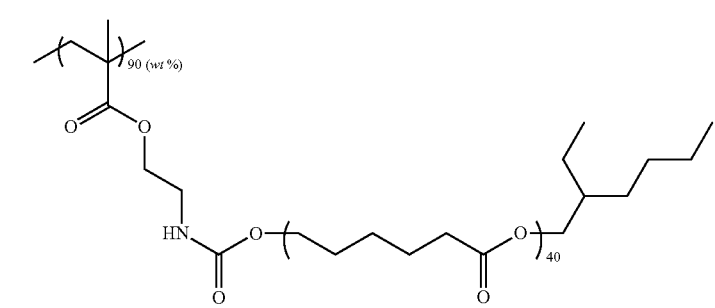
(Exemplary Compound 57)
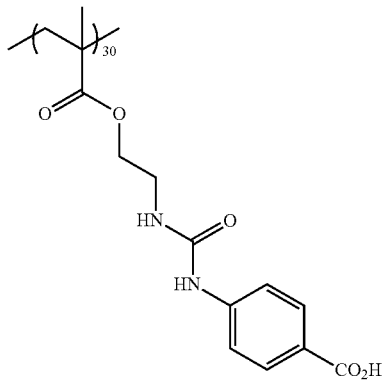 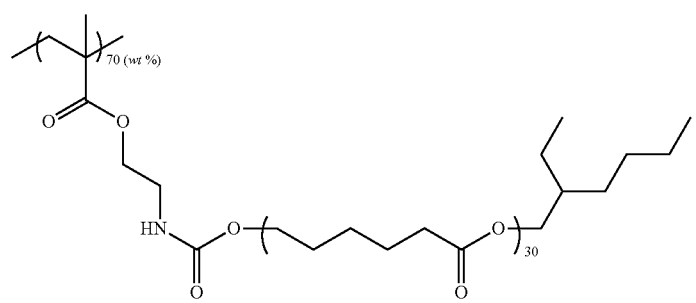

-continued
(Exemplary Compound 58)
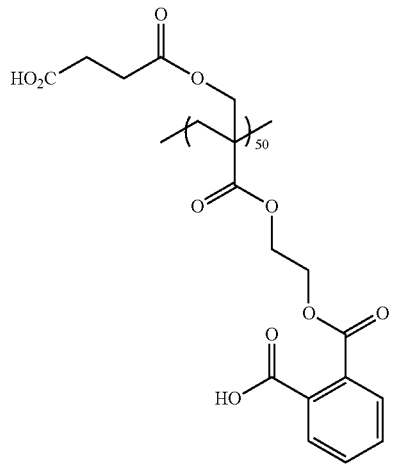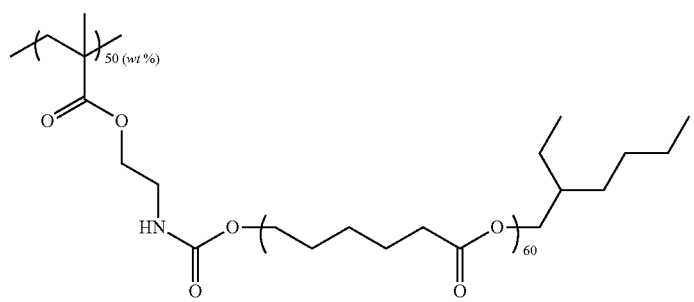
(Exemplary Compound 59)
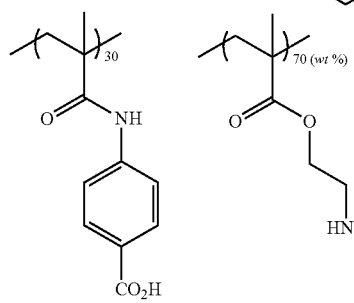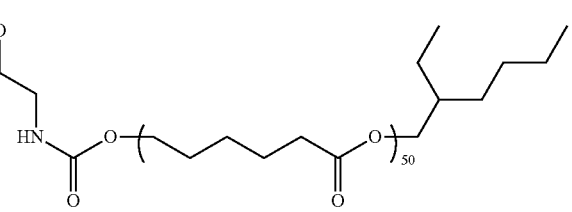
(Exemplary Compound 60)
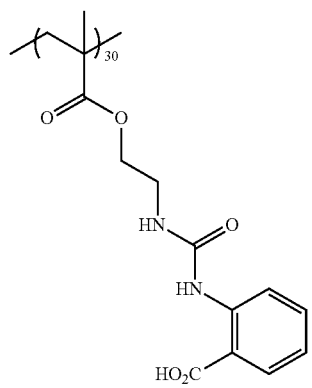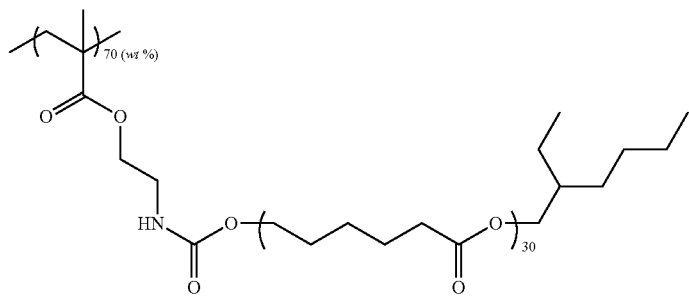
(Exemplary Compound 61)
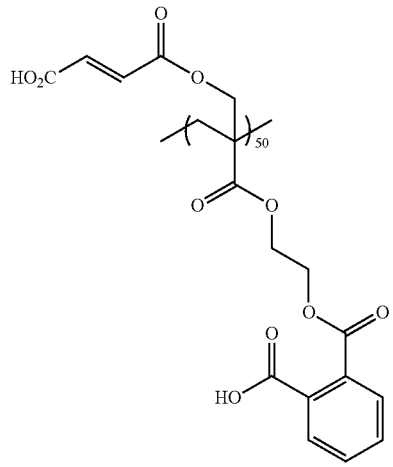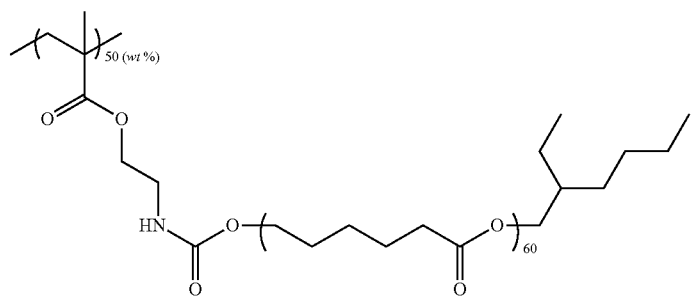

-continued
(Exemplary Compound 62)
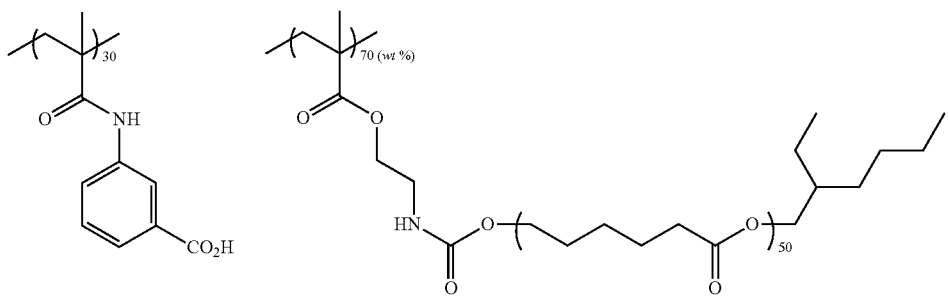
(Exemplary Compound 63)
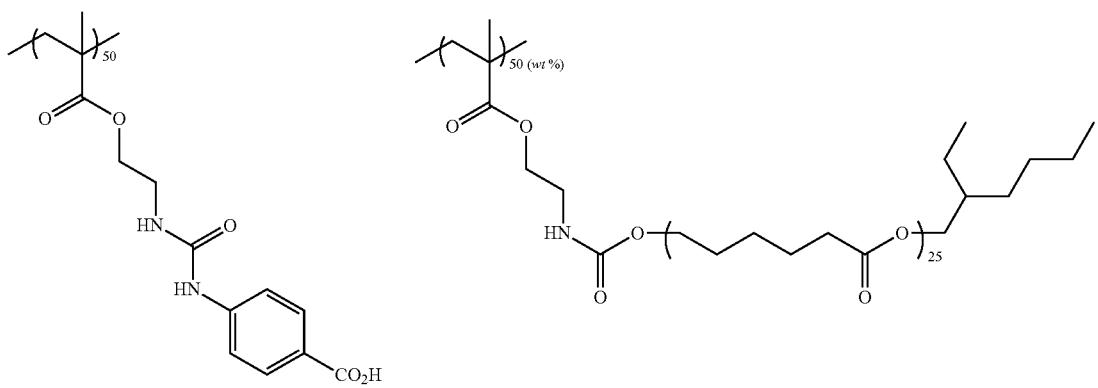
(Exemplary Compound 64)
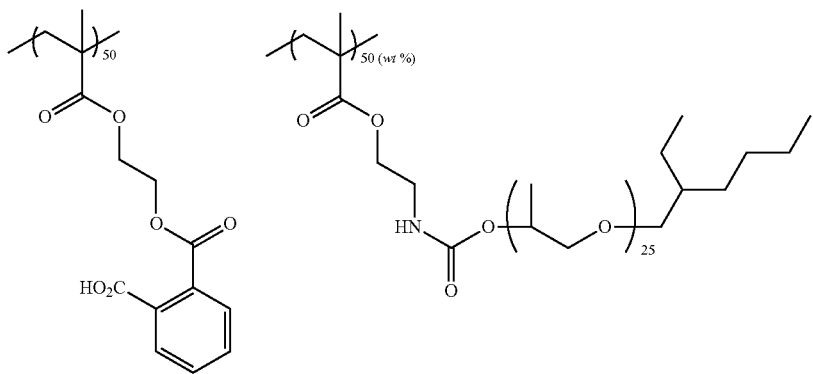
(Exemplary Compound 65)
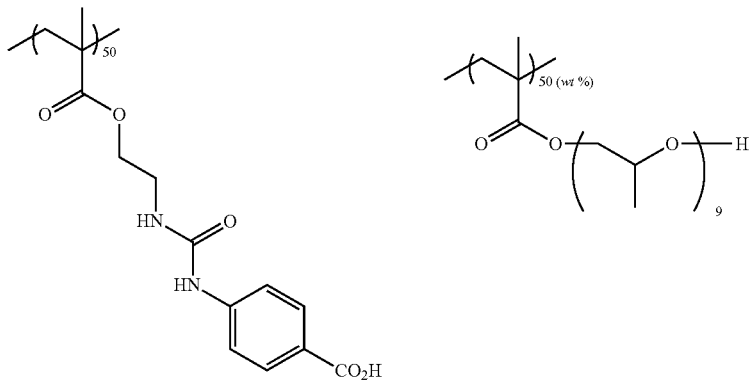

(Exemplary Compound 66)
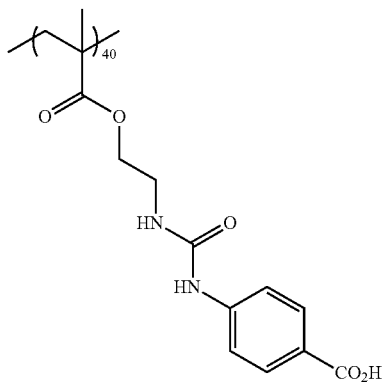 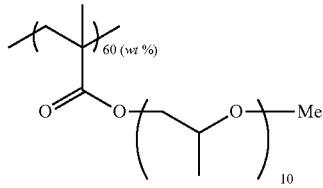
(Exemplary Compound 67)
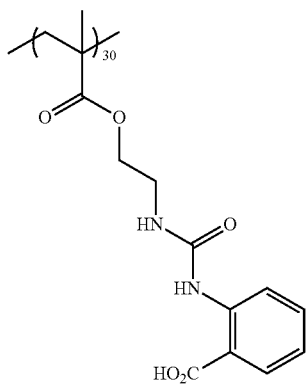 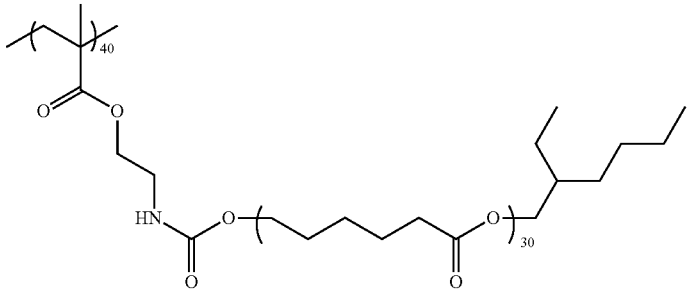
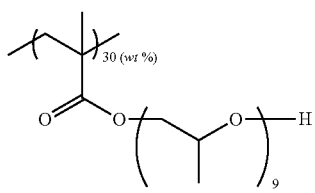
(Exemplary Compound 68)
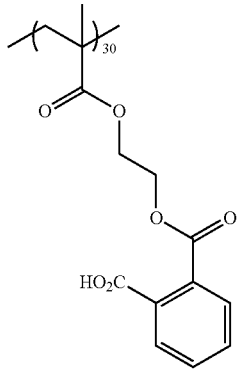 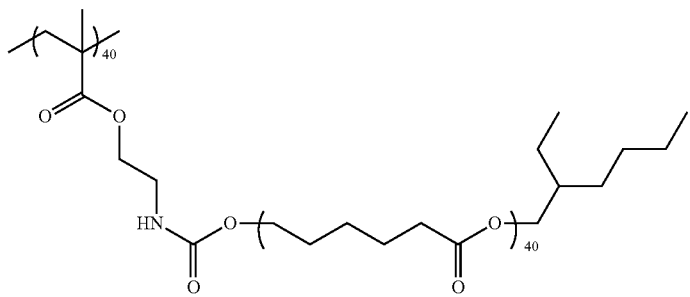

-continued
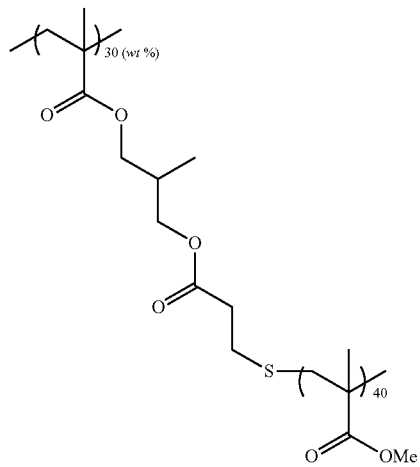
(Exemplary Compound 69)
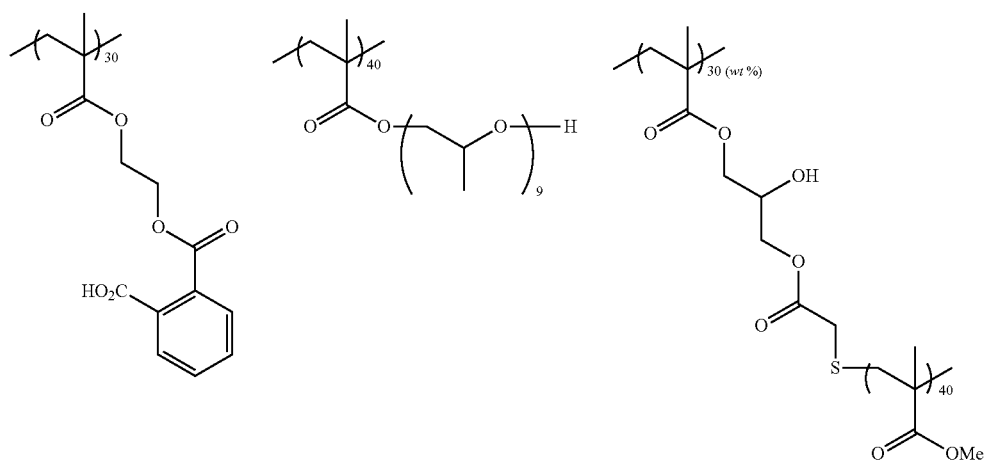
(Exemplary Compound 70)
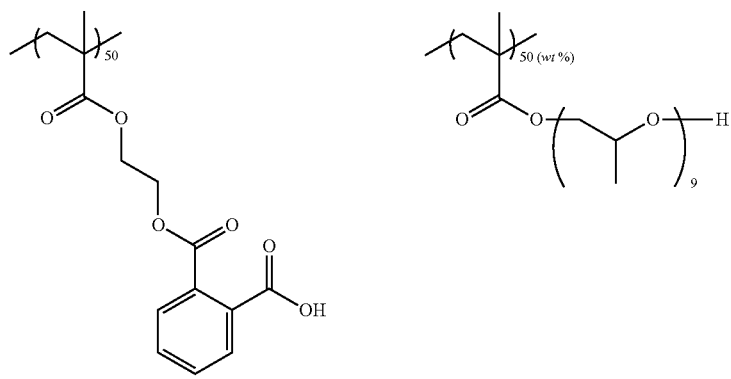

(Exemplary Compound 71)

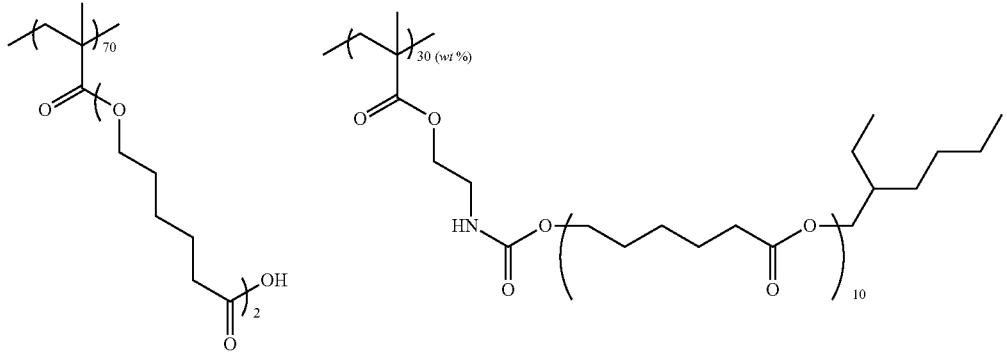

The acid value of the specific resin is preferably in the range of from 5.0 mgKOH/g to 200 mgKOH/g, more preferably in the range of from 10 mgKOH/g to 150 mgKOH/g, and still more preferably in the range of from 15 mgKOH/g to 100 mgKOH/g. When the acid value is 200 mgKOH/g or less, the exfoliation of pattern at the time of development can be suppressed, and when the acid value is 5.0 mgKOH/g or more, good alkali developability is obtained.

In the invention, the acid value of the specific resin can be calculated, for example, from the average content of acid groups in the specific resin. A resin having a desired acid value can be obtained by changing the content of a monomer unit containing an acid group, which is a constituent of the specific resin.

The weight average molecular weight of the specific resin in the invention is preferably from 10,000 to 300,000, is more preferably from 15,000 to 200,000, is still more preferably from 20,000 to 100,000, and particularly preferably from 25,000 to 50,000, from the viewpoint of suppressing pattern exfoliation at the time of development and from the viewpoint of developability. In addition, the weight average molecular weight of the specific resin may be measured by gel permeation chromatography (GPC), for example.

From the viewpoint of the dispersibility and the dispersion stability, the content of the specific resin is preferably in the range of from 0.1% by mass to 50% by mass, is more preferably in the range of from 5% by mass to 40% by mass, and is still more preferably in the range of from 10% by mass to 30% by mass, with respect to the total solids in the dispersion composition of the invention.

Other Resins

The dispersion composition of the invention may contain a resin (hereinafter, may be referred to as "another resin" or "other resins") other than the specific resin, for the purpose of controlling the dispersibility of titanium black.

Examples of other resins that can be used in the invention include a polymer dispersant (for example, a polyamideamine and a salt thereof, a polycarboxylic acid and a salt thereof, a high molecular weight unsaturated acid ester, a modified polyurethane, a modified polyester, a modified poly(meth)acrylate, a (meth)acrylate copolymer, and naphthalenesulfonic acid-formalin condensate), a polyoxyethylene alkylphosphate, a polyoxyethylene alkylamine, an alkanol amine, and a pigment derivative.

The other resins can be further classified into a straight chained polymer, a terminal end-modified polymer, a graft polymer, and a block polymer, based on the structure of the resin.

The other resin adheres to the surface of titanium black and, as needed, a pigment used together with the specific resin, and functions so as to prevent re-aggregation. Accordingly, examples of preferable structures of the resin include a terminal end-modified polymer, graft polymer, and block polymer, each of which have an anchor moiety to the surface of pigment.

Meanwhile, the other resin has an effect of modifying the surface of pigment, thereby promoting adsorption of the dispersion resin.

Specific examples of other resins include: "DISPERBYK-101 (polyamideamine phosphate), 107 (carboxylate), 110 (copolymer containing an acid group), 130 (polyamide), 161, 162, 163, 164, 165, 166, 170 (high molecular weight copolymer)", "BYK-P104 and P105 (high molecular weight unsaturated polycarboxylic acid)" which are manufactured by BYK Chemie GmbH; "EFKA 4047, 4050, 4010, 4165 (polyurethane compound), EFKA 4330, 4340 (block copolymer), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative)" which are manufactured by EFKA; "AJISPER PB821, PB822" manufactured by Ajinomoto Fine Techno Co., Inc.; "FLOWLEN TG-710 (urethane oligomer)", "POLYFLOW No. 50E, No. 300 (acrylate copolymer)" manufactured by Kyoeisha Chemical Co., Ltd.; "DISPARLON KS-860, 873SN, 874, #2150 (aliphatic polyvalent carboxylic acid), #7004 (polyether ester), DA-703-50, DA-705, DA-725" manufactured by Kusumoto Chemicals Ltd.; "DEMOL RN, N (naphthalenesulfonic acid-formalin polycondensation product), MS, C, SN-B (aromatic sulfonic acid-formalin polycondensation product)", "HOMOGENOL L-18 (high molecular polycarboxylic acid)", "EMULGEN 920, 930, 935, 985 (polyoxyethylene nonylphenyl ether)", "ACETAMIN 86 (stearylamine acetate)" manufactured by Kao Corporation; SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, 38500 (graft polymer)" manufactured by Lubrizol Corporation; and "NIKKOL T106 (polyoxyethylene sorbitanmonooleate) and MYS-IEX (polyoxyethylene monostearate)" manufactured by Nikko Chemicals Co., Ltd.

Any one of these other resins may be used alone, or a combination of two or more thereof may be used.

(C) Solvents

The dispersion composition of the invention includes any of various organic solvents as a solvent.

Examples of the solvent used in the invention include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butyrolactone, methyl lactate, and ethyl lactate.

Any one of these solvents may be used singly, or two more kind thereof may be mixed and used. The concentration of the solid content to the solvent is preferably 2 to 60% by mass.

Polymerizable Composition

The polymerizable composition according to an embodiment of the invention includes the dispersion composition described above, (D) a polymerizable compound, (E) a polymerization initiator, and the like. The details of the polymerizable composition are described below.

(D) Polymerizable Compound

The polymerizable compound (D) that can be used in the polymerizable composition of the invention is an addition-polymerizable compound that has at least one ethylenic unsaturated double bond, and is selected from the compounds containing at least one, preferably two or more terminal end ethylenic unsaturated bonds. Such compounds are widely known in the industrial field, and any of these compounds may be used in the invention without any restriction.

These compounds have chemical forms such as a monomer, a prepolymer, namely, a dimer, a trimer and an oligomer or mixtures thereof, copolymers thereof and the like, for example. Examples of monomers and copolymers thereof include an unsaturated carboxylic acid (for example, acrylic acid, methacrylic acid, itaconic acid, crotonic acid, isocrotonic acid, maleic acid or the like), and esters and amides thereof, and preferable examples thereof include esters of an unsaturated carboxylic acid and an aliphatic polyhydric alcohol compound and amides of an unsaturated carboxylic acid and an aliphatic polyvalent amine compound. Further, an addition reaction product of unsaturated carboxylic acid esters or unsaturated carboxylic acid amides, which have a nucleophilic substituent such as a hydroxyl group, an amino group or a mercapto group, with mono-functional or poly-functional isocyanates or mono-functional or poly-functional epoxies; and a dehydration condensation reaction product of the unsaturated carboxylic acid ester or unsaturated carboxylic acid amide with a mono-functional or poly-functional carboxylic acid, are suitably used. Moreover, an addition product of unsaturated carboxylic acid esters or unsaturated carboxylic acid amides, which have an electrophilic substituent such as an isocyanate group or an epoxy group, with mono-functional or poly-functional alcohols, amines or thiols; and a substitution reaction product of unsaturated carboxylic acid esters or unsaturated carboxylic acid amides, which have a releasable substituent such as a halogen group or tosyloxy group, with mono-functional or poly-functional alcohols, amines or thiols, are also suitably used. Furthermore, as another example, the group of compounds obtained by replacing the unsaturated carboxylic acid with an unsaturated phosphonic acid, styrene, vinyl ether or the like can also be used.

Specific examples of monomers of esters of an aliphatic polyhydric alcohol compound and an unsaturated carboxylic acid include: acrylic esters such as ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acrlyloyloxyethyl) isocyanurate, polyester acrylate oligomer, and isocyanuric acid EO-modified triacrylate;

methacrylic acid esters such as tetramethylene glycol dimethacrylate, triethylene glycol dimethacrylate, neopentylglycol dimethacrylate, trimethylol propane trimethacrylate, triethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis-[p-(methacryloxyethoxy)phenyl]dimethyl methane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic acid esters such as ethylene glycol dicrotonate, tetramethylene glycol dicrotonate, pentaerythritol dicrotonate, and sorbitol tetradicrotonate;

isocrotonic acid esters such as ethylene glycol diisocrotonate, pentaerythritol diisocrotonate, and sorbitol tetraisocrotonate; and maleic acid esters such as ethylene glycol dimaleate, triethylene glycol dimaleate, pentaerythritol dimaleate, and sorbitol tetramaleate.

For example, aliphatic alcohol esters disclosed in Japanese Examined Patent Application Publication (JP-B) No. 51-47334 or JP-A No. 57-196231, esters having an aromatic skeleton disclosed in JP-A No. 59-5240, JP-A No. 59-5241, or JP-A No. 2-226149, and esters containing an amino group disclosed in JP-A No. 1-165613, and the like are also suitably used as the esters. Further, a mixture of the ester monomers may be used.

Further, specific examples of the monomers of amides of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, and xylylene bis-methacrylamide.

Examples of other preferable amide monomers include a monomer having a cyclohexylene structure as that disclosed in JP-B No. 54-21726.

Further, addition polymerizable compounds produced using the addition reaction of an isocyanate and a hydroxyl group are also suitable, and specific examples of such compounds include vinyl urethane compounds having two or more polymerizable vinyl groups in a molecule thereof, which are obtained by adding a polyisocyanate compound having two or more isocyanate groups in a molecule as described in JP-B No. 48-41708 to vinyl monomers containing a hydroxyl group represented by the following Formula (V).

In Formula (V), $R^7$ and $R^8$ each independently represent H or $CH_3$.

$$H_2C=C(R^7)COOCH_2CH(R^8)OH \qquad \text{Formula (V)}$$

Further, urethane acrylates as disclosed in JP-A No. 51-37193, JP-B No. 2-32293, or JP-B No. 2-16765, and urethane compounds having an ethylene oxide skeleton as disclosed in JP-B No. 58-49860, JP-B No. 56-17654, JP-B No. 62-39417 or JP-B No. 62-39418 are also suitable. Furthermore, a polymerizable composition that exerts very high photosensitive speed can be obtained by using a polymerizable compound having an amino structure or a sulfide structure in a molecule, as that disclosed in JP-A No. 63-277653, JP-A No. 63-260909, or JP-A No. 1-105238.

Other examples include polyfunctional acrylates or methacrylates such as polyester acrylates as disclosed in JP-A No. 48-64183, JP-B No. 49-43191 or JP-B No. 52-30490, or epoxyacrylates obtained by a reaction between an epoxy resin and (meth)acrylic acid. Furthermore, examples also include specific unsaturated compounds as disclosed in JP-B No. 46-43946, JP-B No. 1-40337, or JP-B No. 1-40336, and vinyl phosphonic acid compounds as disclosed in JP-A No. 2-25493. Moreover, in some cases, a structure containing a perfluoroalkyl group as disclosed in JP-A No. 61-22048 is suitably used. Furthermore, photocurable monomers or oligomers as disclosed in Journal of the Adhesion Society of Japan Vol. 20, No. 7, pp. 300-308 (1984) may be used.

Details of the methods of use of these polymerizable compounds, such as the structure of the compounds, single use or use of a combination, the amount to be added, or the like, may arbitrarily be determined in accordance with the intended performance design of the compounds. For example, the method may be selected from the following viewpoint.

From the viewpoint of sensitivity, a structure having a high content of unsaturated groups per one molecule is preferable, and in many cases, bifunctionality or higher functionality is desirable. Further, in order to increase the strength of a cured film, trifunctionality or higher functionality is desirable. Also, it is effective to use a method of controlling both the sensitivity and the strength by using compounds having different functionalities and/or different polymerizable groups (for example, acrylic acid ester, methacrylic acid ester, styrene compound and vinyl ether compound) in combination.

The selection and the method of use of the polymerizable compounds are also important factors for the compatibility with other components (for example, a polymerization initiator, a light-shielding material (pigment, dye or the like) such as titanium black and the like) contained in the polymerizable composition and for the dispersibility. For example, the compatibility may be increased by the use of a compound with low purity, or by the use of a combination of two or more kinds of other components. Moreover, in some cases, a specific structure may be selected for the purpose of improving the adhesion to a hard surface such as a substrate.

The content of (D) the polymerizable compound in the total solid content of the polymerizable composition is preferably in the range of from 5% by mass to 90% by mass, more preferably in the range of from 10% by mass to 85% by mass, and still more preferably in the range of from 20% by mass to 80% by mass.

The content within the range is preferable, because both the adhesion sensitivity and the developability are good, without the color hue being pale.

(E) Polymerization Initiator

The polymerization initiator (E) used in the invention is a compound that decomposes by the action of light, and initiates and/or promotes the polymerization of (D) the polymerizable compound, and it is preferable that the polymerization initiator (E) have an absorption in the wavelength range of from 300 nm to 500 nm. Further, the polymerization initiator may be used singly, or a combination of two or more kinds thereof may be used.

Examples of (E) the polymerization initiator include an organic halide compound, an oxydiazole compound, a carbonyl compound, a ketal compound, a benzoin compound, an acridine compound, an organic peroxide compound, an azo compound, a coumarin compound, an azide compound, a metallocene compound, a hexaaryl biimidazole compound, an organic boric acid compound, a disulfonic acid compound, an oxime ester compound, an onium salt compound, and an acyl phosphine(oxide) compound.

Specific examples of the organic halide compound include compounds as disclosed in Bull. Chem. Soc Japan, 42, p. 2924 (1969), Wakabayashi, et al., U.S. Pat. No. 3,905,815, JP-B No. 56-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, JP-A No. 63-298339, and Journal of Heterocyclic Chemistry, 1 (3), (1970), M. P. Hutt, and in particular, include an oxazole compound and an s-triazine compound, which are substituted with a trihalomethyl group.

As the s-triazine compound, an s-triazine derivative in which at least one mono-, di- or tri-halogen substituted methyl group is combined with the s-triazine ring is more preferable, and examples of the s-triazine compound include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxydiazole compound include 2-trichloromethyl-5-styryl-1,3,4-oxodiazole, 2-trichloromethyl-5-(cyanostyryl)-1,3,4-oxodiazole, 2-trichloromethyl-5-(naphtho-1-yl)-1,3,4-oxodiazole, and 2-trichloromethyl-5-(4-styryl)styryl-1,3,4-oxodiazole.

Examples of the carbonyl compounds include: benzophenone, benzophenone derivatives such as Michler's ketone, 2-methylbenzophenone, 3-methylbenzophenone, 4-methylbenzophenone, 2-chlorobenzophenone, 4-bromobenzophenone, or 2-carboxybenzophenone; acetophenone derivatives such as 2,2-dimethoxy-2-phenyl acetophenone, 2,2-diethoxy acetophenone, 1-hydroxycyclohexyl phenyl ketone, α-hydroxy-2-methylphenyl propanone, 1-hydroxy-1-methylethyl-(p-isopropylphenyl)ketone, 1-hydroxy-1-(p-dodecylphenyl)ketone, 2-methyl-(4'-(methylthio)phenyl)-2- morpholino-1-propanone, 1,1,1-trichloromethyl-(p-butylphenyl)ketone, or 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone or 2,4-diisopropylthioxanthone; and benzoate derivatives such as ethyl-p-dimethylaminobenzoate or ethyl-p-diethylaminobenzoate.

Examples of the ketal compound include benzyl methyl ketal and benzyl-β-methoxyethyl ethyl acetal.

Examples of the benzoin compound include m-benzoin isopropyl ether, benzoin isobutyl ether, benzoin methyl ether, and methyl-o-benzoyl benzoate.

Examples of the acridine compound include 9-phenylacridine and 1,7-bis(9-acrydinyl)heptane.

Examples of the organic peroxide compound include trimethyl cyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropyl benzene hydroperoxide, 2,5-dimethylhexane-2,5-dihydroperoxide, 1,1,3,3-tetra-methylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butylperoxylaurate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl-di (t-butylperoxydihydrogen diphthalate), and carbonyl-di(t-hexylperoxy dihydrogen diphthalate).

Examples of the azo compound include the azo compounds as disclosed in JP-A No. 8-108621.

Examples of the coumarin compound include 3-methyl-5-amino-((s-triazin-2-yl)amino)-3-phenyl coumarin, 3-chloro-5-diethylamino-((s-triazin-2-yl)amino)-3-phenyl coumarin, and 3-butyl-5-dimethylamino-((s-triazin-2-yl)amino)-3-phenyl coumarin.

Examples of the azide compound include organic azide compounds as disclosed in U.S. Pat. No. 2,848,328, U.S. Pat. No. 2,852,379, or U.S. Pat. No. 2,940,853, and 2,6-bis(4-azidobenzylidene)-4-ethylcyclohexanone (BAC-E).

Examples of the metallocene compound include various titanocene compounds as disclosed in JP-A No. 59-152396, JP-A No. 61-151197, JP-A No. 63-41484, JP-A No. 2-249, JP-A No. 2-4705 or JP-A No. 5-83588. Specific examples thereof include di-cyclopentadienyl-Ti-bis-phenyl, di-cyclopentadienyl-Ti-bis-2,6-difluorophenyl-1-yl, di-cyclopentadienyl-Ti-bis-2,4-di-fluorophenyl-1-yl, di-cyclopentadienyl-Ti-bis-2,4,6-trifluorophenyl-1-yl, di-cyclopentadienyl-Ti-bis-2,3,5,6-tetrafluorophenyl-1-yl, di-cyclopentadienyl-Ti-bis-2,3,4,5,6-pentafluorophenyl-1-yl, di-methylcyclopentadienyl-Ti-bis-2,6-difluorophenyl-1-yl, di-methylcyclopentadienyl-Ti-bis-2,4,6-trifluorophenyl-1-yl, di-methylcyclopentadienyl-Ti-bis-2,3,5,6-tetrafluorophenyl-1-yl, di-methylcyclopentadienyl-Ti-bis-2,3,4,5,6-pentafluorophenyl-1-yl, and iron-arene complexes as disclosed in JP-A No. 1-304453 or JP-A No. 1-152109.

As the biimidazole compound, for example, a hexaaryl biimidazole compound (lophine dimer compound) and the like are desirable.

Examples of the biimidazole compound include lophine dimers as disclosed in JP-B No. 45-37377 or JP-B No. 44-86516, and various compounds as disclosed in JP-B No. 6-29285, U.S. Pat. Nos. 3,479,185, 4,311,783, and 4,622,286, and specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4', 5,5'-tetraphenylbiimidazole.

Specific examples of the organic borate compound include organic borates as disclosed JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, JP-A No. 2002-116539, and "Rad Tech '98. Proceeding, in Chicago" Apr. 19-22, 1998, Kunz, Martin, organic boron sulfonium complexes or organic boron oxosulfonium complexes as disclosed in JP-A No. 6-157623, JP-A No. 6-175564, and JP-A No. 6-175561, organic boron iodonium complexes as disclosed in JP-A No. 6-175554, and JP-A No. 6-175553, organic boron phosphonium complexes as disclosed in JP-A No. 9-188710, organic boron transition-metal coordinate complexes as disclosed in JP-A No. 6-348011, JP-A No. 7-128785, JP-A No. 7-140589, JP-A No. 7-306527, and JP-A No. 7-292014.

Examples of the disulfone compound include the compound as disclosed in JP-A No. 61-166544 and JP-A No. 2002-328465.

From the viewpoints of the sensitivity, the stability over time, and the coloration at the time of post-heating, oxime compounds are preferably used as (E) the polymerization initiator in the invention.

Examples of the oxime compounds include compounds as disclosed in J. C. S. Perkin II 1653-1660 (1979), J. C. S. Perkin II 156-162 (1979), Journal of Photopolymer Science and Technology 202-232 (1995), JP-A No. 2000-66385, JP-A No. 2000-80068, and Japanese Unexamined Patent Application Publication (Translation of PCT Application) No. 2004-534797.

From the viewpoint of the sensitivity and the stability over time, the compound represented by the following Formula (a) is more preferably used as the oxime compound used in the invention.

Formula (a)

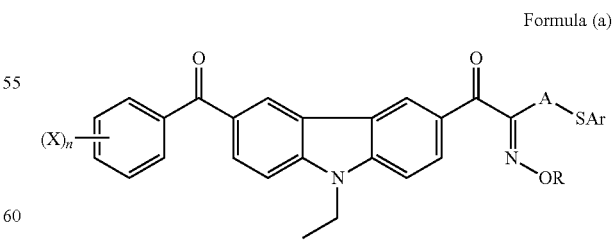

In Formula (a), R and X each independently represent a monovalent substituent; A represents a divalent organic group; Ar represents an aryl group; and n is an integer of 0 to 5. When plural X's are present, the plural X's may be the same as or different from one another.

Preferable examples of the monovalent substituent represented by R in Formula (a) include monovalent non-metal atomic groups mentioned below.

Examples of the monovalent non-metal atomic groups represented by R in Formula (a) include an alkyl group which may have a substituent, an aryl group which may have a substituent, an alkenyl group which may have a substituent, an alkynyl group which may have a substituent, an alkylsulfinyl group which may have a substituent, an arylsulfinyl group which may have a substituent, an alkylsulfonyl group which may have a substituent, an arylsulfonyl group which may have a substituent, an acyl group which may have a substituent, an alkoxycarbonyl group which may have a substituent, an aryloxycarbonyl group which may have a substituent, a phosphinoyl group which may have a substituent, a heterocyclic group which may have a substituent, an alkylthiocarbonyl group which may have a substituent, an arylthiocarbonyl group which may have a substituent, a dialkylamino carbonyl group which may have a substituent, and dialkylamino thiocarbonyl group which may have a substituent.

As the alkyl group which may have a substituent, an alkyl group having 1 to 30 the carbon atoms is preferable, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and 3-nitrophenacyl group.

As the aryl group which may have a substituent, an aryl group having 6 to 30 carbon atoms is preferable, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quarter phenyl group, an o-, m-, or p-tolyl group, a xylyl group, an o-, m-, or p-cumenyl group, a mesityl group, a pentalenyl group, a binaphthalenyl group, ternaphthalenyl group, a quarter naththalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

As the alkenyl group which may have a substituent, an alkenyl group having 2 to 10 carbon atoms is preferable, and examples thereof include a vinyl group, an allyl group, and a styryl group.

As the alkynyl group which may have a substituent, an alkynyl group having 2 to 10 carbon atoms is preferable, and examples thereof include an ethynyl group, a propynyl group, and a propargyl group.

As the alkylsulfinyl group which may have a substituent, an alkylsulfinyl group having 1 to 20 carbon atoms is preferable, and examples thereof include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanolylsulfinyl group, an octadecanolylsulfinyl group, a cyanomethylsulfinyl group, and a methoxymethylsulfinyl group.

As the arylsulfinyl group which may have a substituent, an arylsulfinyl group having 6 to 30 carbon atoms is preferable, and examples thereof include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

As the alkylsulfonyl group which may have a substituent, an alkylsulfonyl group having 1 to 20 carbon atoms is preferable, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanolylsulfonyl group, a dodecanolylsulfonyl group, an octadecanoylsulfonyl group, a cyanomethylsulfonyl group, a methoxymethylsulfonyl group, and a perfluoroalkylsulfonyl group.

As the arylsulfonyl group which may have a substituent, an arylsulfonyl group having 6 to 30 carbon atoms is preferable, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

As the acyl group which may have a substituent, an acyl group having 2 to 20 carbon atoms is preferable, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

As the alkoxycarbonyl group which may have a substituent, an alkoxycarbonyl group having 2 to 20 carbon atoms is preferable, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the phosphinoyl group which may have a substituent, a phosphinoyl group having 2 to 50 total carbon atoms is preferable, and examples thereof include a dimethyl phosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

As the heterocyclic group which may have a substituent, an aromatic or aliphatic heterocycle containing a nitrogen atom, an oxygen atom, a sulfur atom, or a phosphorus atom is preferable, and examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethyl thiocarbonyl group.

Examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

Examples of the dialkylaminocarbonyl group which may have a substituent include a dimethylaminocarbonyl group, a dimethylaminocarbonyl group, a dipropylaminocarbonyl group, and a dibutylaminocarbonyl group.

Examples of the dialkyl aminothiocarbonyl group which may have a substituent include a dimethylaminothiocarbonyl group, a dipropylaminothiocarbonyl group, and a dibutylaminothiocarbonyl group.

Among them, in view of increasing the sensitivity, R in Formula (a) is more preferably an acyl group, and, in particular, an acetyl group, an ethyloyl group, a propioyl group, a benzoyl group, and a toluoyl group are preferable.

Examples of the divalent organic group represented by A in Formula (a) include an alkylene group which has 1 to 12 carbon atoms and may have a substituent, a cyclohexylene group which may have a substituent, and an alkynylene group which may have a substituent.

Examples of substituents that can be introduced into these groups include: a halogen group such as a fluorine atom, a chlorine atom, a bromine atom, or an iodine atom; an alkoxy group such as a methoxy group, an ethoxy group, or a tert-butoxy group; an aryloxy group such as a phenoxy group or a p-tolyloxy group; a alkoxycarbonyl group such as a methoxycarbonyl group, a butoxycarbonyl group or a phenoxycarbonyl group; an acyloxy group such as an acetoxy group, a propionyloxy group, or a benzoyloxy group; an acyl group such as an acetyl group, a benzoyl group, an isobutylyl group, an acryloyl group, a methacryloyl group or methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group, a diethylamino group, a morpholino group, or a piperidino group; an arylamino group such as a phenylamino group or a p-tolylamino group; an alkyl group such as a methyl group, an ethyl group, a tert-butyl group, or a dodecyl group; an aryl group such as a phenyl group, a p-tolyl group, a xylyl group, a cumenyl group, a naphthyl group, a anthryl group or a phenanthryl group; and other groups such as a hydroxyl group, a carboxyl group, a formyl group, a mercapto group, a sulfo group, a mesyl group, a p-toluene sulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, or a triphenylphenacylphosphoniumyl group.

In particular, in view of increasing the sensitivity and suppressing the coloration due to heat-aging, A in Formula (a) is preferably an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group or an allyl group), or an alkylene group substituted with an aryl group (for example, a phenyl group, a p-tolyl group, a xylyl group, a cumenyl group, a naphthyl group, an anthryl group, a phenanthryl group or a styryl group).

The aryl group represented by Ar in Formula (a) is preferably an aryl group having 6 to 30 carbon atoms, and may have a substituent.

Specific examples of the aryl group include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, 9-fluorenyl group, a terphenyl group, a quarter phenyl group, an o-, m-, or p-tolyl group, a xylyl group, an o-, m-, or p-cumenyl group, a mesityl group, a pentalenyl group, a binaphthalenyl group, ternaphthalenyl group, a quarter naththalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. In particular, in view of increasing the sensitivity and suppressing coloration due to heat-aging, a substituted or unsubstituted phenyl group is preferable.

When the phenyl group has a substituent, examples of the substituent include: a halogen group such as a fluorine atom, a chlorine atom, a bromine atom, or an iodine atom; an alkoxy group such as a methoxy group, an ethoxy group, or a tert-butoxy group; an aryloxy group such as a phenoxy group or a p-tolyloxy group; an alkylthioxy group such as a methylthioxy group, an ethylthioxy group, or a tert-butylthioxy group; an arylthioxy group such as a phenylthioxy group or a p-tolylthioxy group; an alkoxycarbonyl group such as a methoxycarbonyl group, a butoxycarbonyl group, or a phenoxycarbonyl group; an acyloxy group such as an acetoxy group, a propionyloxy group, or a benzoyloxy group; an acyl group such as an acetyl group, a benzoyl group, an isobutylyl group, an acryloyl group, a methacryloyl group, or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group or a diethylamino group, a morpholino group, or a piperidino group; an arylamino group such as a phenylamino group or a p-tolylamino group; an alkyl group such as an ethyl group, a tert-butyl group, or a dodecyl group; and a hydroxyl group, a carboxyl group, a formyl group, a mercapto group, a sulfo group, a mesyl group, a p-toluene sulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, and a triphenylphenacylphosphoniumyl group.

In Formula (a), in view of the sensitivity, it is preferable that the structure of "SAr" formed by Ar and S adjacent to the Ar be any one of the structures shown below.

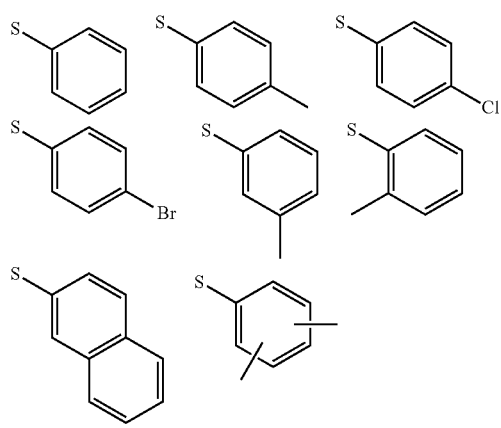

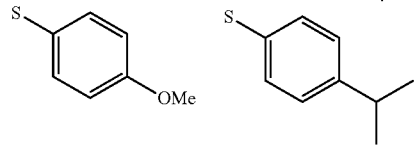

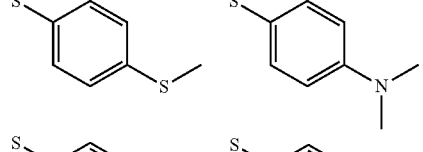

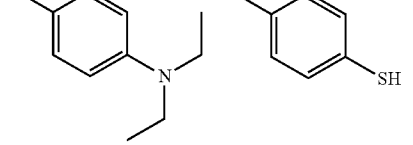

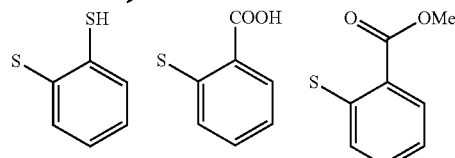

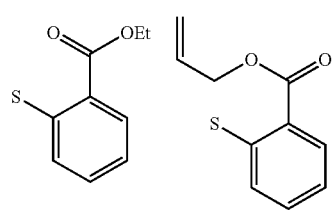

Examples of the monovalent substituent represented by X in Formula (a) include an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, an acyloxy group which may have a substituent, an alkylsulfanyl group which may have a substituent, an arylsulfanyl group which may have a substituent, an alkylsulfinyl group which may have a substituent, an arylsulfinyl group which may have a substituent, an alkylsulfonyl group which may have a substituent, an arylsulfonyl group which may have a substituent, an acyl group which may have a substituent, an alkoxycarbonyl group which may have a substituent, a carbamoyl group which may have a substituent, a sulfamoyl group which may have a substituent, an amino group which may have a substituent, a phosphinoyl group which may have a substituent, a heterocyclic group which may have a substituent, and a halogen group.

As the alkyl group which may have a substituent, an alkyl group having 1 to 30 carbon atoms is preferable, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and 3-nitrophenacyl group.

As the aryl group which may have a substituent, an aryl group having 6 to 30 carbon atoms is preferable, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, 9-fluorenyl group, a terphenyl group, a quarter phenyl group, an o-, m-, or p-tolyl group, a xylyl group, an o-, m-, or p-cumenyl group, a mesityl group, a pentalenyl group, a binaphthalenyl group, a ternaphthalenyl group, a quarter naththalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

As the alkenyl group which may have a substituent, an alkenyl group having 2 to 10 carbon atoms is preferable, and examples thereof include a vinyl group, an allyl group, and a styryl group.

As the alkynyl group which may have a substituent, an alkynyl group having 2 to 10 carbon atoms is preferable, and examples thereof include an ethynyl group, a propynyl group, and a propargyl group.

As the alkoxy group which may have a substituent, an alkoxy group having 1 to 30 carbon atoms is preferable, and examples thereof include a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, an ethylhexyloxycarbonyl methyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, and a cyanomethyloxy group.

As the aryloxy group which may have a substituent, an aryloxy group having 6 to 30 carbon atoms is preferable, and examples thereof include a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxy phenyloxy group, a 4-dimethylaminophenyloxy group, a 4-methylsulfanylphenyloxy group, and a 4-phenylsulfanylphenyloxy group.

As the alkylthioxy group which may have a substituent, a thioalkoxy group having 1 to 30 carbon atoms is preferable, and examples thereof include a methylthioxy group, an ethylthioxy group, a propylthioxy group, an isopropylthioxy group, a butylthioxy group, an isobutylthioxy group, a sec-butylthioxy group, a tert-butylthioxy group, a pentylthioxy group, an isopentylthioxy group, a hexylthioxy group, a heptylthioxy group, an octylthioxy group, a 2-ethylhexylthioxy group, a decylthioxy group, a dodecylthioxy group, an octadecylthioxy group, and a benzylthioxy group.

As the arylthioxy group which may have a substituent, an arylthioxy group having 6 to 30 carbon atoms is preferable, and examples thereof include a phenylthioxy group, a 1-naphthylthioxy group, a 2-naphthylthioxy group, a 2-chlorophenylthioxy group, a 2-methylphenylthioxy group, a 2-methoxyphenylthioxy group, a 2-butoxyphenylthioxy group, a 3-chlorophenylthioxy group, a 3-trifluoromethylphenylthioxy group, a 3-cyanophenylthioxy group, a 3-nitrophenylthioxy group, a 4-fluorophenylthioxy group, a 4-cyanophenylthioxy group, a 4-methoxyphenylthioxy group, a 4-dimethylaminophenylthioxy group, a 4-methylsulfanylphenylthioxy group, and a 4-phenylsulfanylphenylthioxy group.

As the acyloxy group which may have a substituent, an acyloxy group having 2 to 20 carbon atoms is preferable, and examples thereof include an acetyloxy group, a propanoyloxy group, a butanoyloxy group, a pentanoyloxy group, a trifluoromethylcarbonyloxy group, a benzoyloxy group, a 1-naphthylcarbonyloxy group, and a 2-naphthylcarbonyloxy group.

As the alkylsulfanyl group which may have a substituent, an alkylsulfanyl group having 1 to 20 carbon atoms is preferable, and examples thereof include a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, and a methoxymethylsulfanyl group.

As the arylsulfanyl group which may have a substituent, an arylsulfanyl group having 6 to 30 carbon atoms is preferable, and examples thereof include a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethyl phenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, and a 4-dimethylaminophenylsulfanyl group.

As the alkylsulfinyl group which may have a substituent, an alkylsulfinyl group having 1 to 20 carbon atoms is preferable, and examples thereof include a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanolylsulfinyl group, an octadecanolylsulfinyl group, a cyanomethylsulfinyl group, and a methoxymethylsulfinyl group.

As the arylsulfinyl group which may have a substituent, an arylsulfinyl group having 6 to 30 carbon atoms is preferable, and examples thereof include a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, and a 4-dimethylaminophenylsulfinyl group.

As the alkylsulfonyl group which may have a substituent, an alkylsulfonyl group having 1 to 20 carbon atoms is preferable, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanolylsulfonyl group, a dodecanolylsulfonyl group, an octadecanoylsulfonyl group, a cyanomethylsulfonyl group, and a methoxymethylsulfonyl group.

As the arylsulfonyl group which may have a substituent, an arylsulfonyl group having 6 to 30 carbon atoms is preferable, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

As the acyl group which may have a substituent, an acyl group having 2 to 20 carbon atoms is preferable, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

As the alkoxycarbonyl group which may have a substituent, an alkoxycarbonyl group having 2 to 20 carbon atoms is preferable, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a phenoxycarbonyl group, a trifluoromethyloxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and 4-methoxyphenyloxycarbonyl group.

As the carbamoyl group which may have a substituent, a carbamoyl group having 1 to 30 total carbon atoms is preferable, and examples thereof include an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, and an N,N-diphenylcarbamoyl group.

As the sulfamoyl group which may have a substituent, a sulfamoyl group having 0 to 30 total carbon atoms is preferable, and examples thereof include a sulfamoyl group, an N-alkylsulfamoyl group, an N-arylsulfamoyl group, an N,N-dialkylsulfamoyl group, an N,N-diarylsulfamoyl group, and an N-alkyl-N-arylsulfamoyl group. Specific examples thereof include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, and an N,N-diphenylsulfamoyl group.

As the amino group which may have a substituent, an amino group having 0 to 50 total carbon atoms is preferable, and examples thereof include —$NH_2$, an N-alkylamino group, an N-arylamino group, an N-acylamino group, an N-sulfonylamino group, N,N-dialkylamino group, an N,N-diarylamino group, an N-alkyl-N-arylamino group, and an N,N-disulfonylamino group. More specifically, examples thereof include an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, and a carbazole group.

As the phosphinoyl group which may have a substituent, a phosphinoyl group having 2 to 50 total carbon atoms is preferable, and examples of the phosphinoyl groups include a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, and a bis(2,4,6-trimethylphenyl)phosphinoyl group.

As the heterocyclic group which may have a substituent, an aromatic or aliphatic heterocycle containing a nitrogen atom, an oxygen atom, a sulfur atom, or a phosphorus atom is preferable, and examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purynyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Examples of the halogen groups include a fluorine atom, a chlorine atom, a bromine atom, and an iodine atom.

The alkyl group which may have a substituent, the aryl group which may have a substituent, the alkenyl group which may have a substituent, the alkynyl group which may have a substituent, the alkoxy group which may have a substituent, the aryloxy group which may have a substituent, the alkylthioxy group which may have a substituent, the arylthioxy group which may have a substituent, the acyloxy group which may have a substituent, the alkylsulfanyl group which may have a substituent, the arylsulfanyl group which may have a substituent, the alkylsulfinyl group which may have a substituent, the arylsulfinyl group which may have a substituent, the alkylsulfonyl group which may have a substituent, the arylsulfonyl group which may have a substituent, the acyl group which may have a substituent, the alkoxycarbonyl group which may have a substituent, a carbamoyl group which may have a substituent, the sulfamoyl group which may have a substituent, the amino group which may have a substituent, and the heterocyclic group which may have a substituent, which are describe in the above, may further have other substituents.

Examples of such other substituents include: a halogen group such as a fluorine atom, a chlorine atom, a bromine atom, or an iodine atom; an alkoxy group such as a methoxy group, an ethoxy group, or a tert-butoxy group; an aryloxy group such as a phenoxy group or a p-tolyloxy group; a alkoxycarbonyl group such as a methoxycarbonyl group, a butoxycarbonyl group, or a phenoxycarbonyl group; an acyloxy group such as an acetoxy group, a propionyloxy group, or a benzoyloxy group; an acyl group such as an acetyl group, a benzoyl group, an isobutylyl group, an acryloyl group, a methacryloyl group or a methoxalyl group; an alkylsulfanyl group such as a methylsulfanyl group or a tert-butylsulfanyl group; an arylsulfanyl group such as a phenylsulfanyl group or a p-tolylsulfanyl group; an alkylamino group such as a methylamino group or a cyclohexylamino group; a dialkylamino group such as a dimethylamino group or a diethylamino group, a morpholino group, or a piperidino group; an arylamino group such as a phenylamino group or a p-tolylamino group; an alkyl group such as a methyl group, an ethyl group, a tert-butyl group, or a dodecyl group; an aryl group such as a phenyl group, a p-tolyl group, a xylyl group, a cumenyl group, a naphthyl group, an anthryl group or a phenanthryl group; and a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, and a triphenylphenacylphosphoniumyl group.

Among these, from the viewpoints of increasing solubility in a solvent and increasing absorption efficiency in a long wavelength region, X in Formula (a) is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, or an amino group which may have a substituent.

In Formula (a), n represents an integer of 0 to 5, and more preferably an integer of 0 to 2.

Examples of oxime compounds represented by Formula (a) are shown below, but the invention is not limited to these examples.

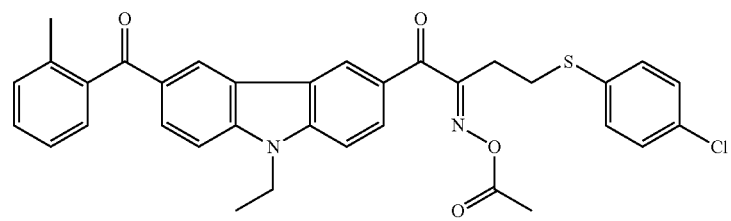

-continued
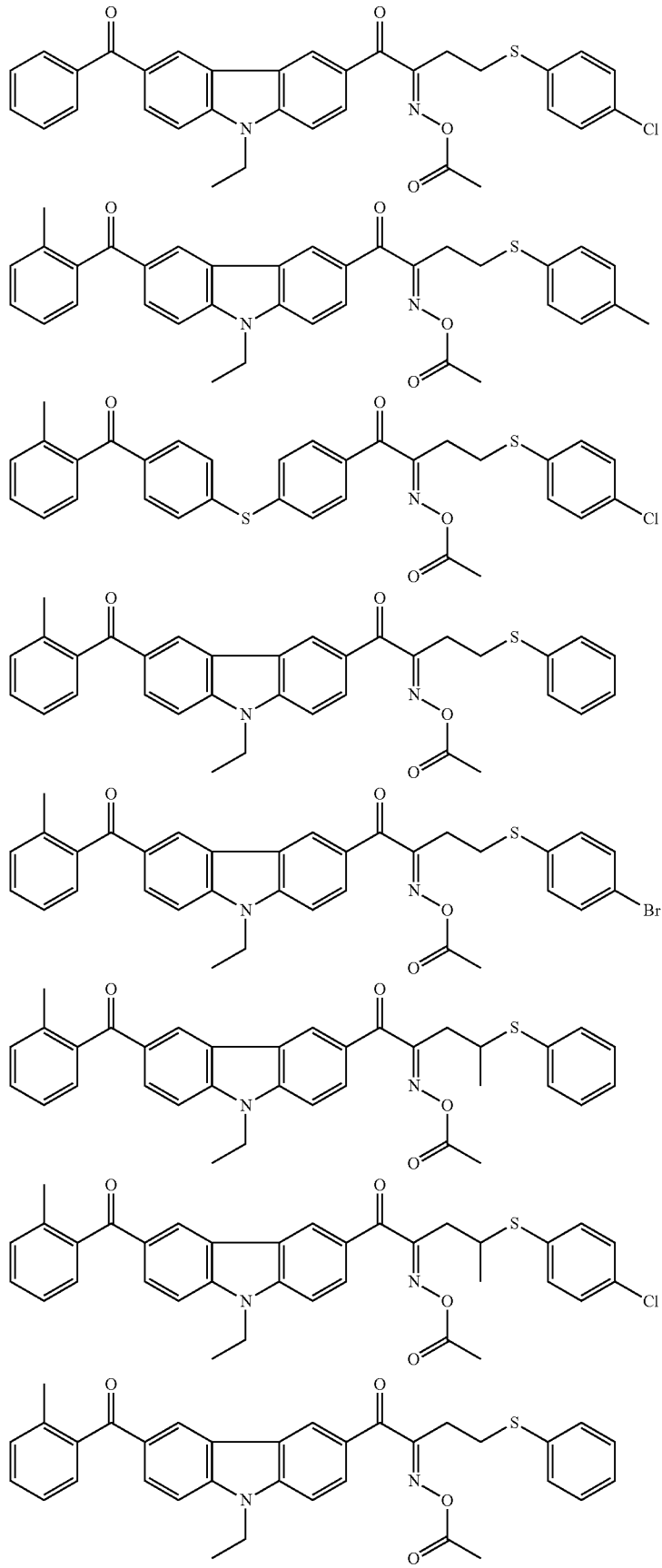

-continued
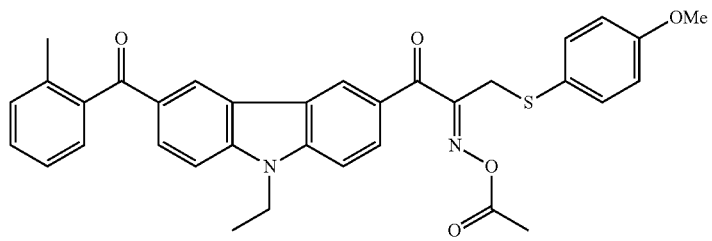
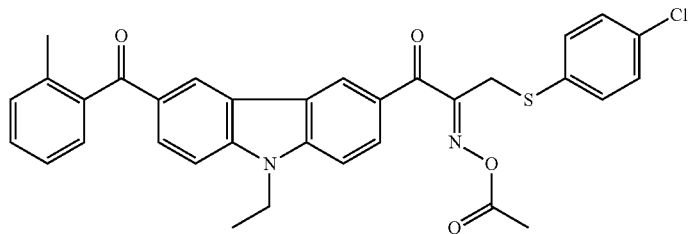
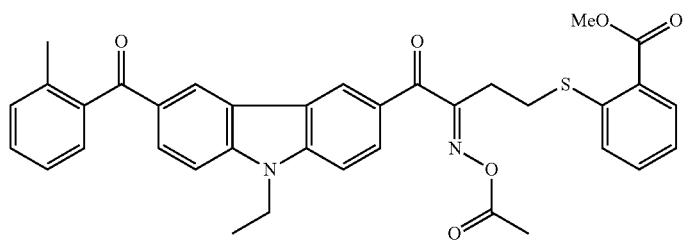
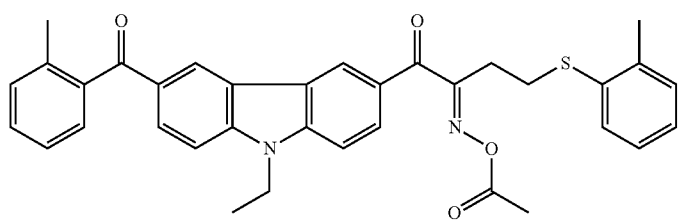
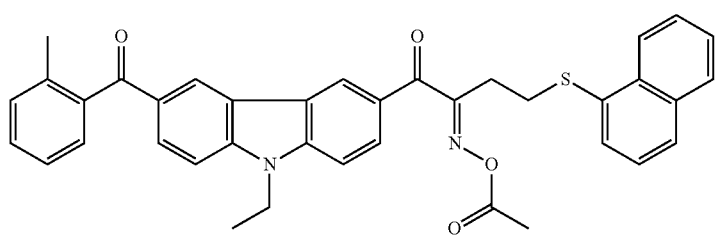
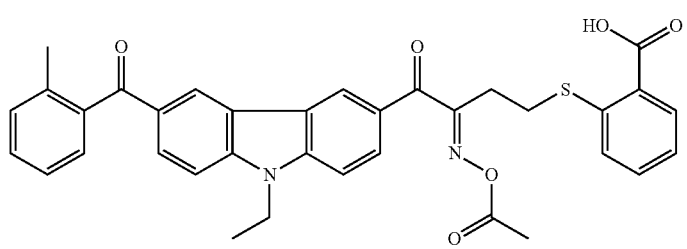
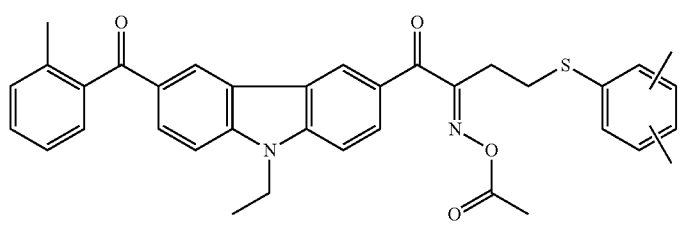

-continued
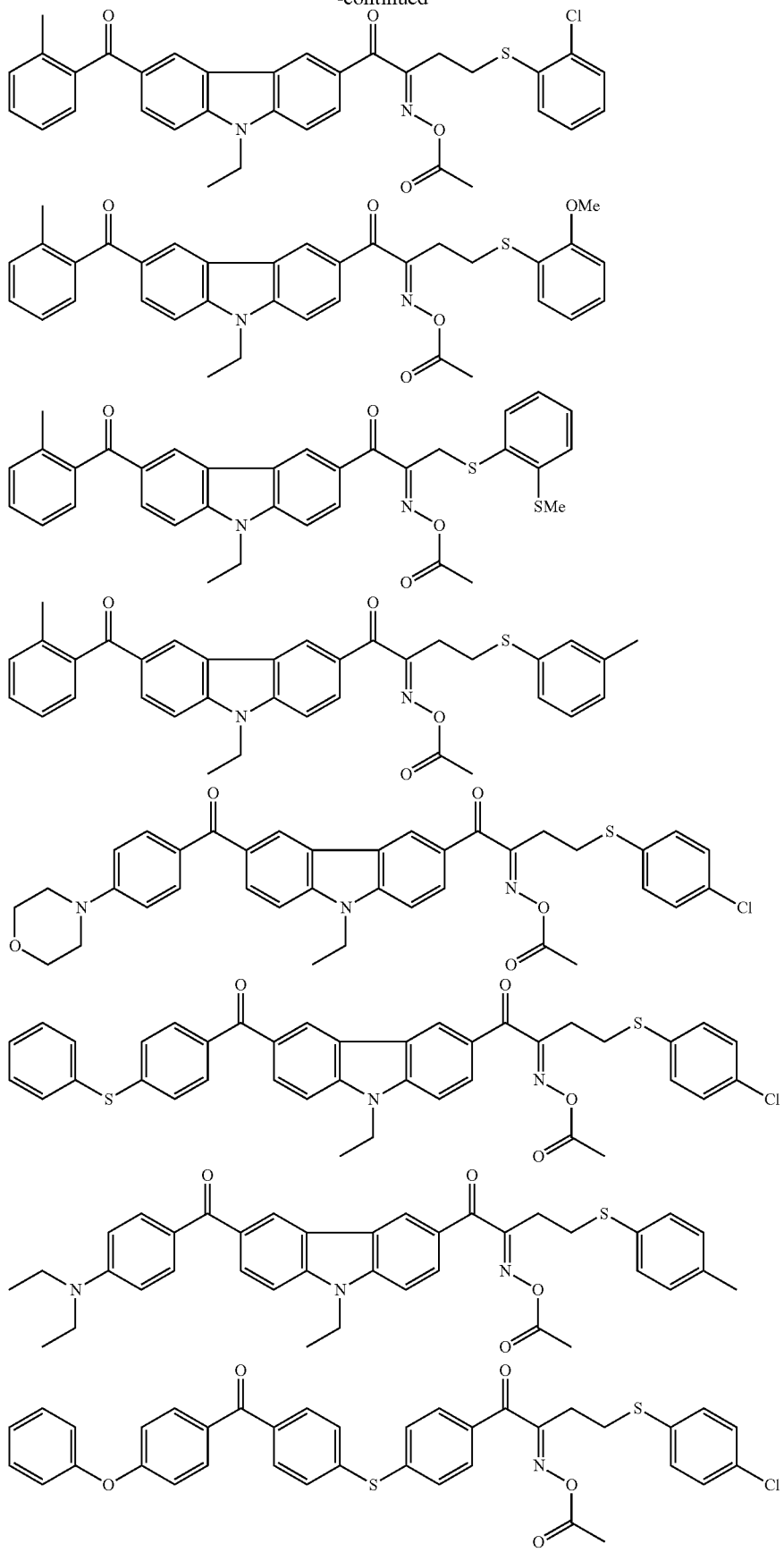

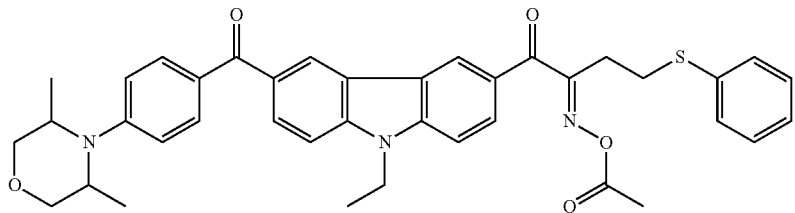
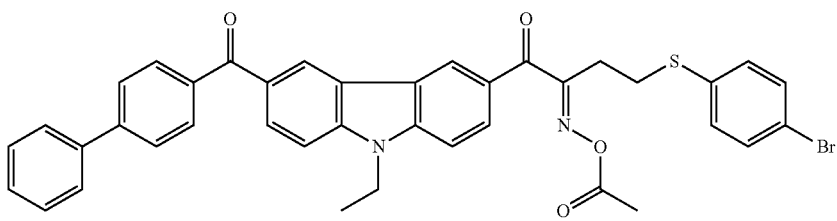
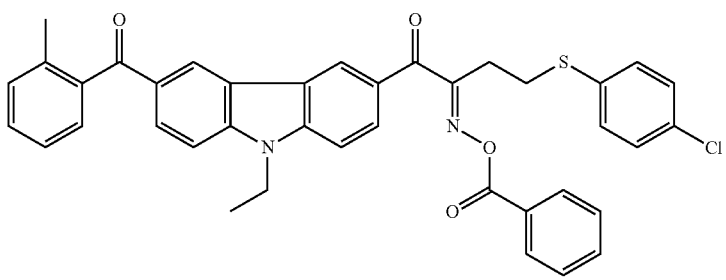
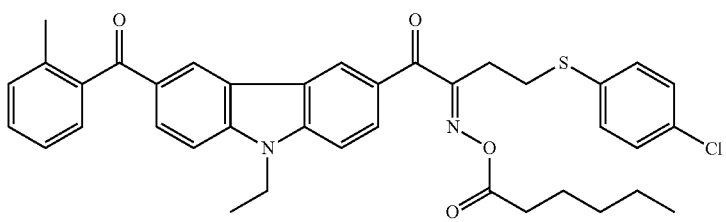
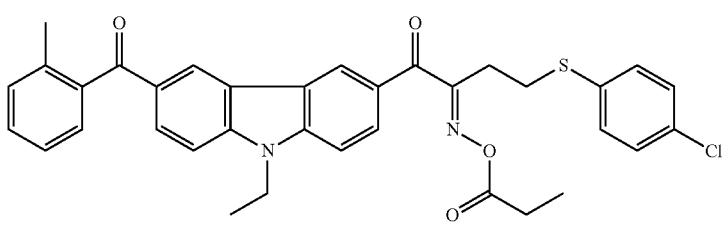
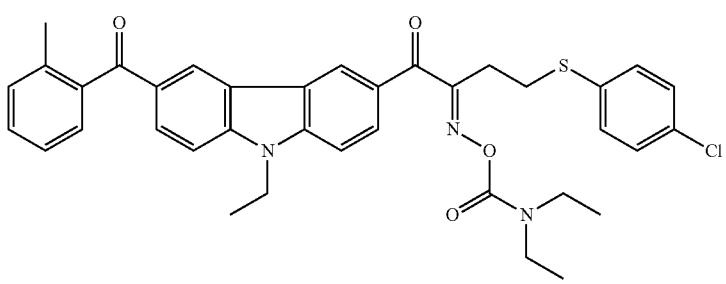

-continued
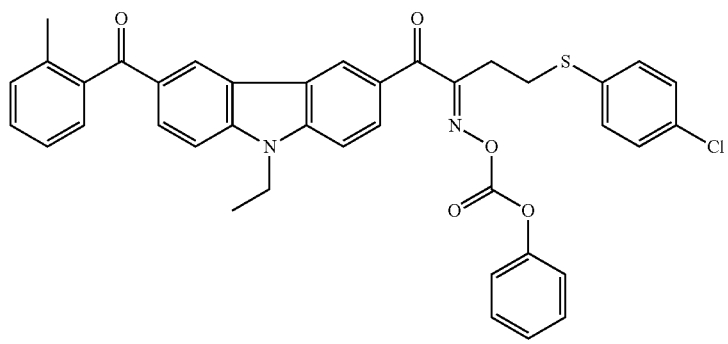
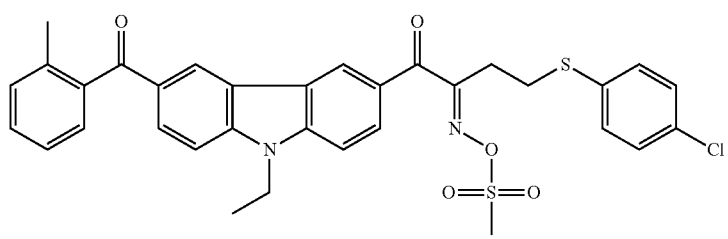
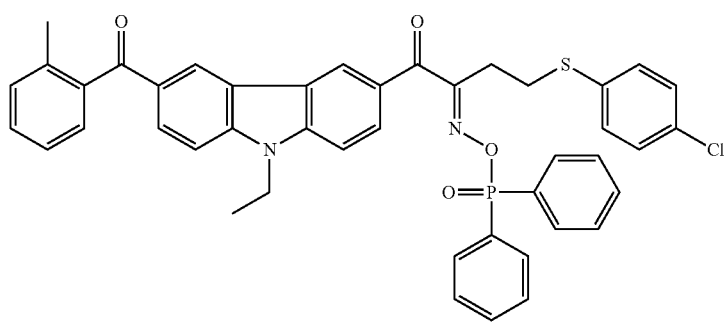
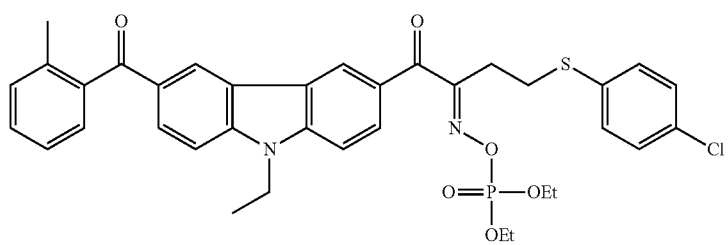
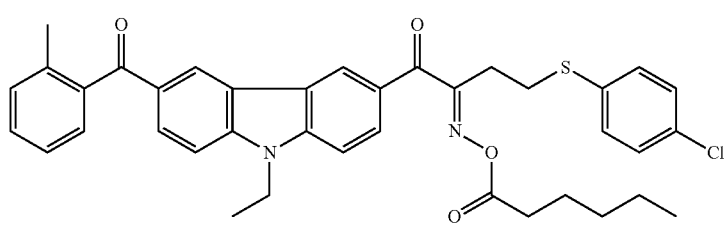
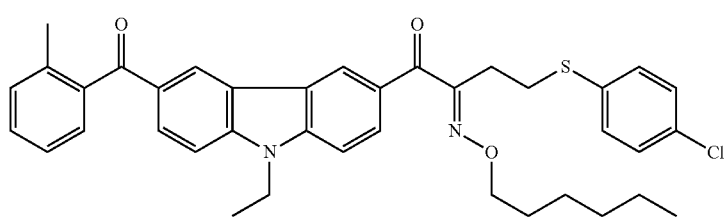

-continued
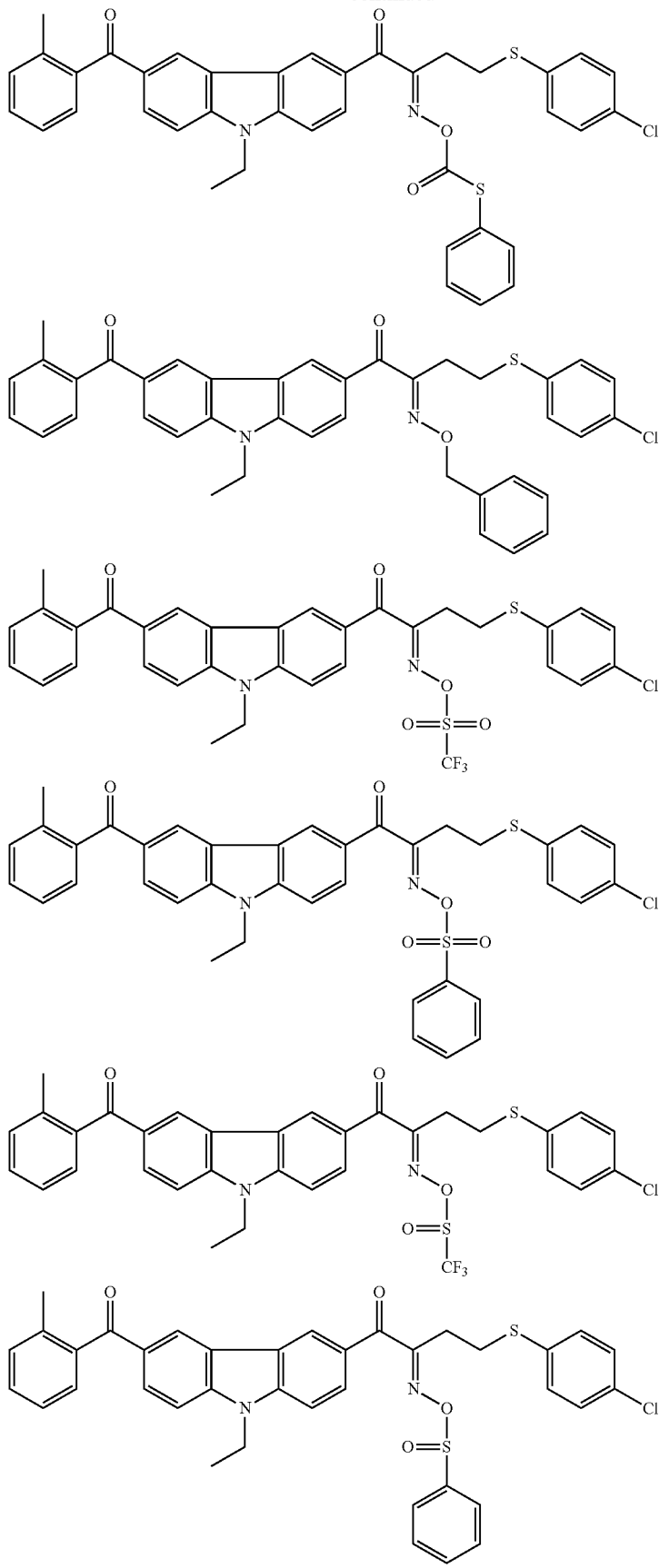

-continued
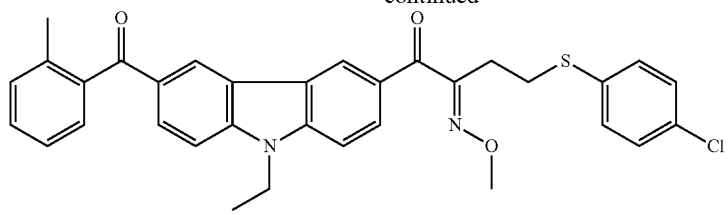
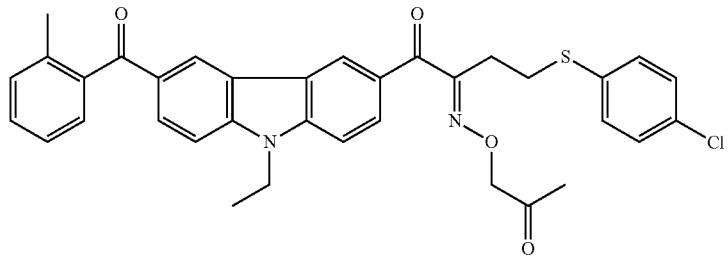
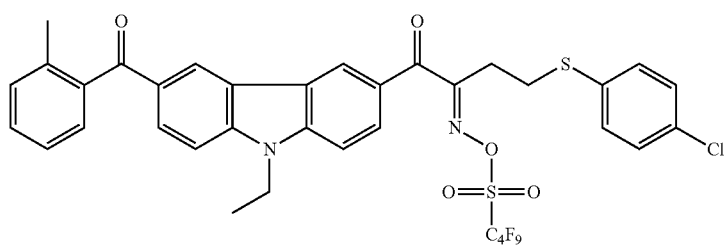
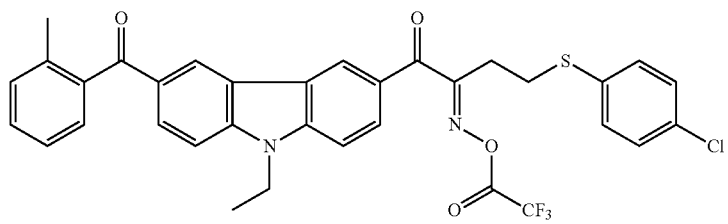
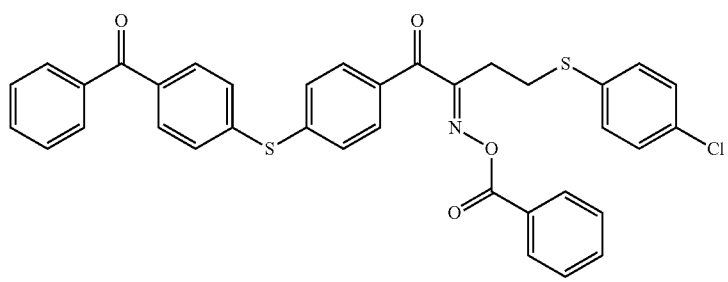
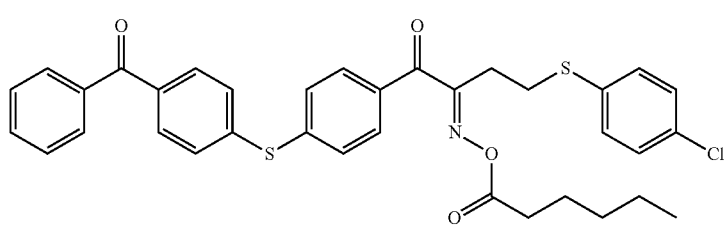
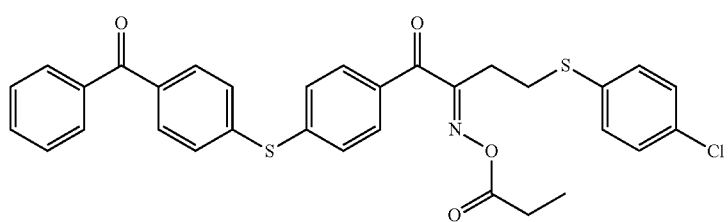

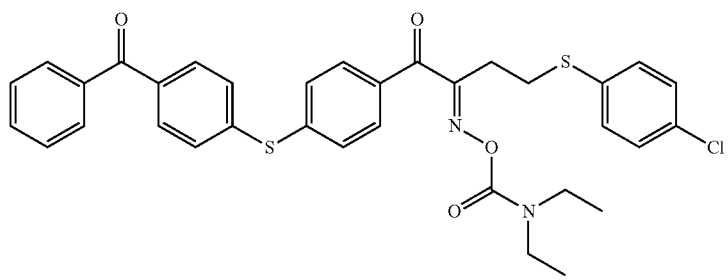
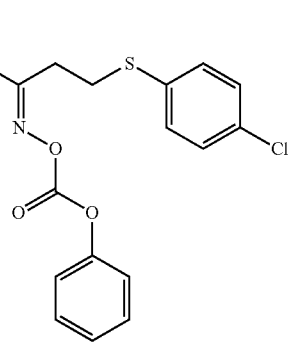
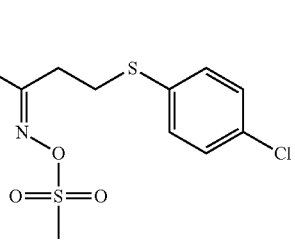
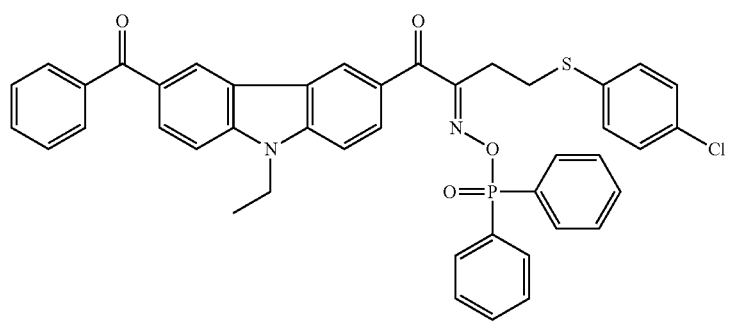
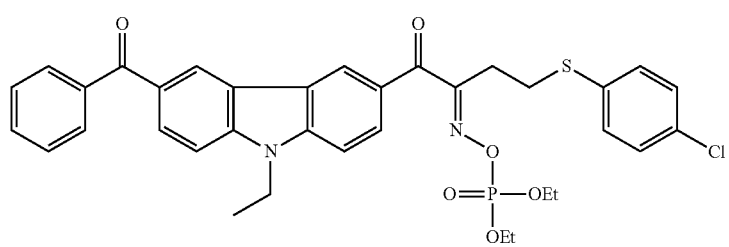
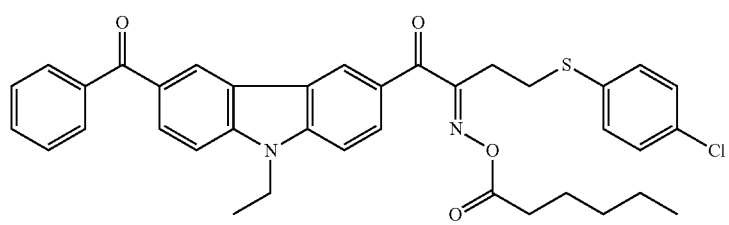

-continued
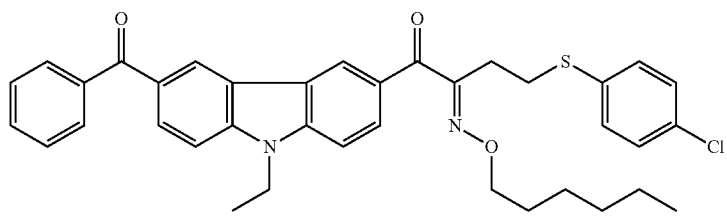
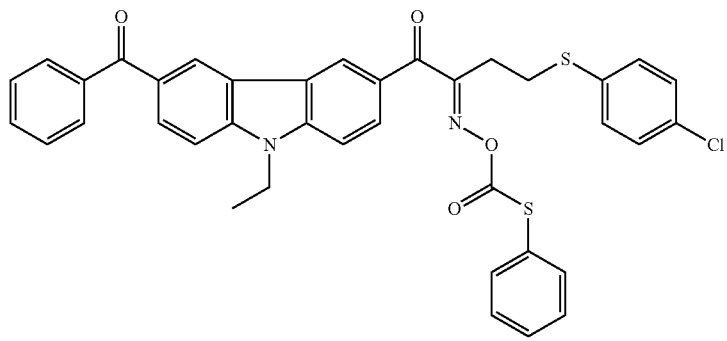
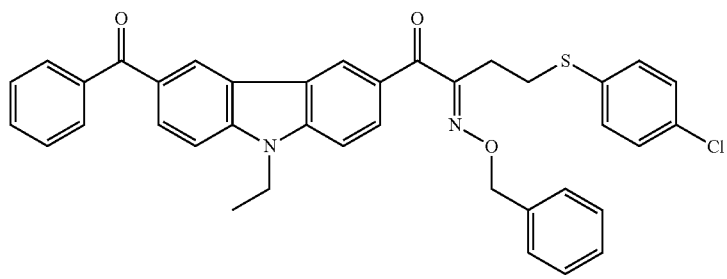
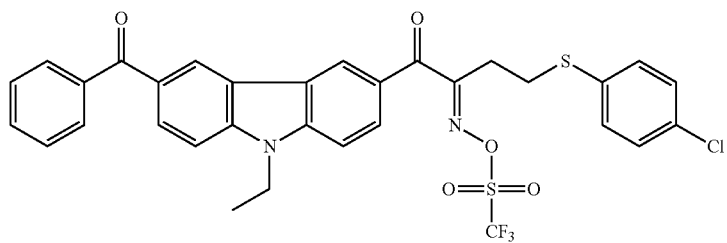
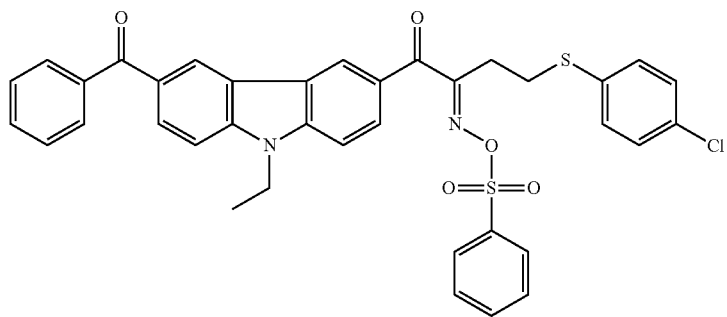
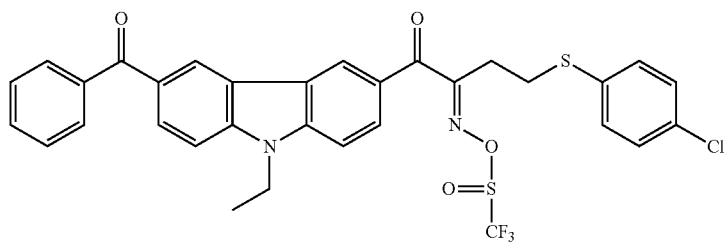

-continued

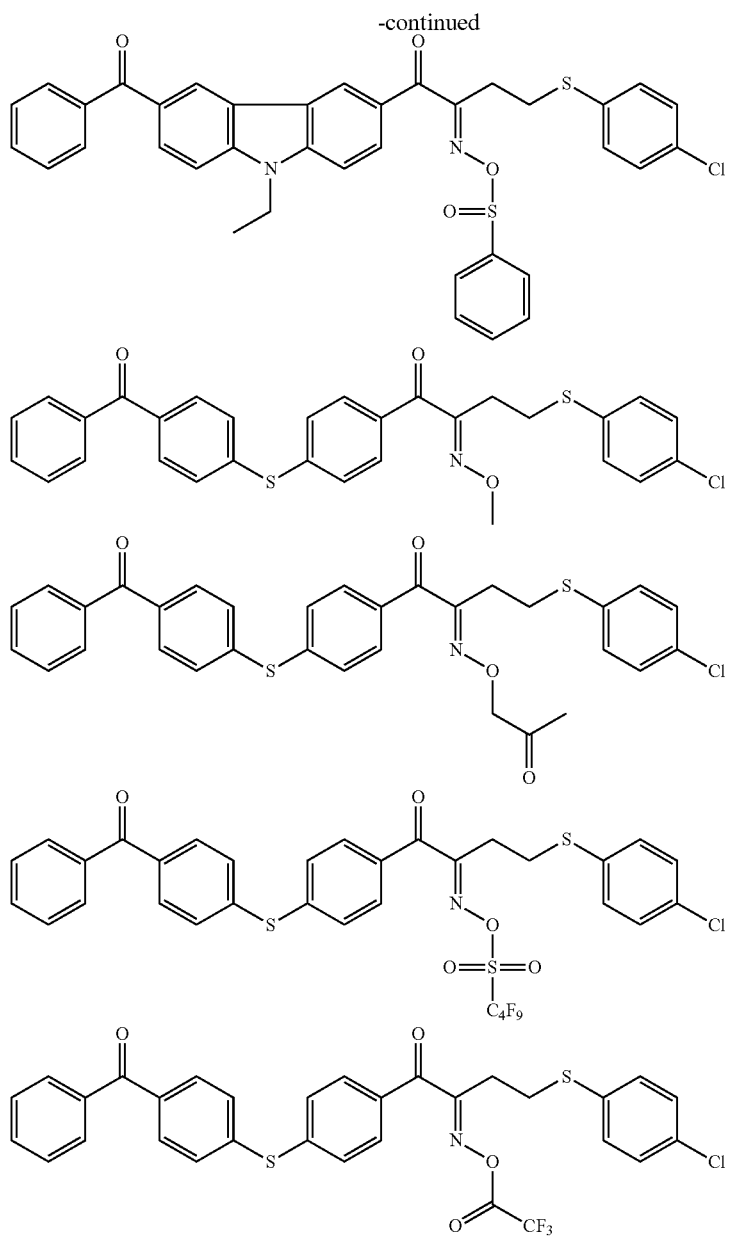

The oxime compound represented by Formula (a) decompose by the action of light and functions as a photopolymerization initiator that initiates and/or promotes the polymerization of a photopolymerizable compound. The oxime compound has an excellent sensitivity to the light from a light source of from 365 nm or 405 nm.

Examples of the onium salt compound include diazonium salts as disclosed in S. I. Schlesinger, Photogr. Sci. Eng., 18, 387 (1974), and T. S. Bal et al, Polymer, 21, 423 (1980), ammonium salts as disclosed in U.S. Pat. No. 4,069,055, JP-A No. 4-365049, or the like, phosphonium salts as disclosed in U.S. Pat. No. 4,069,055 or U.S. Pat. No. 4,069,056, and iodonium salts as disclosed in European Patent No. 104, 143, JP-A No. 2-150848, and JP-A No. 2-296514.

The iodonium salt that can be suitably used in the invention is a diaryl iodonium salt, and, from the viewpoint of stability, it is preferable that the iodonium salt be substituted by two or more electron donating groups such as an alkyl group, an alkoxy group or an aryloxy group.

Examples of the sulfonium salt that can be suitably used in the invention include sulfonium salts as disclosed in European Patent Nos. 370,693, 390,214, 233,567, 297,443, and 297,442, U.S. Pat. Nos. 4,933,377, 4,760,013, 4,734,444, and 2,833,827, German Patent Nos. 2,904,626, 3,604,580, and 3,604,581, the sulfonium salts preferably being substituted with an electron attractive group from the viewpoints of stability and sensitivity. The Hammett value of the electron attractive group is preferable larger than zero. Preferable examples of the electron attractive group include a halogen atom and a carboxylic acid.

Other preferable examples of the sulfonium salt include a sulfonium salt in which one of the substituents of a triaryl sulfonium salt has a coumarin structure or an anthraquinone structure, the sulfonium salt having an absorption at 300 nm or more. Still other preferable examples of the sulfonium salt include a sulfonium salt, in which a triaryl sulfonium has an aryloxy group or an arylthio group as a substituent, the sulfonium salt having an absorption at 300 nm or more.

Examples of the onium salt include a selenonium salt as disclosed in J. V. Crivello et al. Macromolecules, 10(6), 1307 (1977) or J. V. Crivello et al, J. Polymer Sci., Polymer Chem. Ed., 17, 1047 (1979), and an arsonium salt as disclosed in C. S. Wen, et al. Teh, Proc. Conf. Rad. Curing ASIA, p. 478, Tokyo, October (1988).

Examples of the acyl phosphine(oxide) compound include IRGACURE 819, DAROCURE 4265 and DAROCURE TPO, which are manufactured by Ciba Specialty Chemicals Corporation.

From the viewpoint of the exposure sensitivity, (E) the polymerization initiator used in the polymerizable composition of the invention is preferably a compound selected from the group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallylimidazole dimer, an onium compound, a benzothiazole compound, a benzophenone compound, an acetophenone compound and the derivatives thereof, a cyclopentadiene-benzene-iron complex and the salt thereof, a halomethyl oxadiazole compound, and a 3-aryl-substituted coumarin compound.

A trihalomethyl triazine compound, an α-aminoketone compound, an acyl phosphine compound, a phosphine oxide compound, an oxime compound, a triallyl imidazole dimer, an onium compound, a benzophenone compound, and an acetophenone compound are more preferable, and at least one compound selected from the group consisting of a trihalomethyl triazine compound, an α-aminoketone compound, an oxime compound, a triallyl imidazole dimer, and a benzophenone compound is most preferable.

In particular, when the polymerizable composition of the invention is used for manufacturing a color filter of a solid-state image pick-up element, it is important that the polymerizable composition be curable and developable without residues in an unexposed region since minute pixels are required to be formed in a sharp form. From this point of view, an oxime compound is especially preferable. In particular, when minute pixels are formed in a solid-state image pick-up element, a stepper exposure is used for the exposure for curing, but, in some cases, the exposing machine for the exposure is damaged by the action of halogen; therefore, the amount of the polymerization initiator to be added is required to be low. In consideration of these points, it is most preferable to use an oxime compound as (E) the polymerization initiator to form a minute color pattern such as the solid-state image pick-up element.

The amount of (E) the polymerization initiator contained in the polymerizable composition of the invention is preferably from 0.1% by mass to 50% by mass, more preferably from 0.5% by mass to 30% by mass, and still more preferably from 1% by mass to 20% by mass, with respect to the total solid content in the polymerizable composition. When the amount falls within these ranges, good sensitivity and pattern formability can be obtained.

The content of titanium black is preferably from 0.1% by mass to 60% by mass, more preferably from 1% by mass to 40% by mass, and still more preferably from 5% by mass to 30% by mass, with respect to the total solid content in the polymerizable composition, from the viewpoints of exhibiting a required light-shielding property and imparting the developability.

The polymerizable composition of the invention may further contain an optional component if needed, as described in detail below. Hereinafter, the optional component, which may be contained in the polymerizable composition, is explained.

Sensitizer

The polymerizable composition of the invention may contain a sensitizer for the purpose of improving radical generation efficiency of a radical initiator, and shifting the sensitive wavelength to a longer wavelength.

The sensitizer that can be used in the invention is preferably a sensitizer capable of sensitizing (E) the polymerization initiator by the electron transfer mechanism or the energy transfer mechanism.

Examples of the sensitizer include sensitizers that are classified into the following compound groups and have an absorption wavelength in the range of from 300 nm to 450 nm.

Examples of the sensitizers include polynuclear aromatic groups (for example, phenanthrene, anthracene, pyrene, perylene, triphenylene, and 9,10-dialkoxy anthracene), xanthenes (for example, fluorescein, eosin, erythrosine, Rhodamine B, and rose bengal), thioxanthones (isopropylthioxanthone, diethylthioxanthone, and chlorothioxanthone), cyanines (for example, thiacarbocyanine, and oxacarbocyanine), merocyanines (for example, merocyanine, and carbomerocyanine), phthalocyanines, thiazines (for example, thionine, Methylene Blue, Toluidine Blue), acridines (for example, acridine orange, chloroflavin, and acriflavine), anthraquinones (for example, anthraquinone), squaryliums (for example, squarylium), acridine orange, coumarins (for example, 7-diethylamino-4-methylcoumarin), ketocoumarin, phenothiazines, phenazines, styryl benzenes, azo compounds, diphenylmethane, triphenylmethane, distyryl benzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone or Michler's ketone, and heterocyclic compounds such as N-aryloxazolidinone.

More preferable examples of the sensitizer that can be used in the invention include compounds represented by following Formulae (e-1) to (e-4).

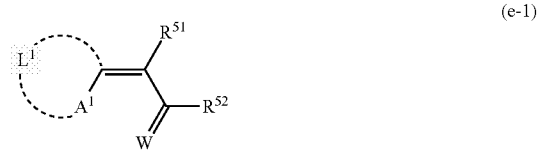

(e-1)

In Formula (e-1), $A^1$ represents a sulfur atom or $NR^{50}$, wherein $R^{50}$ represents an alkyl group or an aryl group; $L^1$ represents a non-metal atomic group that forms a basic nucleus of the dye, together with $A^1$ and carbon atoms which are adjacent to $L^1$; $R^{51}$ and $R^{52}$ each independently represent a hydrogen atom or a monovalent non-metal atomic group, and $R^{51}$ and $R^{52}$ may be combined with each other to form an acidic nucleus of the dye. W represents an oxygen atom or a sulfur atom.

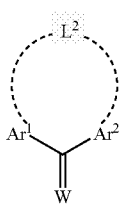

(e-2)

In Formula (e-2), $Ar^1$ and $Ar^2$ each independently represent an aryl group, and $Ar^1$ and $Ar^2$ are linked with each other with the bond -$L^2$- therebetween. Here, -$L^2$- represents —O— or —S—. Further, W has the same definition as that of W in Formula (e-1).

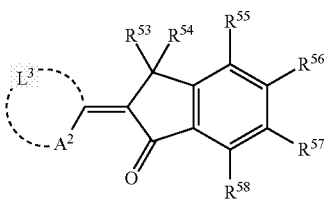

(e-3)

In Formula (e-3), $A^2$ represents a sulfur atom or $NR^{59}$; $L^3$ represents a non-metal atomic group that forms a basic nucleus of the dye together with $A^2$ and carbon atoms; $R^{53}$, $R^{54}$, $R^{55}$, $R^{56}$, $R^{57}$, and $R^{58}$ each independently represent a monovalent non-metal atomic group; and $R^{59}$ represents an alkyl group or an aryl group.

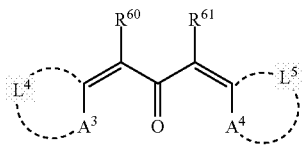

(e-4)

In Formula (e-4), $A^3$ and $A^4$ each independently represent —S— or —$NR^{62}$, wherein $R^{62}$ represents a substituted or unsubstituted alkyl group, or a substituted or unsubstituted aryl group; $L^4$ represents a non-metal atomic group that forms a basic nucleus of the dye together with $A^3$ and carbon atoms, which are adjacent to $L^4$; $L^5$ represents a non-metal atomic group that forms a basic nucleus of the dye together with A4 and carbon atoms, which are adjacent to $L^5$; $R^{60}$ and $R^{61}$ each independently represent a monovalent non-metal atomic group, or may bond with each other to form an aliphatic or aromatic ring.

From the viewpoint of light absorption efficiency to the deep portion and the decomposition efficiency of an initiator, the content of the sensitizer in the polymerizable composition is preferably from 0.1% by mass to 20% by mass, and more preferably from 0.5% by mass to 15% by mass, in terms of solid content.

Any one of the sensitizers may be used singly, or a combination of two or more thereof may be used.

In addition to the above sensitizers, examples of preferable sensitizers that may be contained in the polymerizable composition include at least one compound selected from the compounds represented by following Formula (II) and the compounds represented by Formula (III).

Any of these compounds may be used singly, or a combination of two or more thereof may be used.

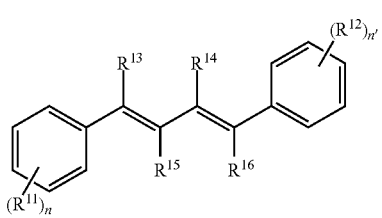

(II)

In Formula (II), $R^{11}$ and $R^{12}$ each independently represent a monovalent substituent; $R^{13}$, $R^{14}$, $R^{15}$, and $R^{16}$ each independently represent a hydrogen atom or a monovalent substituent; and n represents an integer of from 0 to 5, and n represents an integer of from 0 to 5, but both n and n' are not 0 at the same time. When n is two or more, plural $R^{11}$'s may be the same as or different from one another. When n' is two or more, plural $R^{12}$'s may be the same as or different from one another. The Formula (II) is not limited to one of the isomers thereof based on the double bonds.

The molar extinction coefficient c of the compound represented by Formula (II) is preferably 500 $mol^{-1} \cdot L \cdot cm^{-1}$ at a wavelength of 365 nm, more preferably 3,000 $mol^{-1} \cdot L \cdot cm^{-1}$ at a wavelength of 365 nm, and most preferably 20,000 $mol^{-1} \cdot L \cdot cm^{-1}$ at a wavelength of 365 nm. It is preferable that the value of the molar extinction coefficient c at each wavelength be within the above range, from the viewpoint of the light absorption efficiency since the effect of increasing the sensitivity is high.

Preferable examples of the compounds represented by Formula (II) are shown below, but the invention is not limited to these compounds.

In this specification, chemical formulae may be described by simplified structural formulae, and, in such cases, solid lines or the like represent hydrocarbon groups, unless elements or substituents are otherwise specified.

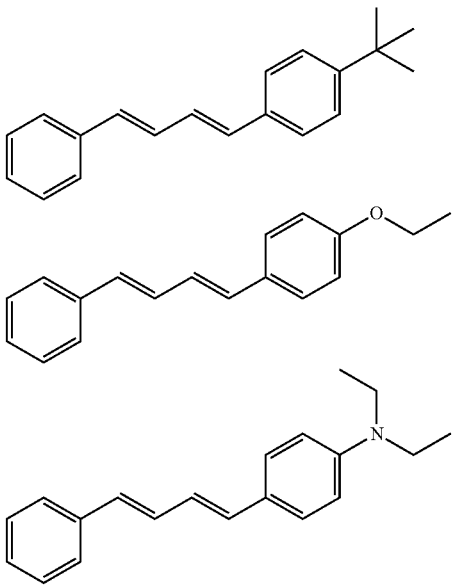

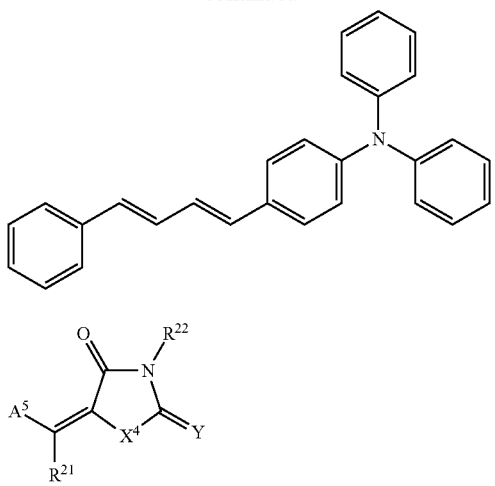

(III)

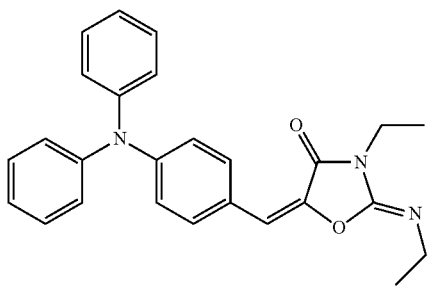

In Formula (III), $A^5$ represents an aromatic ring or hetero ring which may have a substituent; $X^4$ represents an oxygen atom, a sulfur atom, or —N($R^{23}$)—; and Y represents an oxygen atom, a sulfur atom, or —N($R^{23}$)—. $R^{21}$, $R^{22}$, and $R^{23}$ each independently represent a hydrogen atom or a monovalent non-metal atomic group, and $A^5$, $R^{21}$, $R^{22}$, and $R^{23}$ may be bonded with one another to form an aliphatic or aromatic ring.

In Formula (III), $R^{21}$, $R^{22}$, and $R^{23}$ each independently represent a hydrogen atom or a monovalent non-metal atomic group. When $R^{21}$, $R^{22}$, and $R^{23}$ each represent a monovalent non-metal atomic group, $R^{21}$, $R^{22}$, and $R^{23}$ each are preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxyl group, or a halogen atom.

In a compound represented by Formula (III), Y is preferably an oxygen atom or —N($R^{23}$)—, from the viewpoint of improving the decomposition efficiency of the photopolymerization initiator. $R^{23}$ represents a hydrogen atom or a monovalent non-metal atomic group. Further, Y is most preferably —N($R^{23}$)—.

Preferable examples of the compounds represented by Formula (III) are shown below, but the invention is not limited to these compounds. The isomers based on the double bond that connects the acidic nucleus and the basic nucleus are not specified, and the invention is not limited to either one of the isomers.

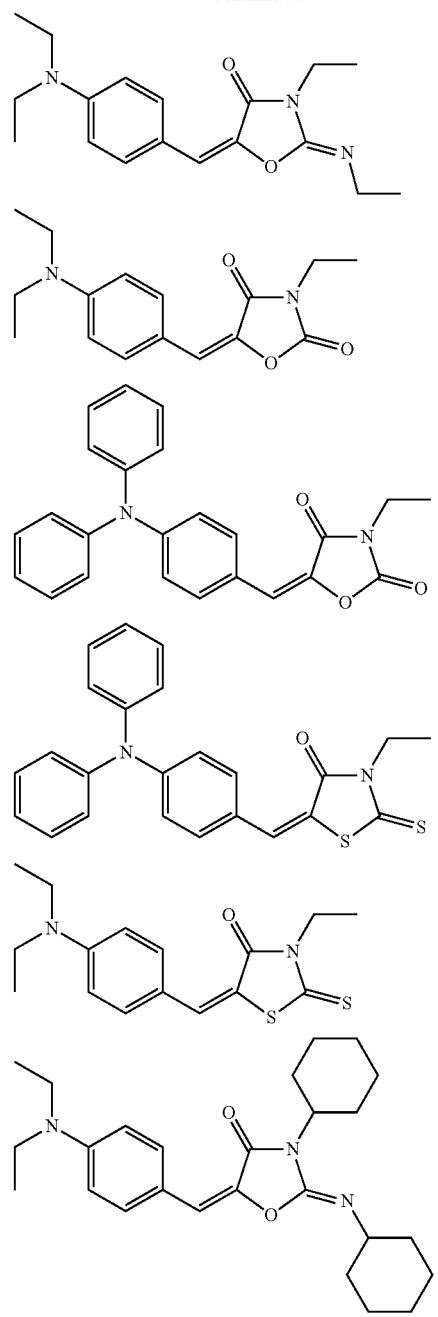

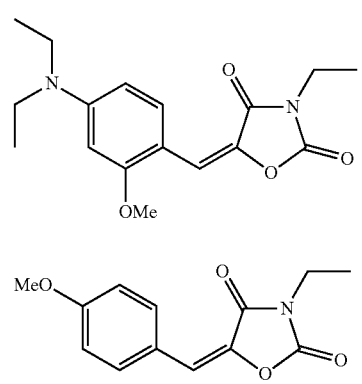

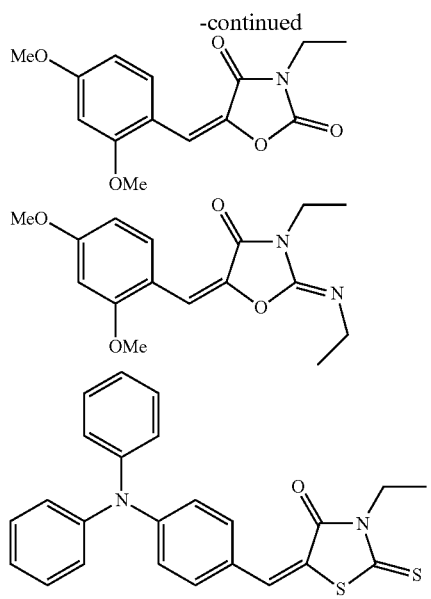

Co-Sensitizer

It is preferable that the polymerizable composition of the invention further contain a co-sensitizer.

In the invention, the co-sensitizer has the function of further increasing the sensitivity of (E) the polymerization initiator or a sensitizer to the actinic radiation, or suppressing the polymerization inhibition of (D) the polymerizable compound due to oxygen.

Examples of such co-sensitizers include amines, such as compounds as disclosed in "Journal of Polymer Society", Vol. 10, p. 3173 written by M. R. Sander, et al., JP-B No. 44-20189, JP-A No. 51-82102, JP-A No. 52-134692, JP-A No. 59-138205, JP-A No. 60-84305, JP-A No. 62-18537, JP-A No. 64-33104, and Research Disclosure No. 33825. More specifically, examples of co-sensitizers include triethanol amine, ethyl-p-dimethylaminobenzoate, p-formyldimethylaniline, and p-methylthiodimethylaniline.

Examples of other co-sensitizers include thiols and sulfides, for example, thiol compounds as disclosed in JP-A No. 53-702, JP-B No. 55-500806, and JP-A No. 5-142772, and disulfide compounds as disclosed in JP-A No. 56-75643. More specifically, examples of other co-sensitizers include 2-mercaptobenzothiazole, 2-mercaptobenzoxazole, 2-mercaptobenzimidazole, 2-mercapto-4(3H)-quinazoline, and β-mercaptonaphthalene.

Still other examples of co-sensitizers include amino acid compounds (for example, N-phenylglycine), organic metal compounds as disclosed in JP-B No. 48-42965 (for example, tributyl tin acetate), a hydrogen donor as disclosed in JP-B No. 55-34414, and sulfur compounds (for example, trithiane) as disclosed in JP-A No. 6-308727.

From the viewpoint of increasing the curing rate based on the balance of the polymerization growth rate and the chain transfer, the amount of the co-sensitizers is preferably in the range of 0.1% by mass to 30% by mass, more preferably in the range of 1% by mass to 25% by mass, and still more preferably in the range of 1.5% by mass to 20% by mass, with respect to the total solid contents in the polymerizable composition.

Polymerization Inhibitor

In the invention, in order to prevent unnecessary polymerization of the polymerizable compound having an ethylenic unsaturated double bond during the manufacture or the storage of the polymerizable composition, it is preferable to add a polymerization inhibitor.

Examples of the polymerization inhibitor that can be used in the invention include phenolic hydroxyl group-containing compounds, N-oxide compounds, piperidine-1-oxyl free radical compounds, pyrrolidine-1-oxyl free radical compounds, N-nitrosophenyl hydroxylamines, diazonium compounds, cationic dyes, sulfide group-containing compounds, nitro group-containing compounds, and transition metal compounds such as $FeCl_3$ or $CuCl_2$.

The phenolic hydroxyl group-containing compound is preferably a compound selected from the group consisting of hydroquinone, p-methoxyphenol, di-t-butyl-p-cresol, pyrogallol, t-butyl catechol, benzoquinone, 4,4-thiobis(3-methyl-6-t-butylphenol), 2,2'-methylenebis(4-methyl-6-t-butylphenol), phenol resins, and cresol resins.

The N-oxide compound is preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide.

The piperidine-1-oxyl free radical compound is preferably a compound selected from the group consisting of piperidine-1-oxyl free radical, 2,2,6,6-tetramethyl piperidine-1-oxyl free radical, 4-oxo-2,2,6,6-tetramethyl piperidine-1-oxyl free radical, 4-hydroxy-2,2,6,6-tetramethyl piperidine-1-oxyl free radical, 4-acetamide-2,2,6,6-tetramethyl piperidine-1-oxyl free radical, 4-maleimide-2,2,6,6-tetramethyl piperidine-1-oxyl free radical, and 4-phosphonoxy-2,2,6,6-tetramethyl piperidine-1-oxyl free radical.

The pyrrolidine-1-oxyl free radical compound is preferably 3-carboxyproxyl free radical (3-carboxy-2,2,5,5-tetramethylpyrrolidine-1-oxyl free radical).

The N-nitrosophenylhydroxylamine is preferably a compound selected from the group consisting of N-nitrosophenylhydroxylamine cerium (III) salt and N-nitrosophenylhydroxylamine aluminum salt.

The diazonium compound is preferably a compound selected from the group consisting of 4-diazophenyldimethylamine hydrogensulfate, 4-diazodiphenylamine tetrafluoroborate and 3-methoxy-4-diazodiphenylamine hexafluorophosphate.

The cationic dye is preferably a compound selected from the group consisting of Crystal Violet, Methyl Violet, ethyl violet, and Victoria Pure Blue BOH.

Examples of suitable polymerization inhibitors that can be used in the invention are shown below, but the invention is not restricted to these examples. Examples of phenol polymerization inhibitors are shown in the following compounds (P-1) to (P-24).

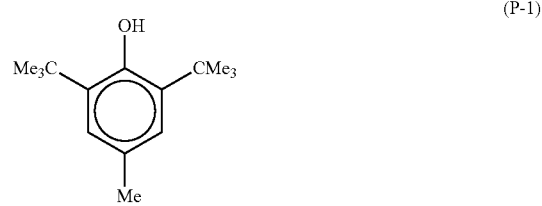

(P-1)

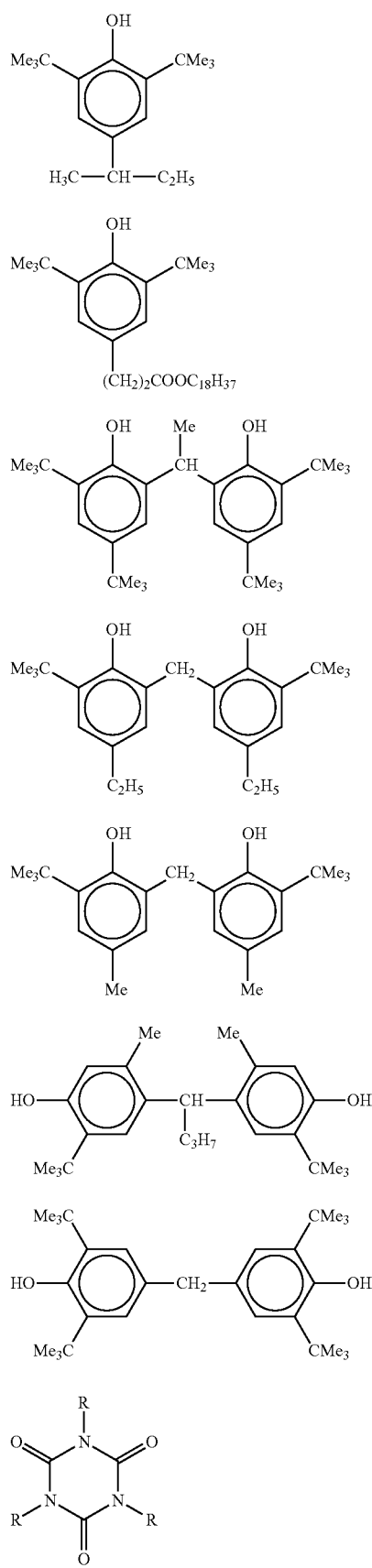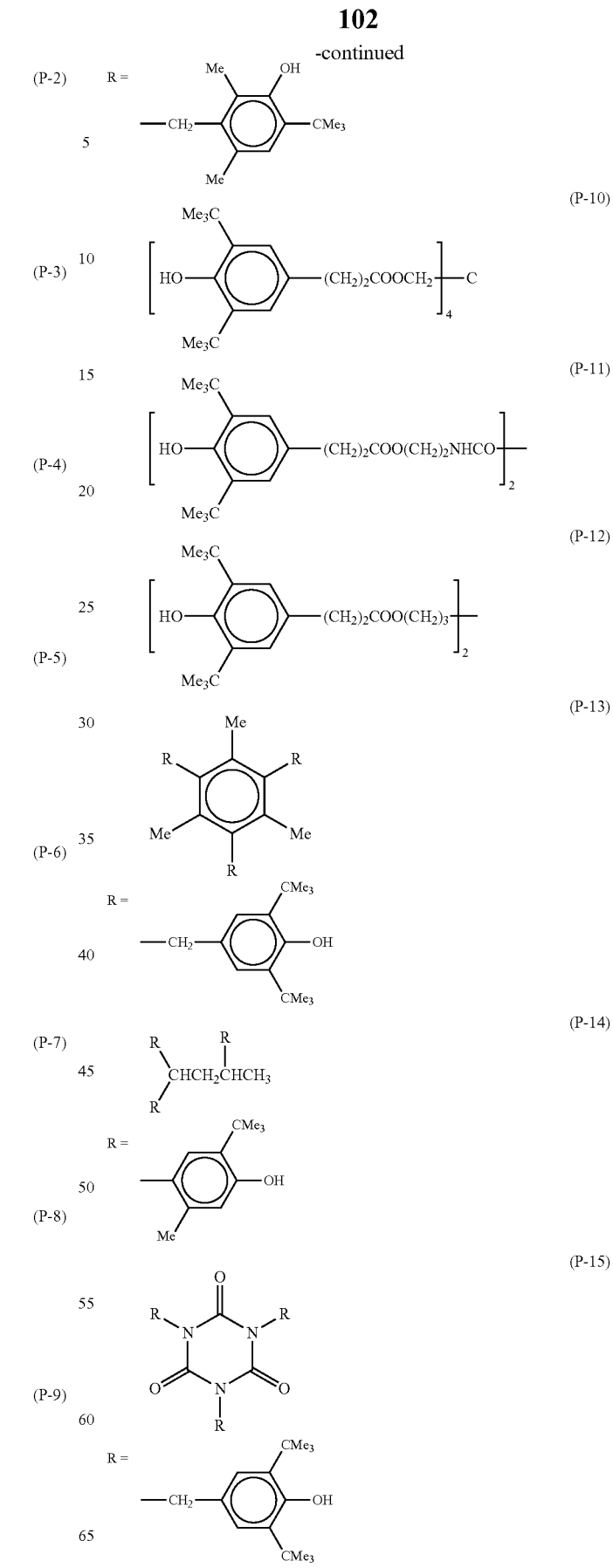

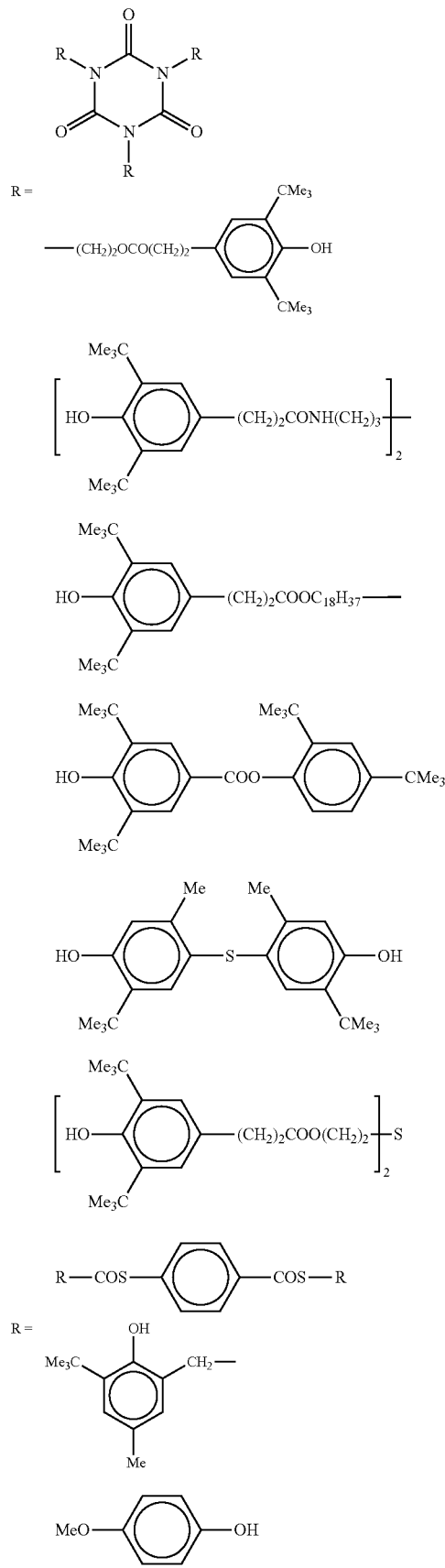
(P-16)
(P-17)
(P-18)
(P-19)
(P-20)
(P-21)
(P-22)
(P-23)
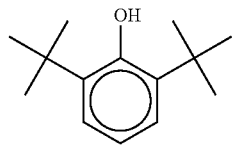 (P-24)
Examples of amine polymerization inhibitors include the following compounds (N-1) to (N-7).
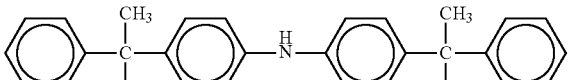 (N-1)
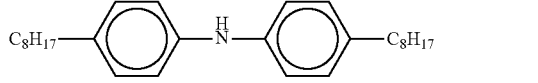 (N-2)
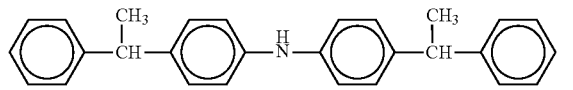 (N-3)
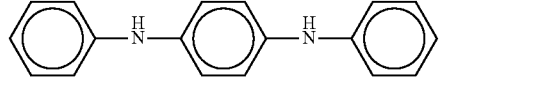 (N-4)
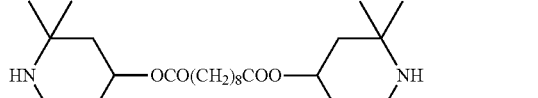 (N-5)
 (N-6)
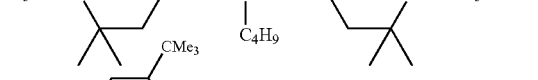 (N-7)
Examples of sulfur-containing polymerization inhibitors are shown in the following compounds (S-1) to (S-5).
$(C_{18}H_{37}OCOCH_2CH_2)_2S$ (S-1)
$(C_{12}H_{25}OCOCH_2CH_2)_2S$ (S-2)
$(C_{13}H_{27}OCOCH_2CH_2)_2S$ (S-3)
$(C_{14}H_{29}OCOCH_2CH_2)_2S$ (S-4)
$(CH_2OCOCH_2CH_2C_{12}H_{25})_4C$ Examples of the phosphite polymerization inhibitors are shown in the following compounds (R-1) to (R-5).

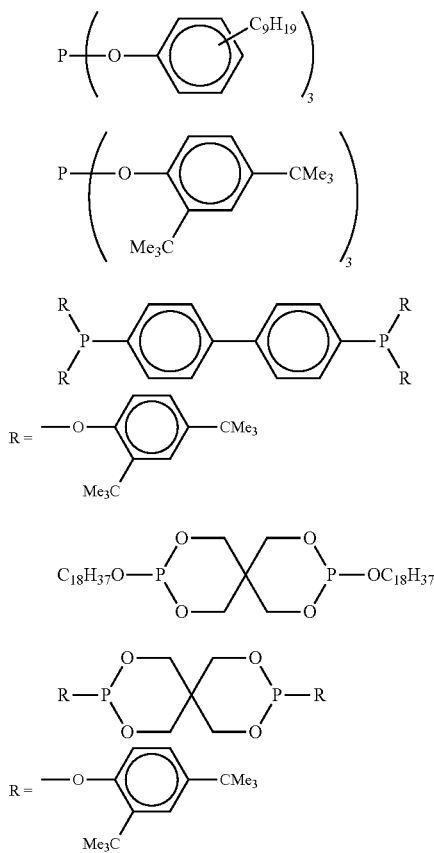

Each of the following compounds can also be used as a suitable polymerization inhibitor.

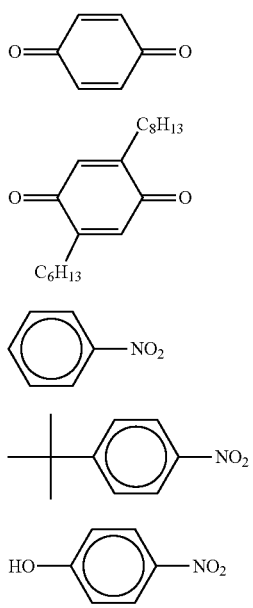

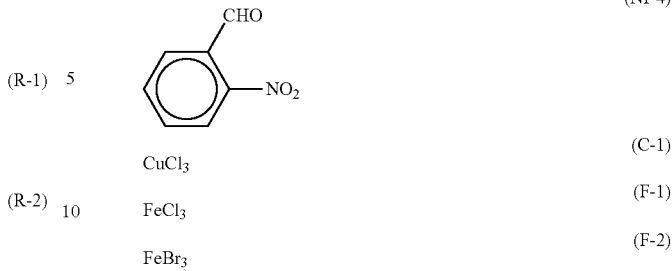

Among the above exemplary compounds, preferable examples include phenolic hydroxyl group-containing compound such as hydroquinone, p-methoxyphenol, di-t-butyl-p-cresol, pyrogallol, t-butyl catechol, benzoquinone, 4,4-thiobis(3-methyl-6-t-butylphenol), or 2,2'-methylene-bis(4-methyl-6-t-butylphenol); piperidine-1-oxyl free radical compound, or piperidine-1-oxyl free radical such as 2,2,6,6-tetramethylpiperidine-1-oxyl free radical, 4-oxo-2,2,6,6-tetramethyl piperidine-1-oxyl free radical, 4-hydroxy-2,2,6,6-tetramethylpiperidine-1-oxyl free radical, 4-acetamide-2,2,6,6-tetramethylpiperidine-1-oxyl free radical, 4-maleimide-2,2,6,6-tetramethylpiperidine-1-oxyl free radical, and 4-phosphonoxy-2,2,6,6-tetramethylpiperidine-1-oxyl free radical; or N-nitrosophenylhydroxylamine compounds such as N-nitrosophenylhydroxylamine cerium (III) salt and N-nitrosophenylhydroxylamine aluminum salt; and more preferable examples include piperidine-1-oxyl free radical compounds such as 2,2,6,6-tetramethylpiperidine-1-oxyl free radical, 4-oxo-2,2,6,6-tetramethylpiperidine-1-oxyl free radical, 4-hydroxy-2,2,6,6-tetramethylpiperidine-1-oxyl free radical, 4-acetamide-2,2,6,6-tetramethylpiperidine-1-oxyl free radical, 4-maleimide-2,2,6,6-tetramethylpiperidine-1-oxyl free radical, and 4-phosphonoxy-2,2,6,6-tetramethylpiperidine-1-oxyl free radical; or N-nitrosophenylhydroxylamine compounds such as N-nitrosophenylhydroxylamine cerium (III) salt and N-nitrosophenylhydroxylamine aluminum salt; and sill more preferable examples include N-nitrosophenylhydroxylamine compounds such as N-nitrosophenylhydroxylamine cerium (III) salt and N-nitrosophenylhydroxylamine aluminum salt.

The amount of the polymerization inhibitor to be added is preferably from 0.01 part by mass to 10 parts by mass, more preferably from 0.01 part by mass to 8 parts by mass, and most preferably from 0.05 part by mass to 5 parts by mass, with respect to 100 parts by mass of (E) the polymerization initiator.

When the amount is within the above ranges, the suppression of curing reaction in a non-image area, and the promotion of curing reaction in an image area can sufficiently occur, and as the result, the image formability and the sensitivity become good.

Binder Polymer

In the polymerizable composition, a binder polymer may further be used, if needed, for the purpose of improving the film property. As the binder polymer, it is preferable to use a linear organic polymer. As the linear organic polymer, any known polymer can be arbitrary used. In order to enable water development or weak alkaline-water development, a linear organic polymer that is soluble or swellable in water or weak alkaline water is selected. The linear organic polymer is used not only as a film-forming agent, but is selectively used in accordance with the usage as a water, weak alkaline water or organic solvent developer. For example, when a water-soluble organic polymer is used, water development becomes feasible. Examples of such linear organic polymers include a radical polymer having a carboxyl group in the side chain thereof, for example, polymers as disclosed in JP-A No. 59-44615, JP-B No. 54-34327, JP-B No. 58-12577, JP-B No. 54-25957, JP-A No. 54-92723, JP-A No. 59-53836, and JP-A No. 59-71048. That is, examples of the polymer include a resin formed by homopolymerization or copolymerization of a monomer having a carboxyl group; a resin formed by hydrolyzing, half-esterifying or half-amidizing an acid anhydride unit formed by homopolymerization or copolymerization of a monomer having an acid anhydride; and an epoxy acrylate formed by modifying an epoxy resin with an unsaturated monocarboxylic acid and an acid anhydride. Examples of the monomer having a carboxyl group include acrylic acid, methacrylic acid, itaconic acid, crotonic acid, maleic acid, fumaric acid, and 4-carboxyl styrene, and examples of the monomer having an acid anhydride include maleic anhydride.

Similarly, a cellulose derivative having a carboxylic acid group in the side chain thereof may be used. In addition, a polymer formed by adding a cyclic acid anhydride to a polymer having a hydroxyl group is also useful.

In the invention, when a copolymer is used as the binder polymer, monomers other than the monomers as described above may be used as a monomer to be copolymerized. Examples other monomers include the compounds described in (1) to (12) below (1) acrylates or methacrylates having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, or 4-hydroxybutyl methacrylate;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexyl methylacrylate, vinyl acrylate, 2-phenylvinyl acrylate, 1-propenyl acrylate, allyl acrylate, 2-allyloxyethyl acrylate, or propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexyl methylmethacrylate, vinyl methacrylate, 2-phenylvinyl methacrylate, 1-propenyl methacrylate, allyl methacrylate, 2-allyloxyethyl methacrylate, or propargyl methacrylate;

(4) acrylamides or methacrylamides, such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allylacrylamide, or allylmethacryl amide;

(5) vinyl ethers such as ethyl vinyl ether, 2-chloroethyl vinyl ether, hydroxyethyl vinyl ether, propyl vinyl ether, butyl vinyl ether, octyl vinyl ether, or phenyl vinyl ether;

(6) vinyl esters such as vinyl acetate, vinyl chloroacetate, vinyl butyrate, or vinyl benzoate;

(7) styrenes such as styrene, α-methylstyrene, methylstyrene, chloromethylstyrene, or p-acetoxystyrene;

(8) vinyl ketones such as methyl vinyl ketone, ethyl vinyl ketone, propyl vinyl ketone, or phenyl vinyl ketone;

(9) olefins such as ethylene, propylene, isobutylene, butadiene, or isoprene;

(10) N-vinyl pyrrolidone, acrylonitrile, methacrylonitrile, or the like;

(11) unsaturated imides such as maleimide, N-acryloyl acrylamide, N-acetyl methacrylamide, N-propionyl methacrylamide, or N-(p-chlorobenzoyl)methacrylamide; and

(12) a methacrylic acid monomer in which a hetero atom is bonded to the α-position thereof (for example, compounds disclosed in JP-A No. 2002-309057 and JP-A No. 2003-311569).

Among these, a (meth)acrylate resin having an allyl group, a vinyl ester group, or the like and a carboxyl group in the side chain thereof; an alkali soluble resin having a double bond in the side chain thereof, as disclosed in JP-A No. 2000-187322 and JP-A No. 2002-62698; and an alkali-soluble resin having an amide group in the side chain thereof as disclosed in JP-A No. 2001-242612 are suitable from the viewpoint of excellent balance of the film strength, the sensitivity and the developability.

Further, urethane binder polymers having an acid group, as disclosed in JP-B No. 7-12004, JP-B No. 7-120041, JP-B No. 7-120042, JP-B No. 8-12424, JP-A No. 63-287944, JP-A No. 63-287947, JP-A No. 1-271741, or the like, and urethane binder polymers having an acid group and a double bond as disclosed in JP-A No. 2002-107918 are extremely excellent in strength, and therefore, are advantageous in terms of the printing durability and low exposure suitability.

Further, acetal-modified polyvinyl alcohol binder polymers having an acid group as disclosed in European Patent No. 993966, European Patent No. 1204000, and JP-A No. 2001-318463, or the like are excellent in the balance of the film strength and the developability, and therefore, are suitable.

In addition to these, polyvinylpyrrolidone, polyethylene oxide, or the like are also useful as the water-soluble linear organic polymer. In order to enhance the strength of a cured film, an alcohol-soluble nylon, a polyether of 2,2-bis-(4-hydroxyphenyl)propane and epichlorohydrin, or the like is useful.

The weight average molecular weight of the binder polymer that can be used in the polymerizable composition of the invention is preferably 5,000 or more, and more preferably in the range of from 10,000 to 300,000, and the number average molecular weight thereof is preferably 1,000 or more, and more preferably in the range of from 2,000 to 250,000. The polydispersity (weight average molecular weight/number average molecular weight) thereof is preferably 1 or more, and more preferably from 1.1 to 10.

The binder polymer may be a random polymer, a block polymer, a graft polymer, or the like.

The binder polymers that can be used in the invention may be synthesized by a conventionally known method. Examples of solvents used in the synthesis of the polymer include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propylacetate, N,N-dimethyl formamide, N,N-dimethyl acetamide, toluene, ethyl acetate, methyl lactate, ethyl lactate, dimethyl sulfoxide, and water. Any one of the solvents may be used singly, or a combination of two or more thereof may be used.

Examples of the radical polymerization initiator used in the synthesis of the binder polymer that can be used in the polymerizable composition of the invention include conventionally known compounds such as an azo initiator and a peroxide initiator.

The amount of the binder polymer is preferably from 1% by mass to 40% by mass, more preferably from 3% by mass to 30% by mass, and still more preferably from 4% by mass to 20% by mass, in the total solid content of the polymerizable composition.

Adhesion Promoter

In order to increase the adhesion to a hard surface such as a substrate surface, an adhesion promoter is added in the polymerizable composition of the invention. Examples of the adhesion promoter include silane coupling agents and titanium coupling agents.

Examples of the silane coupling agents include γ-(2-aminoethyl)aminopropyl trimethoxysilane, γ-(2-aminoethyl)aminopropyl dimethoxysilane, β-(3,4-epoxycyclohexyl)ethyl trimethoxysilane, γ-aminopropyl trimethoxysilane, γ-aminopropyl triethoxysilane, γ-methacryloxypropyl trimethoxysilane, γ-methacryloxypropyl triethoxysilane, γ-acryloxypropyl trimethoxysilane, γ-acryloxypropyl triethoxysilane, γ-isocyanate propyl trimethoxysilane, γ-isocyanate propyl triethoxysilane, N-β-(N-vinylbenzylaminoethyl)-γ-aminopropyl trimethoxysilane hydrochloride, γ-glycidoxypropyl trimethoxysilane, γ-glycidoxypropyl triethoxysilane, aminosilane, γ-mercaptopropyl trimethoxysilane, γ-mercaptopropyl triethoxysilane, methyl trimethoxysilane, methyl triethoxysilane, vinyl triacetoxysilane, γ-chloropropyl trimethoxysilane, hexamethyl disilazane, γ-anilinopropyl trimethoxysilane, vinyl trimethoxysilane, vinyl triethoxysilane, vinyltris(β-methoxyethoxy)silane, octadecyldimethyl [3-(trimethoxysilyl)propyl]ammonium chloride, γ-chloropropylmethyl dimethoxysilane, γ-mercaptopropylmethyl dimethoxysilane, methyl trichlorosilane, dimethyl dichlorosilane, trimethyl chlorosilane, 2-(3,4-epoxycyclohexyl)ethyl trimethoxysilane, bisallyl trimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyldimethoxysilane.

Among these, γ-methacryloxypropyl trimethoxysilane, γ-methacryloxypropyl triethoxysilane, γ-acryloxypropyl trimethoxysilane, γ-acryloxypropyl triethoxysilane, γ-mercaptopropyl trimethoxysilane, γ-aminopropyl triethoxysilane and phenyl trimethoxysilane are preferable, and γ-methacryloxypropyl trimethoxysilane is most preferable.

The amount of the adhesion promoter to be added is preferably from 0.5% by mass to 30% by mass, and more preferably from 0.7% by mass to 20% by mass, in the total solid content in the polymerizable composition.

Other Additives

Further, in order to improve physical properties of the cured film, any one of known additives such as an inorganic filler, a plasticizer, or a sensitizer may be added to the polymerizable composition.

Examples of the plasticizer include dioctyl phthalate, didodecyl phthalate, triethylene glycol dicaprylate, dimethylglycol phthalate, tricresyl phosphate, dioctyl adipate, dibutyl sebacate, and triacetyl glycerol. When a binder is used, the plasticizer in an amount of 10% by mass or less may be added with respect to the total mass of the polymerizable compound and the binder polymer.

When the polymerizable composition of the invention is used, the dispersibility of titanium black becomes high and residues in an unexposed region can be suppressed, and the coating property when the polymerizable composition is coated on a substrate becomes good; as a result, the polymerizable composition can be suitably used for forming a light-shielding color filter.

Light-Shielding Color Filter

The light-shielding color filter having a color pattern of the invention is formed using the polymerizable composition of the invention. The colored pattern (for example, the black matrix) formed using the polymerizable composition of the invention has reduced residue, high flatness, no steps, and a favorable shape.

In the invention, the "step" means a difference in level (or height) observed in a color pattern (for example, a black matrix) of a square having sides of about 200 μm or more, the color pattern being formed by coating using the polymerizable composition, followed by light exposure and development. When a color pattern (for example, a black matrix) is observed under an optical microscope from above the film surface, in some cases, the step may be observed as a line of shapes almost similar to the pattern edge of the color pattern (for example, the black matrix).

FIG. 1 is a schematic drawing showing a step generated in a black matrix 10. The solid line expresses the pattern edge 1 of a light-shielding color filter, and the dashed line expresses the step 2.

The film thickness in the region outside the step (region between the pattern edge 1 and the step 2 in FIG. 1) is thinner than that of the region inside the step (region surrounded by the step 2 in FIG. 1) in the black matrix. That is, since the light-shielding performance is low in the region outside the step (henceforth referred to as the "step region"), the step region exerts an adverse effect such causing noise in the performance of a solid-state image pick-up element when the black matrix is used in a solid-state image pick-up element.

When a black matrix is formed using the polymerizable composition of the invention, a phenomenon that results in occurrence of the region (step region) where the film thickness in the peripheral region is thinner than that of the central region can be suppressed in a black matrix, and deterioration of the light-shielding performance in the peripheral region can be suppressed.

The film thickness of a colored pattern (for example, black matrix) is not particularly limited. From the viewpoint of achieving the effect of the invention more effectively, the film thickness of a colored pattern after drying is preferably from 0.2 μm to 50 μm, more preferably from 0.5 μm to 30 μm, and still preferably from 0.7 μm to 20 μm.

From the viewpoint of achieving the effect of the invention more effectively, the size (length of one side) of a colored pattern (for example, black matrix) is from 0.001 mm to 5 mm, more preferably from 0.005 mm to 4 mm, and still more preferably from 0.1 mm to 3.5 mm.

Light-Shielding Color Filter and Manufacturing Method Thereof

Next, the light-shielding color filter of the invention and a method of producing the same are described.

The light-shielding color filter of the invention has, on a substrate, a colored pattern (for example, black matrix) formed using the polymerizable composition of the invention.

Hereinafter, the light-shielding color filter that has a colored pattern (for example, black matrix) of the invention is explained by way of the manufacturing method thereof in detail.

The manufacturing method of the light-shielding color filter of the invention include applying the polymerizable composition of the invention on a substrate to form a polymerizable composition layer (hereafter, simply, referred to as a "polymerizable composition layer forming process", as occasion demands), exposing the polymerizable composition layer to light through a mask (hereafter, simply, referred to as an "exposure process", as occasion demands), and developing the polymerizable composition layer after exposure to form a colored pattern (hereafter, simply, referred to as a "development process", as occasion demands).

Specifically, the light-shielding color filter of the invention may be produced in such a manner that: the polymerizable composition of the invention is applied by coating directly on a substrate or via another layer, thereby forming a polymerizable composition layer (polymerizable composition layer-formation process); the polymerizable composition layer is exposed to light through a particular mask pattern, thereby curing only the area of the coated film irradiated with light (exposure process); and the exposed polymerizable composition layer is developed with a developer (developing process), thereby forming a patterned film including pixels.

Hereinafter, each process in the manufacturing method of the light-shielding color filter of the invention is explained.

Polymerizable Composition Layer Forming Process

In the polymerizable composition layer forming process, the polymerizable composition of the invention is applied on a substrate, whereby a polymerizable composition layer is formed.

Examples of the substrates include non-alkali glass, soda glass, PYREX (registered trademark) glass, and quartz glass, which are used for a liquid crystal display device, and any one of these glasses having a transparent electroconductive film adhered thereto, a photoelectric conversion element substrate used for a solid-state image pick-up element such as a silicon board and the like and a complementary metal oxide semiconductor (CMOS).

On these substrates, an undercoat layer may be formed for improving the adhesion to the upper-side layer, preventing diffusion of substances, or flattening the surface of the substrate, if needed.

As the coating method of the photopolymerizable composition of the invention on the substrate, various coating methods such as a slit coating, an inkjet method, a rotation coating, a cast coating, a roll coating, or a screen printing method, are applicable.

When a color filter having a black matrix for a solid-state image pick-up element is manufactured, the thickness of the coated film of the photopolymerizable composition is preferably from 0.35 µm to 1.5 µm, and more preferably from 0.40 µm to 1.0 µm, from the viewpoints of the resolution and developability.

The photopolymerizable composition on the substrate is usually dried under the conditions of 70° C. to 110° C. for about 2 minutes to about 4 minutes, whereby a polymerizable composition layer is formed.

Exposure Process

In the exposure process, the polymerizable composition layer formed in the polymerizable composition layer-forming process is exposed to light through a mask to cure only the area irradiated with light.

The exposure is preferably performed by irradiation with radiation rays. As the radiation rays used in the exposure, ultraviolet rays such as g-line, i-line or the like are preferably used, and a high-pressure mercury lamp is more preferably used. The irradiation intensity is preferably from 5 mJ/cm$^2$ to 1,500 mJ/cm$^2$, more preferably from 10 mJ/cm$^2$ to 1,000 mJ/cm$^2$, and most preferably from 10 mJ/cm$^2$ to 800 mJ/cm$^2$.

Developing Process

Subsequently, after the exposure process, an alkali development (developing process) is performed, so as to elute an area, which has not been irradiated with light in the exposure process, in an aqueous alkaline solution, thereby leaving only the photocured area.

As the developer, when a light-shielding color filter having a black matrix for a solid-state image pick-up element is manufactured, an organic alkaline developer that does not damage the underlaid circuit or the like is desirable. Usually, the developing temperature is from 20° C. to 30° C., and developing time is from 20 seconds to 90 seconds.

Examples of the aqueous alkali solutions include: an inorganic developer which is a solution in which sodium hydroxide, potassium hydroxide, sodium carbonate, sodium hydrogen carbonate, sodium silicate, or sodium metasilicate is dissolved at a concentration of from 0.001% by mass to 10% by mass, and preferably from 0.01% by mass to 1% by mass; and an organic alkali developer which is a solution in which an aqueous ammonia, ethylamine, diethylamine, dimethyl ethanolamine, tetramethyl ammonium hydroxide, tetraethyl ammonium hydroxide, choline, pyrrole, piperidine, or 1,8-diazabicyclo[5,4,0]-7-undecene is dissolved at a concentration of from 0.001% by mass to 10% by mass, and preferably from 0.01% by mass to 1% by mass. For example, a suitable amount of a water-soluble organic solvent such as methanol or ethanol, a surfactant, or the like may be added to the aqueous alkaline solution. When a developer including such an aqueous alkaline solution is used, generally, after development, washing (rinse) with pure water is preformed.

The manufacturing method of the color filter of the invention may further include, if necessary, a curing process in which the formed colored pattern (black matrix) is cured by heating and/or exposure, after performing the coloring polymerizable composition layer forming process, the exposure process, and the developing process as described above.

Since the photopolymerizable composition of the invention is used in the light-shielding color filter of the invention, the formed colored pattern (for example, black matrix) exhibits high adhesion to a support substrate, and the cured composition is excellent in development resistance. Accordingly, a high-resolution pattern having excellent exposure sensitivity, good adhesion to the substrate in the exposed regions, and a desired cross-sectional profile, can be formed.

Accordingly, the color filter is suitably used for a liquid crystal display device and a solid-state image pick-up element such as a CCD (charge coupled device), or the like, and in particular, is suitable for a CCD and a CMOS (complementary metal oxide semiconductor) having a high resolution exceeding 1,000,000 pixels. That is, it is preferable that the color filter having a black matrix of the invention be used for a solid-state image pick-up element.

The light-shielding color filter of the invention, for example, can be used as a black matrix arranged between the light receiving portion of each pixel that constitutes a CCD and a microlens for light condensing.

Solid-State Image Pick-Up Element

The solid-state image pick-up element of the invention includes the light-shielding color filter of the invention as described above, and if necessary, a color filter formed of pixels with other colors (e.g., three colors or four colors).

Since the solid-state image pick-up element of the invention has the light-shielding color filter (for example, black matrix) of the invention in which reduction in the light-shielding performance in the peripheral area is suppressed, noise can be reduced, and color reproducibility can be improved.

The constitution of the solid-state image pick-up element of the invention is not particularly limited as long as it has the light-shielding color filter (for example, black matrix) of the invention and functions as a solid-state image pick-up element. Examples thereof include a constitution in which a light-receiving element including plural photodiodes, polysilicons or the like that form a light-receiving area of a solid-state image pick-up element (e.g., CCD image sensor, CMOS image sensor or the like) is arranged on a substrate, and the light-shielding color filter (for example, black matrix) of the invention is formed on the opposite surface of the substrate from the light receiving element-forming surface.

Liquid Crystal Display

A liquid crystal display according to an exemplary embodiment of the invention includes at least, between a pair of substrates at least one of which is light-transmissive, a color filter, a liquid crystal layer, a liquid crystal drive means (including a simple matrix drive system and an active matrix drive system), and as the color filter in the liquid crystal display, a color filter having plural pixels as described above in which each of the pixels is separated from one another by the light-shielding color filter (for example, black matrix (the same applies hereinbelow)) is used. Since the light-shielding color filter is highly flat, the unevenness of cell gap between the color filter and the substrate does not arise, and display failure such as color unevenness does not arise in the liquid crystal display having the light-shielding color filter.

Further, a liquid crystal display according to another exemplary embodiment of the invention includes at least a color filter, a liquid crystal layer, a liquid crystal drive means between a pair of substrates at least one of which is light-transmissive, in which the liquid crystal drive means has an active element (for example, TFT), and the light-shielding color filter (for example) formed by the polymerizable composition of the invention is arranged between respective active elements.

Wafer Level Lens

Figure 2:
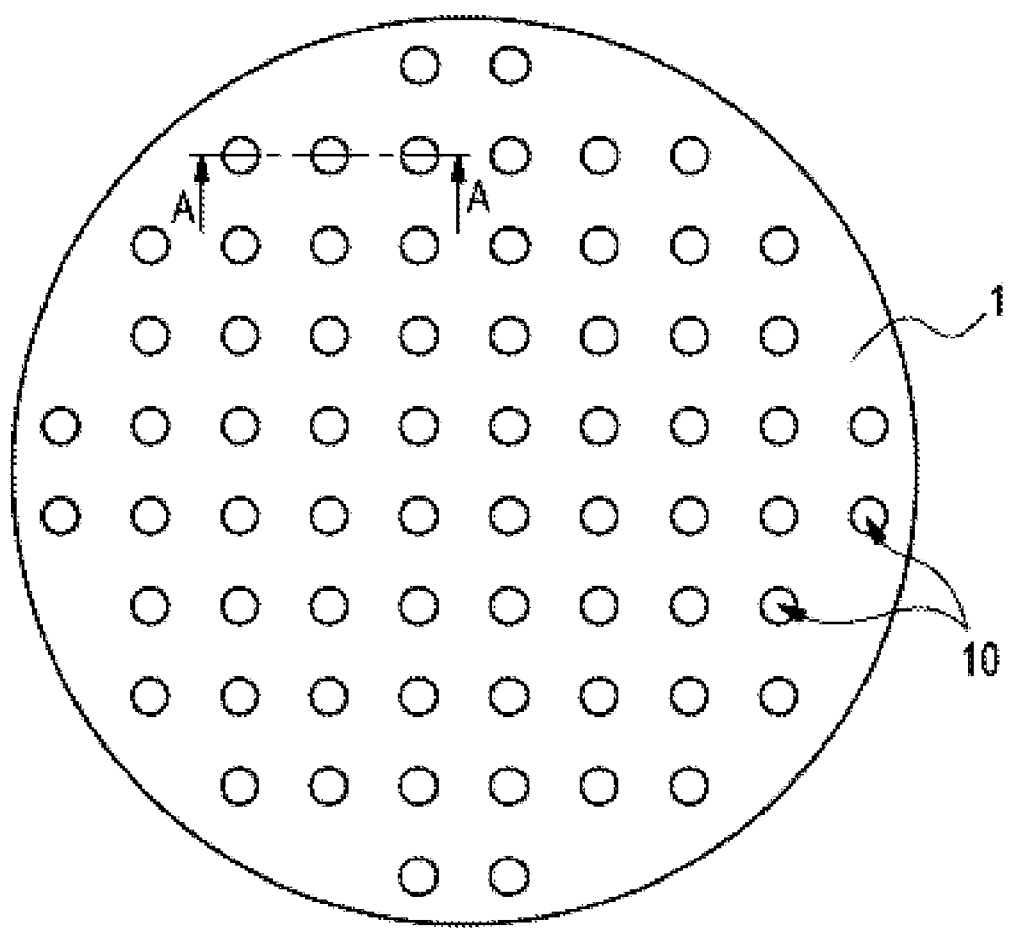
FIG. 2 is a plan view showing an example of a configuration of a wafer level lens.

The wafer level lens of the invention is formed by arranging a color filter having a light-shielding color filter (for example, black matrix) of the invention as described above. FIG. 2 is a plan view showing an example of the constitution of a wafer level lens, and FIG. 3 is a cross-sectional view of FIG. 2 taken along the line A-A.

The wafer level lens has a substrate 1 and plural lenses 10 arrayed on the substrate 1. The plural lenses 10 are one-dimensionally or two-dimensionally arrayed on the substrate 1. In this exemplary constitution, a configuration in which plural lenses 10 are two-dimensionally arrayed on the substrate is explained as an example. The lenses 10 are each formed from the same material as that of the substrate 1, and are formed on the substrate 1.

Figure 3:
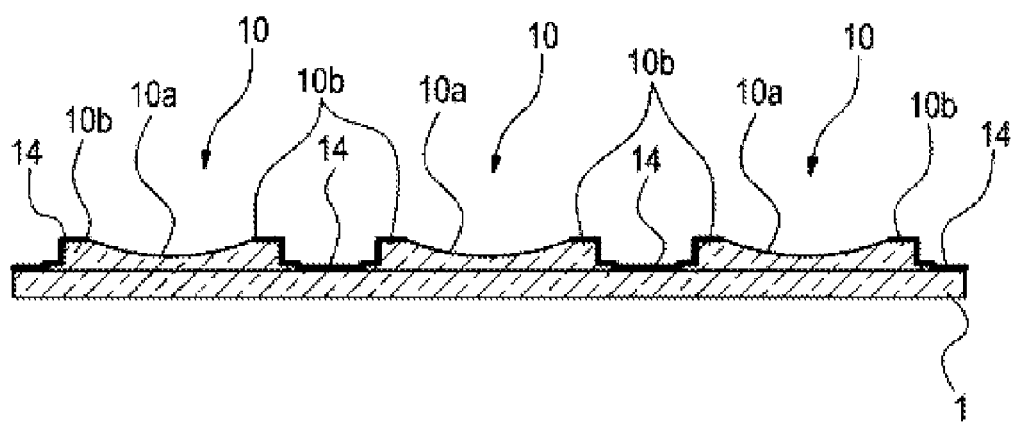
FIG. 3 is a cross-sectional view of FIG. 2 taken along the line A-A.

As shown in FIG. 3, each lens 10 has a concave lens surface 10a and a lens outer edge portion 10b on the periphery of the lens surface 10a. Here, the lens surface 10a refers to a surface of a part which has an optical characteristic that condenses or diffuses the light incident on the lens 10 in the desired direction and whose curvature or surface shape is designed in consideration of the characteristic. In this example, the lens outer edge portion 10b is formed so that the height thereof is higher than the height of the center of the lens surface 10a. The profile of the lens 10 is not particularly limited, but, for example, the lens 10 may be a so-called a convex lens, in which the lens surface 10a projects convexly, or may be an aspheric lens Here, an example in which plural lenses 10 are formed on one surface of the substrate 1 is shown. However, plural lenses 10 may be formed on the both surfaces of the substrate 1. When plural lenses 10 are formed on the both surfaces of the substrate 1, the lenses 10 are formed in such a manner that the optical axis of each lens on one surface coincides with the optical axis of each lens on the other surface.

In FIG. 3, the wafer level lens has a constitution in which one layer of the substrate 1 having the plural lenses 10 having thereon is formed. However, the wafer level lens may have a constitution in which plural substrates are laminated.

In the wafer level lens, the light-shielding layers 14 are formed so as to cover the surface of the lens outer edge portions 10b of the lenses 10, and the surface of the substrate 1 exists between the lenses 10. The light-shielding layer 14 is patterned on the regions other than the lens surfaces 10a of the lenses on the substrate 1. In a constitution in which the wafer level lens has one or more layers of substrates 1, at least one layer of the substrates may have the light-shielding layer 14 thereon. The light-shielding layer 14 is formed by a black resist layer. The black resist layer has low light-reflectance as compared with that of a metal layer or the like; therefore, failures such as ghost or flare accompanied by light reflection are reduced. The black resist layer includes a black resist composition.

Figure 4:
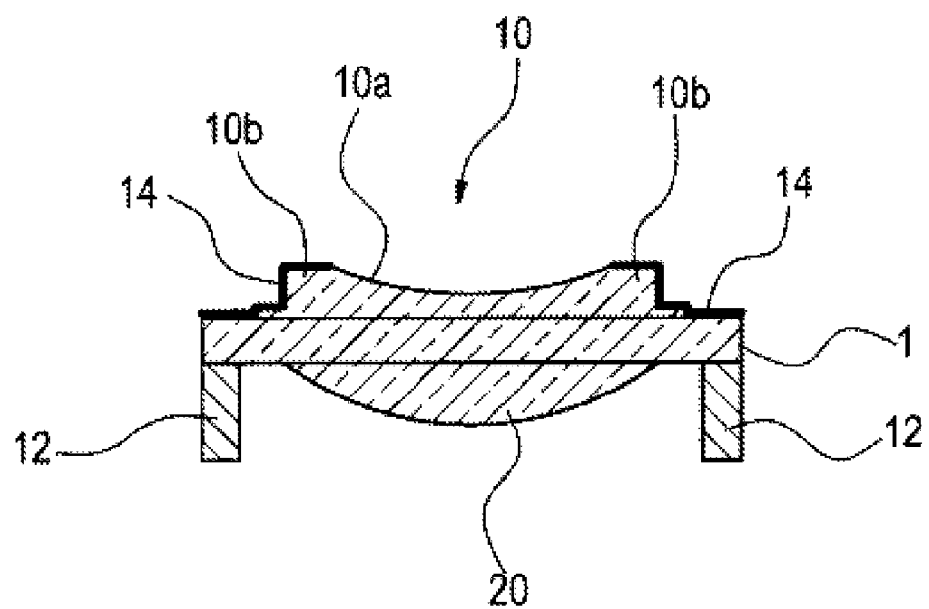
FIG. 4 is a cross-sectional view showing other examples of the configuration of a wafer level lens.

FIG. 4 is a cross-sectional view showing another constitutional example of a wafer level lens.

In this example, the lens 10 having a profile similar to that of the lens shown in FIG. 3 is formed on one surface of a substrate 1, and a convex lens 20 is formed on the other surface of the substrate. Further, spacers are formed on the other surface, for maintaining a distance between the wafer level lens and another wafer level lens when these lenses are superimposed. The spacer 12 is a grid-like member in the planar view, and is adhered to the other surface of the substrate 1. In this example, after the spacer is adhered to the wafer level lens, the wafer level lens is separated by dicing so as to form a constitution including a pair of a lens 10 and lens 20 on the substrate 1 for each. The spacer 12 is may also formed integrally with the substrate as a part of the substrate 1.

Figure 5:
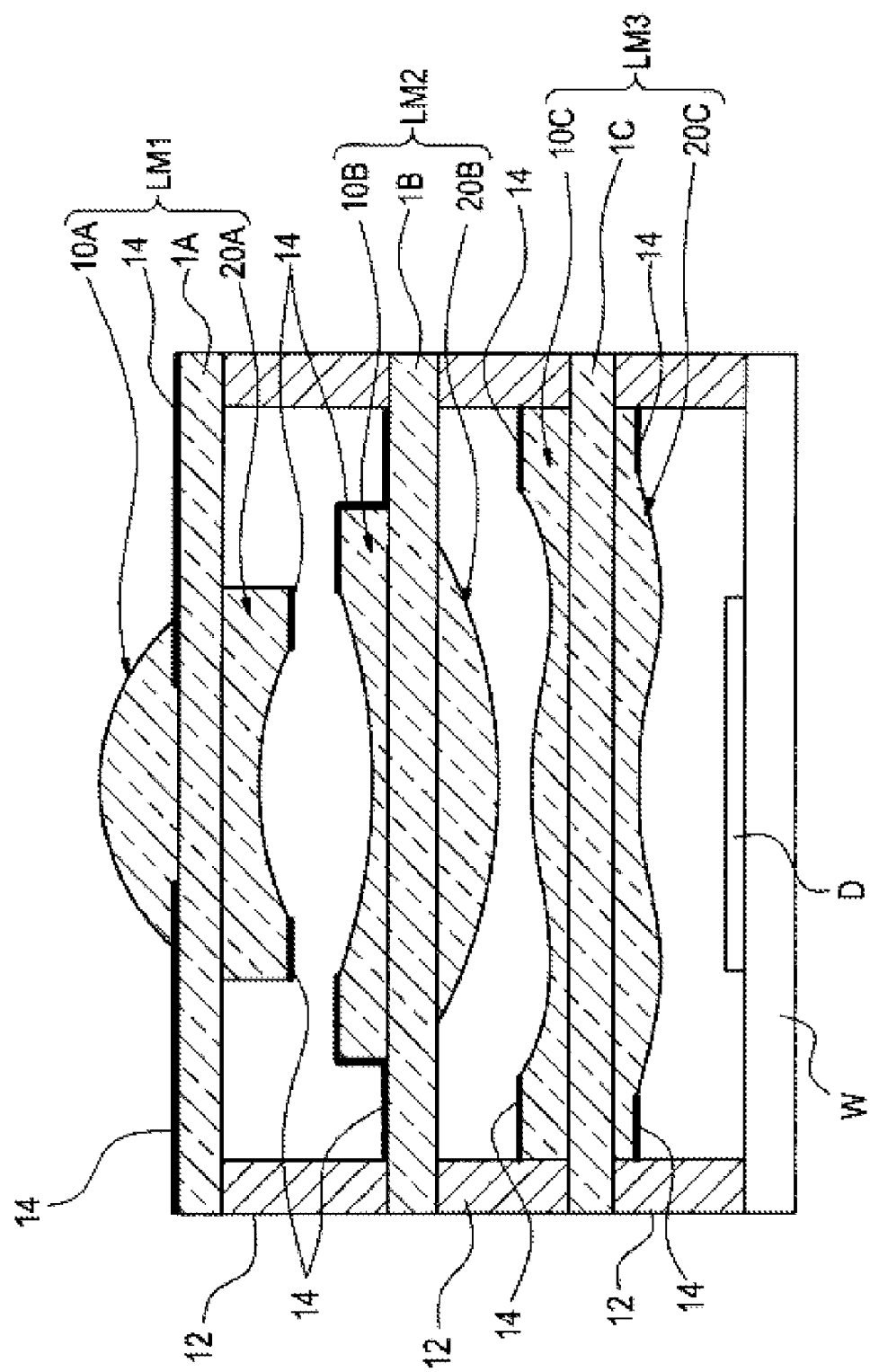
FIG. 5 is a cross-sectional view showing an example of the configuration of an image pick-up unit.

FIG. 5 is a cross-sectional view showing an example of the constitution of an image pick-up unit.

The image pick-up unit includes a lens module formed by dicing the wafer level lens so that respective lenses are separated from one another, an image pick-up element (here, a solid-state image pick-up element) D, and a sensor substrate W having the solid-state image pick-up element D thereon. In this example, three lens modules LM1, LM2, and LM3 forms a superimposed structure in this order from the light incident side (the upper side in FIG. 5).

In the lens module LM1, a convex lens 10A is formed on the upper surface of a substrate 1A, and a lens having a concave lens surface 20A is formed on the lower surface of the substrate. A patterned light-shielding layer 14 is formed in the region other than the lens surface of the lens 10A on the upper surface of the substrate 1A. A patterned light-shielding layer 14 is formed in the region other than the lens surface of the lens 20A.

In the lens module LM2, a concave lens 10B is formed on the upper surface of a substrate 1B, and a lens having a convex lens surface 20B is formed on the lower surface of the substrate. The constitution of the lens module LM2 is substantially the same as that of FIG. 4. A patterned light-shielding layer 14 is formed in the region other than the lens surface of the lens 10A, namely, the region of the lens edge portion and the substrate surface, on the upper surface of the substrate 1A. In this example, the light-shielding layer 14 is not formed on the lower surface of the substrate 1B, but a patterned light-shielding layer 14 may be formed on the region other than the lens surface of the lens 20B.

In the lens module LM3, an aspheric lens 10C is formed on the upper surface of a substrate 1C, and a lens 20C having an aspheric lens surface is formed on the lower surface of the substrate. A patterned light-shielding layer 14 is formed on the region other than the lens surface of the lens 10C and lens 20C.

In the lens modules, the light-shielding layer 14 is formed using the dispersion composition or the polymerizable composition of the invention.

The lenses 10A, 10B, 10C, 20A, 20B, and 20C each are formed so as to be rotationally symmetric with respect to the optical axis. The lens modules LM1, LM2, and LM3 are adhered to one another with the spacers 12 therebetween in such a manner that optical axes of all the lenses 10A, 10B, 10C, 20A, 20B, and 20C coincide with one another.

The lens modules LM1, LM2, and LM3 are adhered to the sensor substrate W via the spacers 12. The lenses 10A, 10B, 10C, 20A, 20B, and 20C of lens modules LM1, LM2, and LM3 form an object image on the solid-state image pick-up element D formed on the sensor substrate W.

The sensor substrate W is formed, for example, by cutting out a wafer formed from a semiconductor material such as silicon in an approximately rectangular form in planar view. The solid-state image pick-up element D is formed in approximately the central portion of the sensor substrate W. The solid-state image pick-up element D is a CCD image sensor or a CMOS image sensor, for example. After the solid-state image pick-up element D is made into chips, the chips are bonded to a semiconductor board having electrical wires or the like thereon. Alternatively, the sensor substrate W may be subjected to a film-forming process, a photolithographic process, an etching process, an impurity-adding process, or the like and, thereafter, an electrode, an insulating film, an electrical wiring, or the like may be formed on the sensor substrate W, thereby forming the solid-state image pick-up element D.

The spacers 12 of the lens module LM3 and the sensor substrate W are bonded to each other using, for example, an adhesive or the like. Each spacer 12 is designed such that the lenses 10A, 10B, 10C, 20A, 20B, and 20C of lens modules LM1, LM2, and LM3 form an object image on the solid-state image pick-up element D. Further, each spacer 12 is formed to have a thickness such that the lens modules LM1, LM2, and LM3 having the lenses 10A, 10B, 10C, 20A, 20B, and 20C are formed with certain distances therebetween so that the lens modules are not brought into contact with one another, or the lens module LM3 is not brought into contact with the sensor substrate W.

The shape of the spacers 12 is not particularly limited, but may be appropriately modified, as long as the spacer 12 is formed to maintain a spatial relationship according to the predetermined distance of the gaps between the lens modules LM1, LM2, and LM3, or the gap between the lens module LM3 and the sensor substrate W. For example, the spacers 12 may be pillar-shaped members arranged at the four corners of the substrates 1A, 1B, and 1C, respectively. Further, the spacer 12 may be a frame-like member that surrounds the periphery of the solid-state image pick-up element D. When the solid-state image pick-up element D is surrounded by a frame-like spacer 12, the solid-state image pick-up element D is isolated from the outside, so that light-shielding whereby light other than the light passing through the lens is not incident on the solid-state image pick-up element D, is possible. Moreover, the solid-state image pick-up element D is sealed against entry of light from the outside, so that adhesion of dust to the solid-state image pick-up element D can be prevented.

When a configuration is applied in which plural substrates 1A, 1B and 1C are superimposed, as shown in FIG. 5, a reflective layer may be formed on the surface of the uppermost substrate closest to the light incident side in place of the light-shielding layer 14. The reflective layer contains a material that has a light transmittance as low as 0.01% or less, and has a reflectance as high as 4% or more. As the reflective material, it is preferable to use a metal such as chromium (Cr) or a metal material.

The image pick-up unit configured as above is reflow-mounted on the circuit board (not shown), which is built into mobile terminals or the like. Paste-like solder is printed in advance at a position where an image pick-up unit is to be mounted, the image pick-up unit is placed on the position, and the circuit board including the image pick-up unit is subjected to a heating processing such as infrared ray irradiation or heated air blowing, whereby the image pick-up unit is welded to the circuit board.

EXAMPLES

Hereinafter, the invention is explained in detail by way of examples, but the invention is not limited to the examples, as long as it does not depart from the gist of the invention. In addition, unless otherwise specified, the units "part(s)" and "%" are based on mass.

Synthesis of Specific Resin 1

Into a three-necked 500 mL flask, 600 g of c-caprolactone and 22.8 g of 2-ethyl-1-hexanol were introduced, and the mixture were stirred and dissolved while introducing nitrogen into the flask. Monobutyl tin oxide (0.1 g) was added thereto, and the mixture was heated to 100° C. Eight hours later, after the disappearance of the raw materials were confirmed by gas chromatography, the reaction liquid was cooled to 80° C. After adding 0.1 g of 2,6-di-t-butyl-4-methylphenol and 27.2 g of 2-methacryloyloxyethyl isocyanate were added to the reaction liquid. Five hours later, after the disappearance of the raw materials were confirmed by $^1$N-NMR, the reaction liquid was cooled to room temperature, whereby 200 g of a solid precursor M1 (the structure as shown below) was obtained. M1 was identified by $^1$H-NMR, IR and mass analysis.

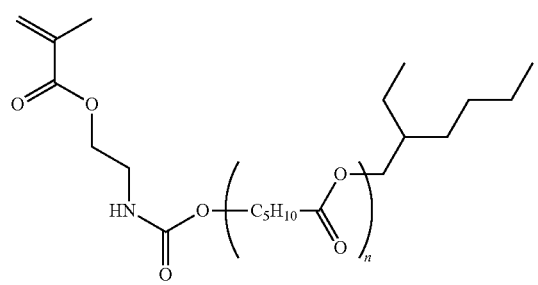

M1

The precursor M1 (80.0 g), 20.0 g of methacrylic acid, 2.3 g of dodecyl mercaptan and 233.3 g of propylene glycol monomethyl ether acetate were introduced into a three-necked flask, in which air was replaced with nitrogen. The mixture was stirred using a stirrer (THREE-ONE motor; manufactured by Shinto Scientific Co., Ltd.) while blowing nitrogen into the flask, and the temperature was raised by heating to 75° C. To the resultant mixture, 0.2 g of 2,2-azobis (2,4-dimethylvaleronitrile) ("V-65"; manufactured by Wako Pure Chemical Industries, Ltd.) was added, and the mixture was heated with stirring at 75° C. for 2 hours. Two hours later, 0.2 g of V-65 was additionally added thereto, followed by heating and stirring for 3 hours, thereby obtaining a 30% solution of Specific resin 1.

Synthesis of Specific Resins 2 to 13 and Comparative Resins 1 to 3

Specific resins 2 to 13 and Comparative resins 1 to 3 as shown below were synthesized in the same manner as in the synthetic method of the specific resin 1, except that constituent elements of Specific resin 1 were changed. The composition ratio of these resins, the number of atoms in the graft chains other than hydrogen atoms, and the weight average molecular weight of these resins are shown in Table 1.

TABLE 1

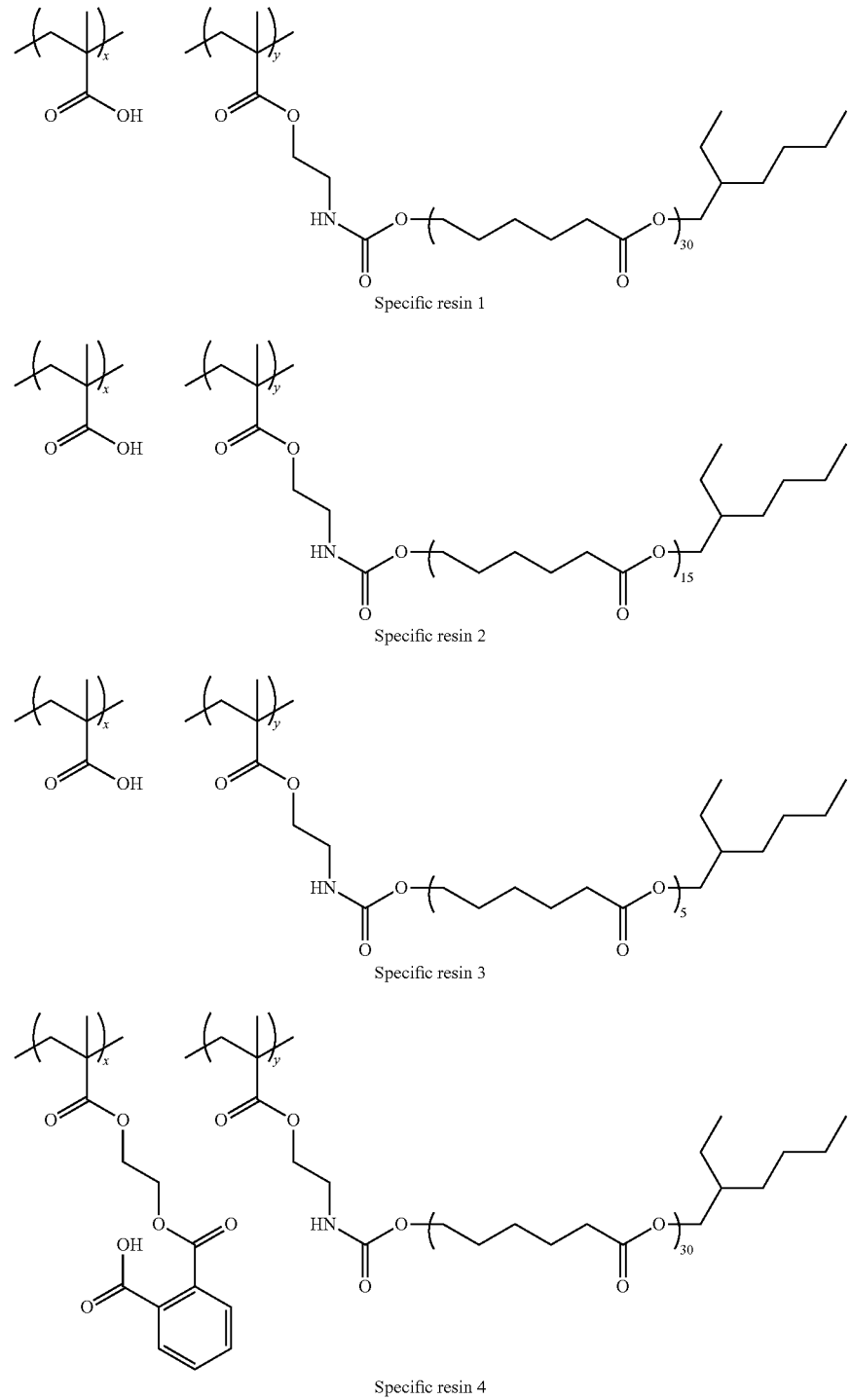

TABLE 1-continued
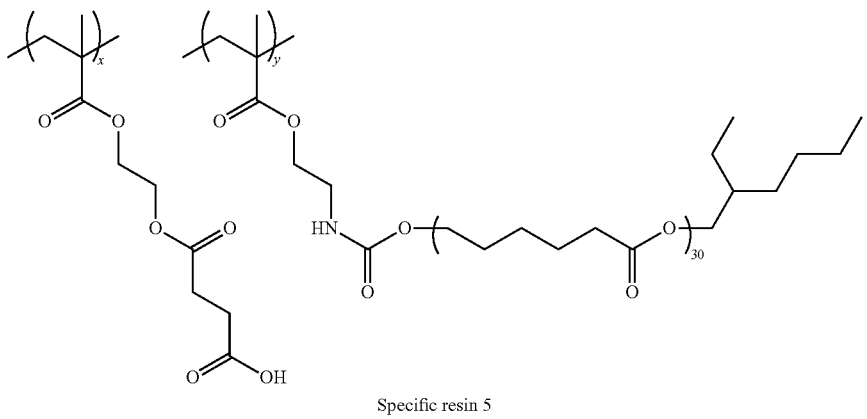
Specific resin 5
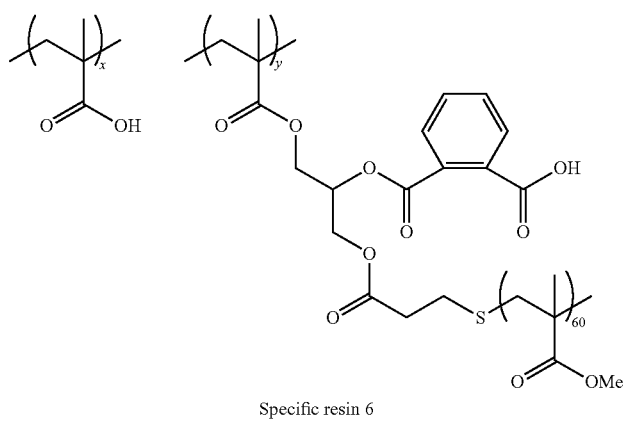
Specific resin 6
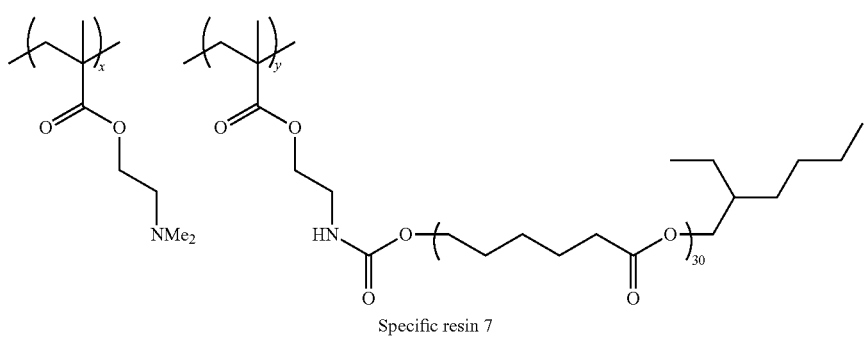
Specific resin 7
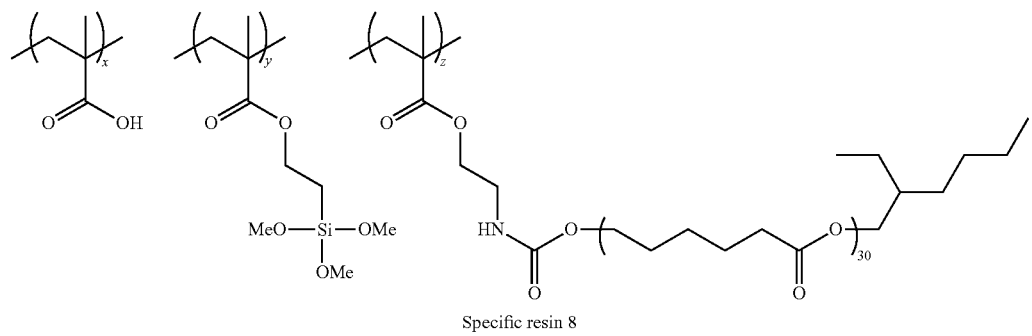
Specific resin 8

TABLE 1-continued
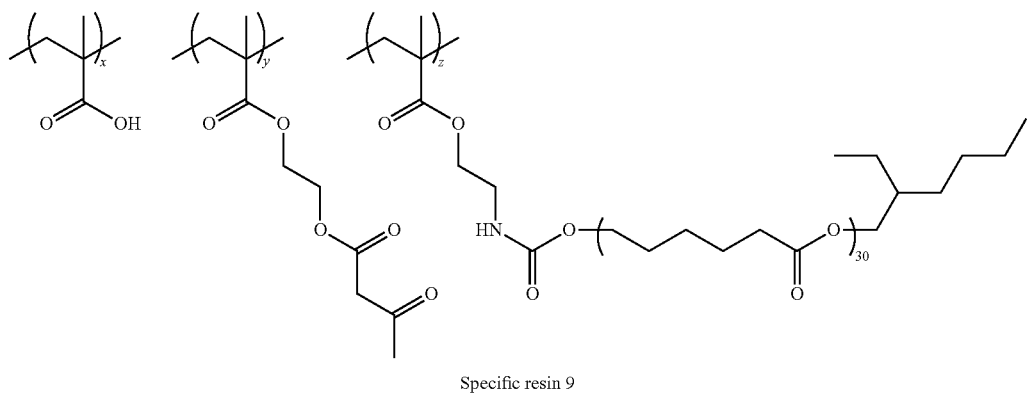
Specific resin 9
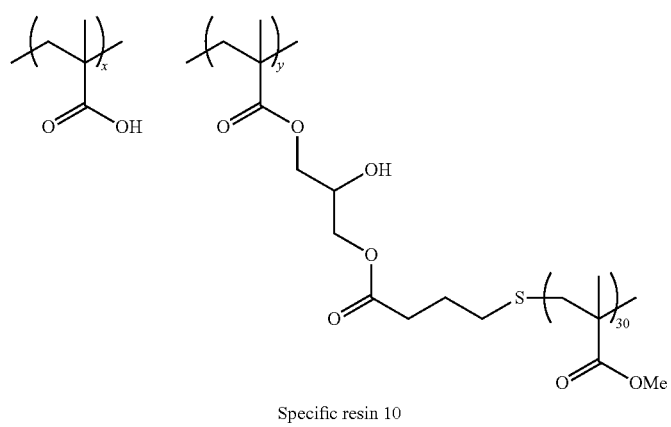
Specific resin 10
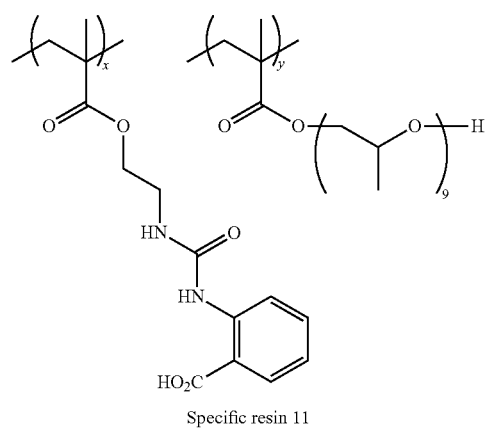
Specific resin 11
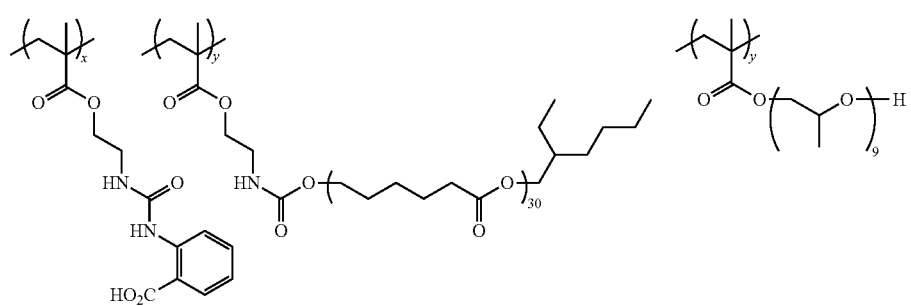
Specific resin 12

TABLE 1-continued
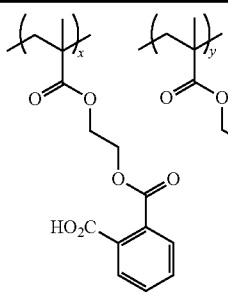
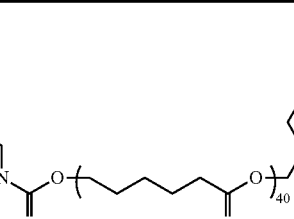
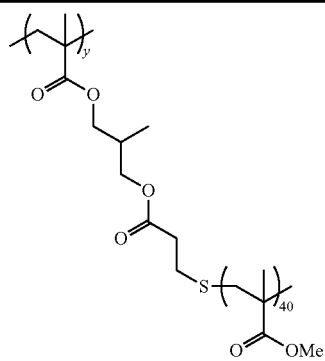
Specific resin 13
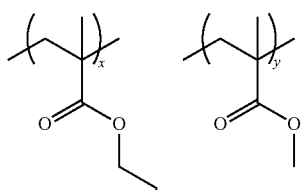
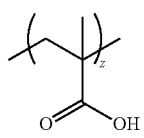
Comparative resin 1
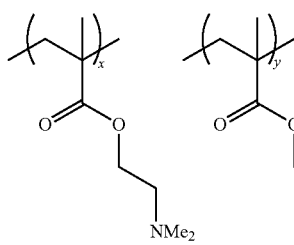
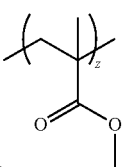
Comparative resin 2
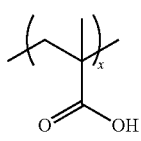
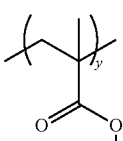
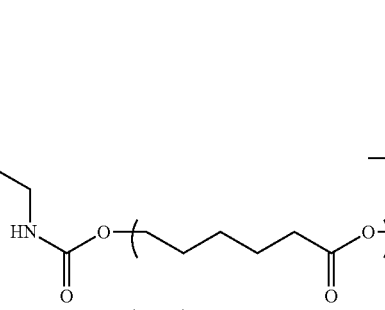
Comparative resin 3
| | Composition ratio (% by weight) | | | Number of atoms in graft chain (excluding hydrogen atoms) | Weigh average molecular weight |
|---|---|---|---|---|---|
| | x | y | z | | |
| Specific resin 1 | 20 | 80 | — | 257 | 20500 |
| Specific resin 2 | 20 | 80 | — | 137 | 22800 |
| Specific resin 3 | 20 | 80 | — | 57 | 25500 |
| Specific resin 4 | 20 | 80 | — | 257 | 26000 |
| Specific resin 5 | 20 | 80 | — | 257 | 25800 |
| Specific resin 6 | 20 | 80 | — | 444 | 27000 |

TABLE 1-continued

| | | | | | |
|---|---|---|---|---|---|
| Specific resin 7 | 20 | 80 | — | 257 | 18000 |
| Specific resin 8 | 10 | 10 | 80 | 257 | 17800 |
| Specific resin 9 | 10 | 10 | 80 | 257 | 35000 |
| Specific resin 10 | 20 | 80 | — | 224 | 36700 |
| Specific resin 11 | 40 | 50 | — | 39 | 13000 |
| Specific resin 12 | 30 | 30 | 40 | 259, 39 | 36700 |
| Specific resin 13 | 40 | 30 | 30 | 337, 224 | 24500 |
| Comparative resin 1 | 10 | 80 | 10 | — | 28900 |
| Comparative resin 2 | 20 | 50 | 50 | — | 25600 |
| Comparative resin 3 | 20 | 80 | — | 25 | 26800 |

Example 1

Preparation of Titanium Black Dispersion

After the following composition 1 was kneaded with a kneader for 30 minutes, the kneaded product was subjected to high viscosity dispersion processing using two rolls, thereby obtaining a dispersion.

Composition 1

Titanium black having average primary particle diameter of 75 nm (13M-C; manufactured by Mitsubishi Materials Corporation): 39 parts Propylene glycol monomethyl ether acetate: 60 parts To the obtained dispersion, the following composition 2 was added. The mixture was stirred under the condition of 3,000 rpm using a homogenizer for 3 hours. The obtained mixed solution was subjected to a dispersion process using a dispersing machine (trade name DISPERMAT; manufactured by Getzmann GmbH) with the use of zirconia beads having a diameter of 0.3 mm for 4 hours, thereby obtaining titanium black dispersion A (hereinafter, referred to as "TB dispersion A").

Composition 2

30% (by mass) propylene glycol monomethyl ether acetate solution of Specific resin 1: 30 parts Subsequently, the components in the following composition A were mixed using a stirrer, thereby preparing polymerizable composition A.

Composition A

| | |
|---|---|
| Benzyl methacrylate/acrylic acid copolymer (composition ratio: benzyl methacrylate/acrylic acid copolymer = 80/20 (% by mass); weight average molecular weight: 25,000; binder polymer): | 3.0 parts |
| Dipentaerythritol hexaacrylate (polymerizable compound): | 2.0 parts |
| Ethoxylated pentaerythritol tetraacrylate (polymerizable compound): | 1.0 part |
| TB dispersion A: | 26.0 parts |
| Propylene glycol monomethyl ether acetate (solvent): | 10 parts |
| Ethyl-3-ethoxyproionate (solvent): | 8 parts |
| Polymerization initiator: compound shown in the following Table 2: | 0.8 part |
| 4-Methoxyphenol (polymerization inhibitor): | 0.01 part |

Production of Color Filter Having Black Matrix for Solid-State Image Pick-Up Element The above polymerizable composition A as a resist solution was coated on an undercoat layer of a silicon wafer with the undercoat layer using a spin coater so as to form a coated film having a dry thickness of 0.7 μm, and the coated film was allowed to stand for 10 minutes as such, and followed by a heat processing (pre-baking) using a hot plate at 100° C. for 120 seconds.

Subsequently, the coated film was irradiated with light of a wavelength of 365 nm at an exposure amount of 1,000 mJ/cm$^2$ through an island pattern mask with a size of 2 μm square using an i-line stepper exposure machine FPA-3000i5+ (manufactured by Canon Inc.).

Thereafter, the silicon wafer board having the light-irradiated coated film thereon was placed on the horizontally rotary table of a spin shower development machine (DW-30 type; manufactured by Chemitronics Co., Ltd.), and was paddle developed by using CD-2000 (manufactured by Fujifilm Electronic Materials Co., Ltd.) at 23° C. for 60 seconds.

Next, the silicon wafer board with the coated film formed thereon was fixed to the horizontally rotary table by a vacuum chuck method. While rotating the silicon wafer board by a rotary machine at the number of revolutions of 50 rpm, pure water in a shower-like flow was sprayed from a spray nozzle from above the rotation center to perform a rinse processing, followed by spray drying, thereby forming a wafer having a black matrix thereon.

Example 2 to Example 18 and Comparative Example 1 to Comparative Example 6

The same operations as in Example 1 were conducted except that, in the preparation of the dispersion composition of Example 1, Specific resin 1 was replaced with the specific resins or comparative resins as shown in Table 2, and the polymerization initiator was changed to the polymerization initiators as shown in Table 2.

TABLE 2

| | Specific resin/ Comparative resin | Polymerization initiator | Viscosity of dispersion composition (mPa · s) | Storage stability | Coating evenness | Residues | Step width (%) |
|---|---|---|---|---|---|---|---|
| Example 1 | Specific resin 1 | Compound 1 | 15 | A | A | A | 10 |
| Example 2 | Specific resin 2 | Compound 1 | 25 | A | A | A | 10 |
| Example 3 | Specific resin 3 | Compound 1 | 35 | A | A | A | 10 |
| Example 4 | Specific resin 4 | Compound 1 | 12 | A | A | A | 10 |

TABLE 2-continued

| | Specific resin/ Comparative resin | Polymerization initiator | Viscosity of dispersion composition (mPa·s) | Storage stability | Coating evenness | Residues | Step width (%) |
|---|---|---|---|---|---|---|---|
| Example 5 | Specific resin 5 | Compound 1 | 13 | A | A | A | 10 |
| Example 6 | Specific resin 6 | Compound 1 | 35 | A | A | A | 10 |
| Example 7 | Specific resin 7 | Compound 1 | 39 | A | A | B | 10 |
| Example 8 | Specific resin 8 | Compound 1 | 11 | A | A | A | 10 |
| Example 9 | Specific resin 9 | Compound 1 | 12 | A | A | A | 10 |
| Example 10 | Specific resin 10 | Compound 1 | 35 | A | A | A | 10 |
| Example 11 | Specific resin 11 | Compound 1 | 35 | A | A | A | 10 |
| Example 12 | Specific resin 12 | Compound 1 | 14 | A | A | A | 10 |
| Example 13 | Specific resin 13 | Compound 1 | 15 | A | A | A | 10 |
| Example 14 | Specific resin 1 | Compound 2 | 15 | A | A | A | 10 |
| Example 15 | Specific resin 1 | Compound 3 | 15 | A | A | A | 20 |
| Example 16 | Specific resin 1 | Compound 4 | 15 | A | A | A | 20 |
| Example 17 | Specific resin 1 | Compound 5 | 15 | A | A | A | 10 |
| Example 18 | Specific resin 1 | Compound 6 | 15 | A | A | A | 10 |
| Comparative Example 1 | Comparative resin 1 | Compound 1 | 55 | C | B | B | 20 |
| Comparative Example 2 | Comparative resin 1 | Compound 3 | 55 | C | B | B | 25 |
| Comparative Example 3 | Comparative resin 2 | Compound 1 | 65 | C | B | B | 20 |
| Comparative Example 4 | Comparative resin 2 | Compound 3 | 65 | C | B | B | 25 |
| Comparative Example 5 | Comparative resin 3 | Compound 1 | 55 | B | B | B | 14 |
| Comparative Example 6 | Comparative resin 3 | Compound 3 | 55 | B | B | B | 16 |

The polymerization initiators listed in Table 2 are as follows;

Compound 1

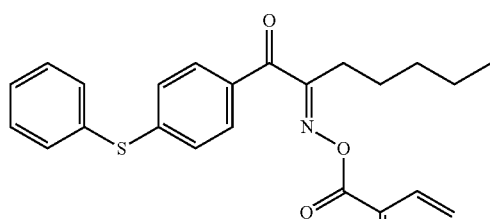

IRGACURE OXE01
(Ciba Specialty Chemicals Corporation)

Compound 2

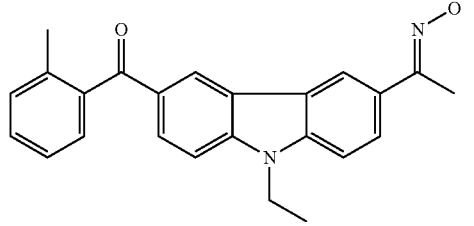

IRGACURE OXE02
(Ciba Specialty Chemicals Corporation)

Compound 3

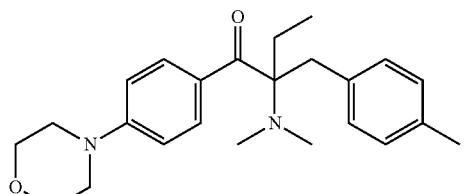

IRGACURE 379

Compound 4

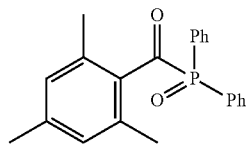

DAROCUR TPO

Compound 5

Compound 6

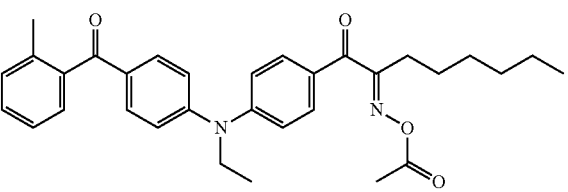

Evaluation

The dispersion compositions and the polymerization compositions obtained in the above were subjected to the following evaluations, and the results are shown in Table 2.

Viscosity of Dispersion Compositions

The viscosity of the dispersion compositions was measured using an E type rotation viscosimeter (manufactured by Toki Sangyo Co., Ltd.). It means that the dispersibility is higher as the viscosity of the dispersion composition is lower.

Evaluation of Storage Stability (Stability Over Time)

After each polymerizable composition was stored for one month at room temperature, the degree of sedimentation of titanium black was evaluated in accordance with the following judgment criteria. The numerical values showing the storage stability were calculated from the rate of variation in light absorbance measured by using a visible light absorption spectrometer (CARY-5; manufactured by Varian Inc.) of the polymerizable composition diluted 1,000 times with PGMEA.

Judgment Criteria
- A: sedimentation of from 0% to less than 2% of titanium black was observed;
- B: sedimentation of from 2% to less than 5% of titanium black was observed; and
- C: sedimentation of 5% or more of titanium black was observed.

Evaluation of Residues

The existence of residues in the region which was not irradiated with light (unexposed region) in the exposure process was observed using an SEM, and the residues were evaluated. The evaluation criteria are as follows:

Evaluation Criteria
- A: residues were not observed in the unexposed region;
- B: residues were slightly observed in the unexposed region, but were not practically problematic; and
- C: residues were significantly observed in the unexposed region.

Evaluation of Coating Evenness of at the Time of Coating

The coating evenness of at the time of coating of each polymerizable composition was evaluated in the following manner. Specifically, each polymerizable composition was applied using a spin coater so as to form a film thickness of 1 μm after drying, and the coated film was observed under an optical microscope, and the coating evenness was evaluated. The evaluation criteria are as follows:

Evaluation Criteria
- A: coating unevenness was not observed at all;
- B: coating unevenness was observed in some degree; and
- C: coating unevenness was greatly observed.

Evaluation of Step

The obtained black matrix (i.e., the pattern formed using the polymerizable composition) was imaged under an optical microscope (hundredfold magnification), and the width of a step region was measured. As shown in FIG. 1, in the black matrix (color filter having a black matrix) 10, the distance between the pattern edge 1 which is the edge of a pattern formed using the polymerizable composition, and the boundary line 2 of the region (step region) where the film thickness in the peripheral region becomes thinner than the central region of the black matrix, was measured. The value obtained by dividing this distance by the length of a side of the pattern is shown in terms of percent in Table 2.

As is clear from Table 2, in Examples 1 to 18, in which the dispersion compositions of the invention containing graft polymers having the specific structures are used for the black matrices of the solid-state image pick-up elements, the viscosity of the dispersion composition is low, and the dispersibility of titanium black is favorable. On the other hand, in the Comparative Examples, in which the graft polymers having the specific structures of the invention are not used, the viscosity of the dispersion composition is high, and the dispersibility of titanium black is poor. Further, when the polymerizable composition containing the dispersion composition of the invention is used, it turns out that the formed black matrix has favorable storage stability, the coating evenness when coated on a substrate is favorable, occurrence of residue in unexposed regions is suppressed, the width of the step at when exposed and developed is small, and the shape of the black matrix is favorable.

Moreover, in Examples of 1 to 14, oxime compounds as polymerization initiators are used, and it turns out that the pattern shapes are excellent.

Examples 19 to 32 and Comparative Examples 7 to 12

Production of Black Matrix for Liquid Crystal Display Device

Next, color filters having a black matrix for a liquid crystal display were manufactured using the polymerizable compositions used for the solid-state image pick-up elements without modification.

Specifically, the same polymerizable compositions as those used in the production of the color filters for the solid-state image pick-up elements were applied by slit-coating on a glass substrate having a size of 250 mm×350 mm under the conditions described below. Thereafter, the coated films were each allowed to stand for 10 minutes as such, and were subjected to a vacuum drying and pre-baking (100° C. for 80 seconds), thereby forming coated films of the polymerizable compositions. Thereafter, the entire surface of each coated film was exposed at an exposure amount of 1,000 mJ/cm$^2$ (illumination intensity of 20 mW/cm$^2$), and the exposed coated film was covered with a 1% aqueous solution of an alkali developer (trade name; CDK-1; manufactured by Fuji-Film Electronics Materials Co., Ltd.), and maintained for 60 seconds. Thereafter, the developer was rinsed and washed with shower-like spray of pure water. The coated film that ha been subjected to the exposure processing and the developing processing was subjected to a heating processing (post-baking) in an oven at 220° C. for one hour, thereby forming a black matrix on the glass substrate.

Slit Coating Conditions

| | |
|---|---|
| Gap of the opening at the tip end of coating: | 50 μm |
| Coating speed: | 100 mm/second |
| Clearance between substrate and coating head: | 150 μm |
| Dry film thickness: | 1.75 μm |
| Coating temperature: | 23° C. |

Evaluation

The coated substrates and the polymerizable compositions obtained in the above were subjected to the following evaluations. The results are shown in Table 3.

Evaluation of Coating Evenness of at the Time of Coating

After the polymerizable composition was applied by slit-coating, the coated film was allowed to stand for 10 minutes as such, and the polymerizable composition was further coated on a glass substrate, and was pre-baked at 90° C. for 60 seconds. Thereafter, streak-like unevenness of the surface of the coated film was visually observed under a sodium light source, and evaluated in accordance with the following criteria:

Evaluation Criteria of Surface Conditions of Coated Film
  A: no streak-like unevenness was observed;
  B: unevenness with 1 to 5 streaks was observed; and
  C: either unevenness with 6 streaks or more, or foreign matters were observed.

Evaluation of Residues

The existence of residues in the region which was not irradiated with light (unexposed region) in the exposure process was observed under an SEM, and the residues were evaluated. The evaluation criteria are as follows:

Evaluation Criteria
  A: residues were not observed in the unexposed region at all;
  B: residues were slightly observed in the unexposed region, but were not practically problematic; and
  C: residues were significantly observed in the unexposed region.

Evaluation of Step

The obtained black matrix (i.e., the pattern formed using polymerizable composition) was imaged under an optical microscope (tenfold magnification), and the width of a step region was measured. As shown in FIG. 1, in the black matrix (color filter having black matrix) 10, the distance between the pattern edge 1 which is the edge of a pattern formed using the polymerizable composition, and the boundary line 2 of the region (step region where the film thickness in the peripheral region becomes thinner than the central region of the black matrix) was measured. The value obtained by dividing this distance by the length of a side of the pattern is shown in terms of percent in Table 3.

TABLE 3

|  | Polymerizable compound | Coating evenness | Residues | Step width (%) |
|---|---|---|---|---|
| Example 19 | Same as Example 1 | A | A | 10 |
| Example 20 | Same as Example 2 | A | A | 10 |
| Example 21 | Same as Example 3 | A | A | 10 |
| Example 22 | Same as Example 4 | A | A | 10 |
| Example 23 | Same as Example 5 | A | A | 10 |
| Example 24 | Same as Example 6 | A | A | 10 |
| Example 25 | Same as Example 7 | A | A | 10 |
| Example 26 | Same as Example 8 | A | A | 10 |
| Example 27 | Same as Example 9 | A | A | 10 |
| Example 28 | Same as Example 10 | A | A | 10 |
| Example 29 | Same as Example 11 | A | A | 23 |
| Example 30 | Same as Example 12 | A | A | 23 |
| Example 31 | Same as Example 13 | A | A | 10 |
| Example 32 | Same as Example 14 | A | A | 10 |
| Comparative example 7 | Same as Comparative example 1 | C | A | 30 |
| Comparative example 8 | Same as Comparative example 2 | C | A | 30 |
| Comparative example 9 | Same as Comparative example 3 | C | A | 25 |
| Comparative example 10 | Same as Comparative example 4 | C | A | 25 |
| Comparative example 11 | Same as Comparative example 5 | C | A | 18 |
| Comparative example 12 | Same as Comparative example 6 | B | A | 17 |

As is clear from Table 3, when the polymerizable composition of the invention is used for the color filter having a black matrix for a liquid crystal display device, it turns out that the coating evenness at the time of being coated on a substrate is good, occurrence of residues in unexposed regions is suppressed, the width of the step at the time of being exposed and developed is small, and the shape of the black matrix is good.

Example 33

Production of Solid-State Image Pick-Up Element

Preparation of Chromatic Colored Polymerizable Composition

A mixed liquid containing 40 parts of the following pigments, 50 parts of 30% solution of DISPERBYK-161 (manufactured by BYK Chemie GmbH) as a dispersant, and 110 parts of propylene glycol monomethyl ether as a solvent was mixed and dispersed using a bead mill for 15 hours, thereby preparing a pigment dispersion (P1).

Chromatic Color Pigment for Forming Each of RGB Colored Pixels

Pigment for red (R): C.I. Pigment Red 254;
  Pigment for green (G): mixture of C.I. Pigment Green 36 and C.I. Pigment Yellow 219 (mass ratio: 30/70); and
  Pigment for blue (B): mixture of C. I. Pigment Blue 15:6 and C.I. Pigment Violet 23 (mass ratio: 30/70).

Coating liquids R-1, G-1, and B-1 were each prepared by stirring and mixing the dispersion-processed pigment dispersion (P1) with the following materials so as to form the following composition ratio.

Composition

| Colorant (pigment dispersion liquid (P1)): | 350 parts |
|---|---|
| Polymerization initiator (oxime photopolymerization initiator) (CGI-124, manufactured by Ciba Specialty Chemicals Corporation): | 30 parts |
| TO-1382 (carboxyl group-containing pentafunctional acrylate; manufactured by Toagosei Co., Ltd.): | 25 parts |
| Dipentaerythritol hexaacrylate: | 30 parts |
| Solvent (PGMEA): | 200 parts |
| Adhesion promoter to substrate (3-methacryloxypropyl trimethoxysilane): | 1 part |

Production of Color Filter for Solid-State Image Pick-Up Element

A red (R) colored pattern having a size of 1.6×1.6 µm was formed using the red (R) coating liquid R-1 on the wafer of the light-shielding filter having the black matrix manufactured in Example 1. Similarly, a green (G) colored pattern having a size of 1.6×1.6 µm was formed using the green (G) coating liquid G-1, and a blue (B) colored pattern having a size of 1.6×1.6 µm was formed using the blue (B) coating liquid B-1, sequentially, whereby a color filter for a solid-state image pick-up element was manufactured.

Evaluation

The full-color color filter was mounted to a solid-state image pick-up element, and it was found that the solid-state image pick-up element had high light-shielding property, high resolution and high color separation property.

Example 34

Production of Liquid Crystal Display Device

Production of Chromatic Color Colored Polymerizable Composition

Coating liquid R-2 was prepared by stirring and mixing the dispersion-processed pigment dispersion (P1) with the following materials so as to form the following composition ratio.

Composition

| | |
|---|---|
| Colorant (pigment dispersion (P1)): | 200 parts |
| Propylene glycol monomethyl ether acetate (PGMEA: solvent): | 19.20 parts |
| Ethyl lactate: | 36.67 parts |
| Resin (40% PGMEA solution of benzyl methacrylate/ methacrylic acid/2-hydroxyethyl methacrylate copolymer (molar ratio = 60/22/18)): | 33.51 parts |
| Ethylenic unsaturated double bond-containing compound (dipentaerythritol hexaacrylate): | 12.20 parts |
| Polymerization inhibitor (p-methoxy phenol): | 0.0061 parts |
| Fluorine-containing surfactant (F-475; manufactured by DIC Corporation): | 0.83 parts |
| Photopolymerization initiator (trihalomethyl triazine photopolymerization initiator): | 0.586 parts |

Coating liquids for green (G) color and blue (B) color were prepared in the same manner as in the production of the coating liquid R-2, by using the chromatic color pigments used for producing the color filters for the solid-state image pick-up element.

Production of Color Filter for Liquid Crystal Display Device

By using the light-shielding filter manufactured in Example 1 as a black matrix, a red (R) colored pattern having a size of 80×80 µm was formed on the black matrix using the coating liquid R-2 for red (R) in a manner similar to the method as recited in Example 1. Similarly, a green (G) chromatic color colored pattern using the green (G) coating liquid G-2, and a blue (B) chromatic color colored pattern using the blue (B) coating liquid B-2 were sequentially formed, whereby a color filter having a black matrix for liquid crystal display device was manufactured.

Evaluation

The full-color color filter was subjected to processes such as formation of an ITO transparent electrode, the formation of an oriented film or the like, whereby a liquid crystal display device was formed. The coated surface of the polymerizable composition of the invention had good evenness, and the liquid crystal display device had no display unevenness, and good image quality.

Example 35

Production of Wafer Level Lens

The polymerizable composition manufactured in Example 1 was coated on a silicon wafer having lenses thereon, thereby producing a wafer level lens having a light-shielding layer.

The produced wafer level lens was cut, and after forming a lens module, the image pick-up element and the sensor substrate were mounted to the cut wafer level lens, whereby an image pick-up unit was manufactured.

The wafer level lens of the invention had high evenness of the coated surface in the region of the light-shielding layer, the light-shielding property was high, and the image quality of an image pick-up unit using the wafer level was good.

The invention claimed is:

1. A dispersion composition comprising: (A) titanium black; (B) a graft copolymer; and (C) a solvent,
wherein the graft copolymer comprises at least a structural unit represented by any one of the following Formula (1) to Formula (5):

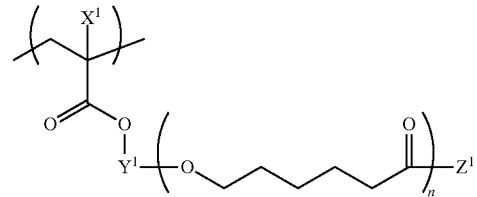
(1)

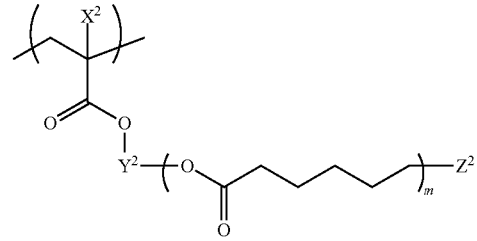
(2)

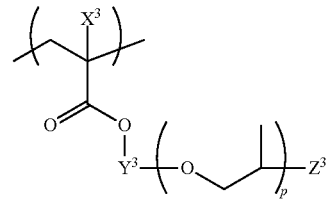
(3)

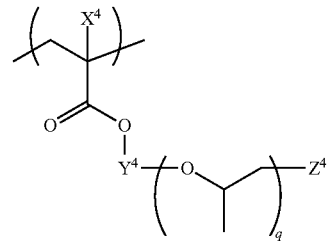
(4)

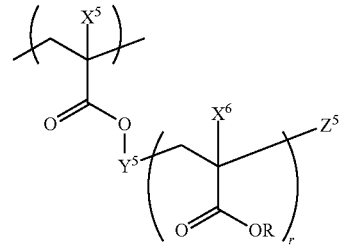
(5)

wherein, in Formula (1) to Formula (5), $X^1$, $X^2$, $X^3$, $X^4$, $X^5$, and $X^6$ each independently represents a hydrogen atom or a monovalent organic group; $Y^1$, $Y^2$, $Y^3$, $Y^4$, and $Y^5$ each independently represents a divalent linking group; $Z^1$, $Z^2$, $Z^3$, $Z^4$, and $Z^5$ each independently represents a hydrogen atom or a monovalent organic group; R represents a hydrogen atom or a monovalent organic group; R's having different structures from one another may be present in the copolymer; and n, m, p, q, and r each independently represents an integer of from 1 to 500; and the divalent linking group represented by $Y^1$, $Y^2$, $Y^3$, $Y^4$ or $Y^5$ is any one selected from the following linking groups (Y-1) to (Y-20):

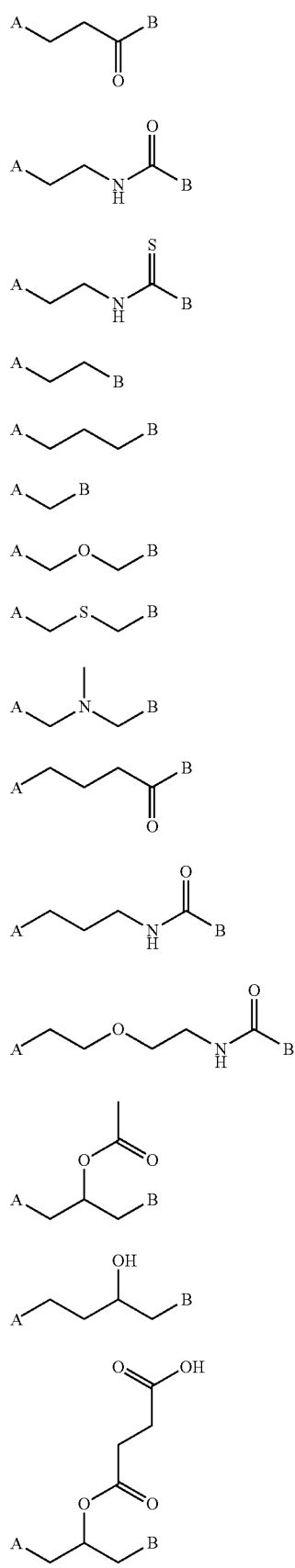
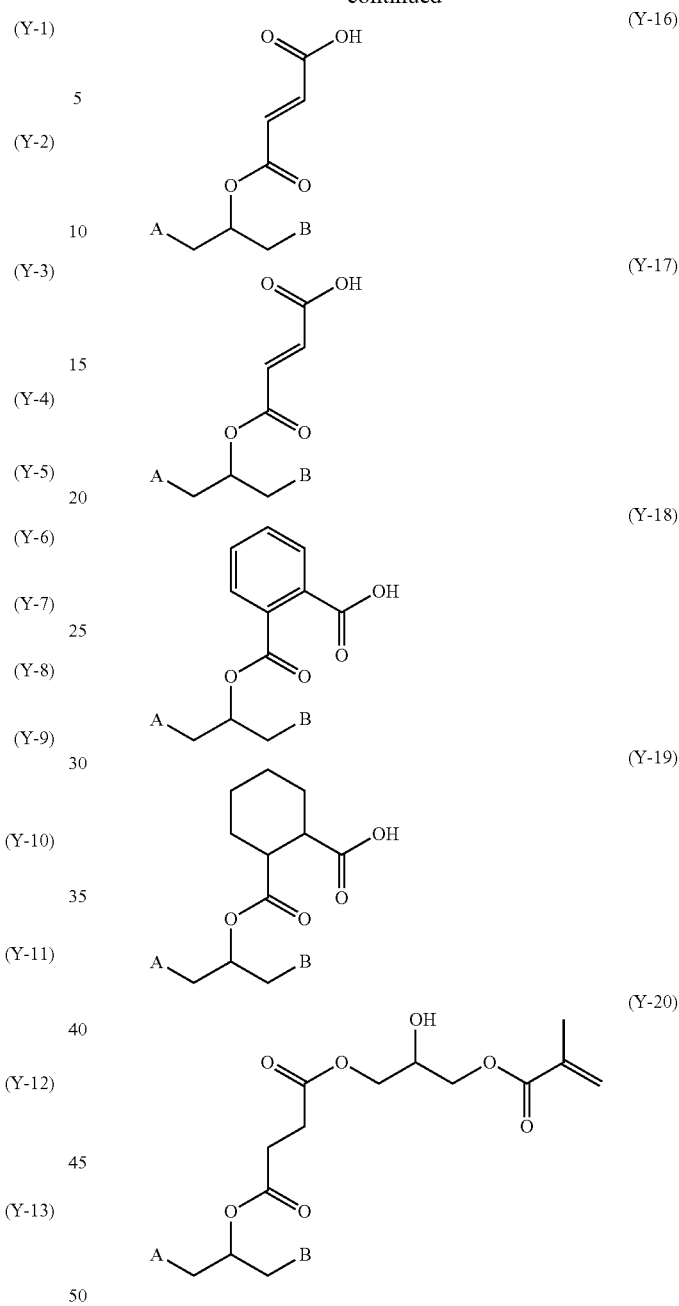

wherein, in (Y-1) to (Y-20), A represents a bond to a left terminal end group in any of Formula (1) to Formula (5), and B represents a bond to a right terminal end group in any of Formula (1) to Formula (5).

2. The dispersion composition according to claim 1, wherein the graft copolymer comprises a graft chain having a number of atoms other than hydrogen atoms in a range of from 40 to 10,000.

3. The dispersion composition according to claim 1, wherein the graft copolymer comprises a graft chain having at least one structure selected from the group consisting of a polyester structure, a polyether structure, and a polyacrylate structure.

4. The dispersion composition according to claim 1, wherein the monovalent organic group represented by $X^1$, $X^2$, $X^3$, $X^4$, $X^5$, or $X^6$ is an alkyl group having from 1 to 12 carbon atoms.

5. The dispersion composition according to claim 1, wherein the monovalent organic group represented by $Z^1$, $Z^2$, $Z^3$, $Z^4$, or $Z^5$ is an alkyl group, a hydroxyl group, an alkoxy group, an aryloxy group, a heteroaryloxy group, an alkyl thioether group, an aryl thioether group, a heteroaryl thioether group, or an amino group.

6. The dispersion composition according to claim 1, wherein the monovalent organic group represented by R in Formula (5) is an alkyl group, an aryl group, or a heteroaryl group.

7. The dispersion composition according to claim 1, wherein the graft copolymer comprises the structural unit represented by any of Formula (1) to Formula (5) in a range of from 10% to 90% in terms of mass, relative to the total mass of the graft copolymer.

8. The dispersion composition according to claim 1, wherein the graft copolymer further comprises a structural unit having a functional group capable of interacting with titanium black.

9. The dispersion composition according to claim 1, wherein the graft copolymer further comprises at least one of a carboxylic acid group, a sulfonic acid group, or a phosphoric acid group.

10. A polymerizable composition comprising: the dispersion composition according to claim 1; (D) a polymerizable compound; and (E) a polymerization initiator.

11. The polymerizable composition according to claim 10, wherein the polymerization initiator is an oxime polymerization initiator.

12. A light-shielding color filter, comprising, on a substrate, a color pattern formed using the polymerizable composition according to claim 10.

13. A solid-state image pick-up element, comprising the light-shielding color filter according to claim 12.

14. A liquid crystal display device, comprising the light-shielding color filter according to claim 12.

15. A wafer level lens, comprising: a substrate on which plural lenses are integrally formed; and the light-shielding color filter according to claim 12 arranged in regions other than lens surfaces of the lenses on the substrate.

16. An image pick-up unit, comprising the wafer level lens according to claim 15.

17. The polymerizable composition according to claim 11, wherein the oxime polymerization initiator is represented by the following Formula (a):

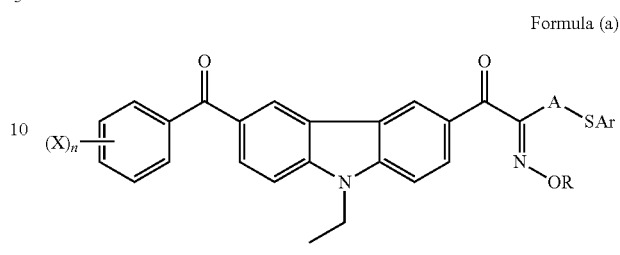

Formula (a)

wherein in Formula (a), R and X each independently represents a monovalent substituent; A represents a divalent organic group; Ar represents an aryl group; n is an integer of 0 to 5; and when plural X's are present, the plural X's may be the same as or different from one another.

18. The dispersion composition according to claim 1, wherein the content of the titanium black in the dispersion composition is in a range of from 40% by mass to 80% by mass.

19. The polymerizable composition according to claim 10, wherein the polymerizable compound comprises a combination of polymerizable compounds having trifunctionality or higher functionality and one of which is dipentaerythritol hexaacrylate.

20. A polymerizable composition comprising:
a dispersion composition comprising (A) titanium black, (B) a graft copolymer, and (C) a solvent; and
(D) a polymerizable compound, and
(E) a polymerization initiator,
and wherein the polymerizable compound comprises a combination of polymerizable compounds having trifunctionality or higher functionality and one of which is dipentaerythritol hexaacrylate.

* * * * *